United States Patent [19]

Guttag et al.

[11] 4,402,043
[45] Aug. 30, 1983

[54] MICROPROCESSOR WITH COMPRESSED CONTROL ROM

[75] Inventors: Karl M. Guttag; Kevin C. McDonough, both of Houston; Gerald E. Laws, Austin, all of Tex.

[73] Assignee: Texas Instruments Incorporated, Dallas, Tex.

[21] Appl. No.: 209,915

[22] Filed: Nov. 24, 1980

[51] Int. Cl.³ .............................................. G11C 7/00
[52] U.S. Cl. ...................... 364/200; 365/94; 365/200
[58] Field of Search ... 364/200 MS File, 900 MS File; 365/200

[56] References Cited

U.S. PATENT DOCUMENTS

| | | | |
|---|---|---|---|
| 3,654,610 | 4/1972 | Sander et al. | 365/200 |
| 4,106,090 | 8/1978 | Erickson et al. | 364/200 |
| 4,139,907 | 2/1979 | Blahut et al. | 365/96 |

Primary Examiner—Raulfe B. Zache
Attorney, Agent, or Firm—John G. Graham

[57] ABSTRACT

A single-chip microprocessor device of the MOS/LSI type contains an ALU, several interal busses, a number of address/data registers, and an instruction register with associated control decode or microcontrol generator circuitry. The device communicates with external memory and peripherals by a bidirectional multiplexed address/data bus and a number of control lines. The control ROM is an array of rows and columns of potential MOS transistors. This ROM is compressed by eliminating column lines which contain no transistors, and eliminating column decode circuitry associated with such column lines. The number of lines which can be eliminated is increased by reducing the number of row lines (thereby lengthening the row lines) and selecting default conditions of controls (by inverting some outputs) to increase the number of vacant positions in the ROM.

20 Claims, 28 Drawing Figures

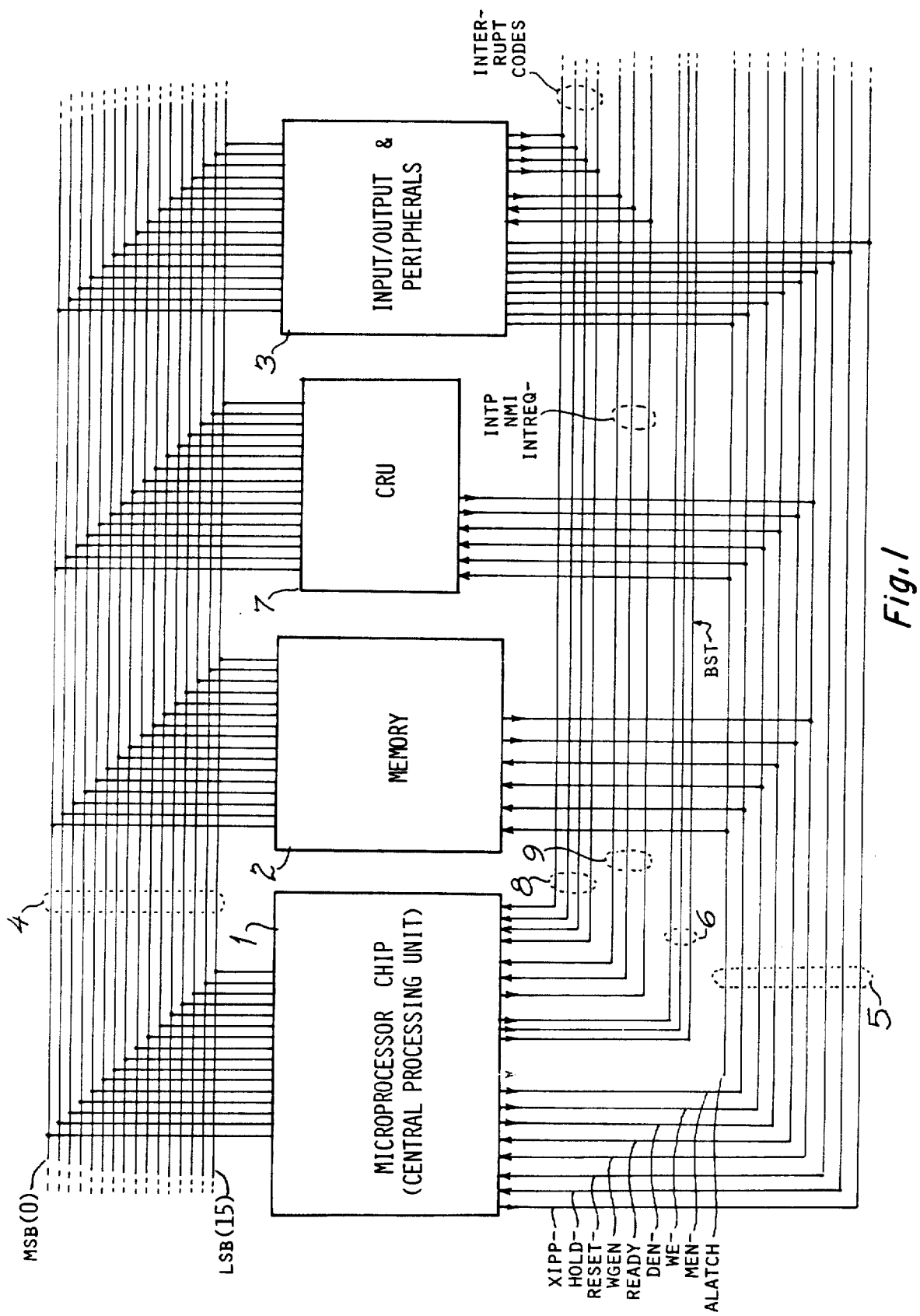

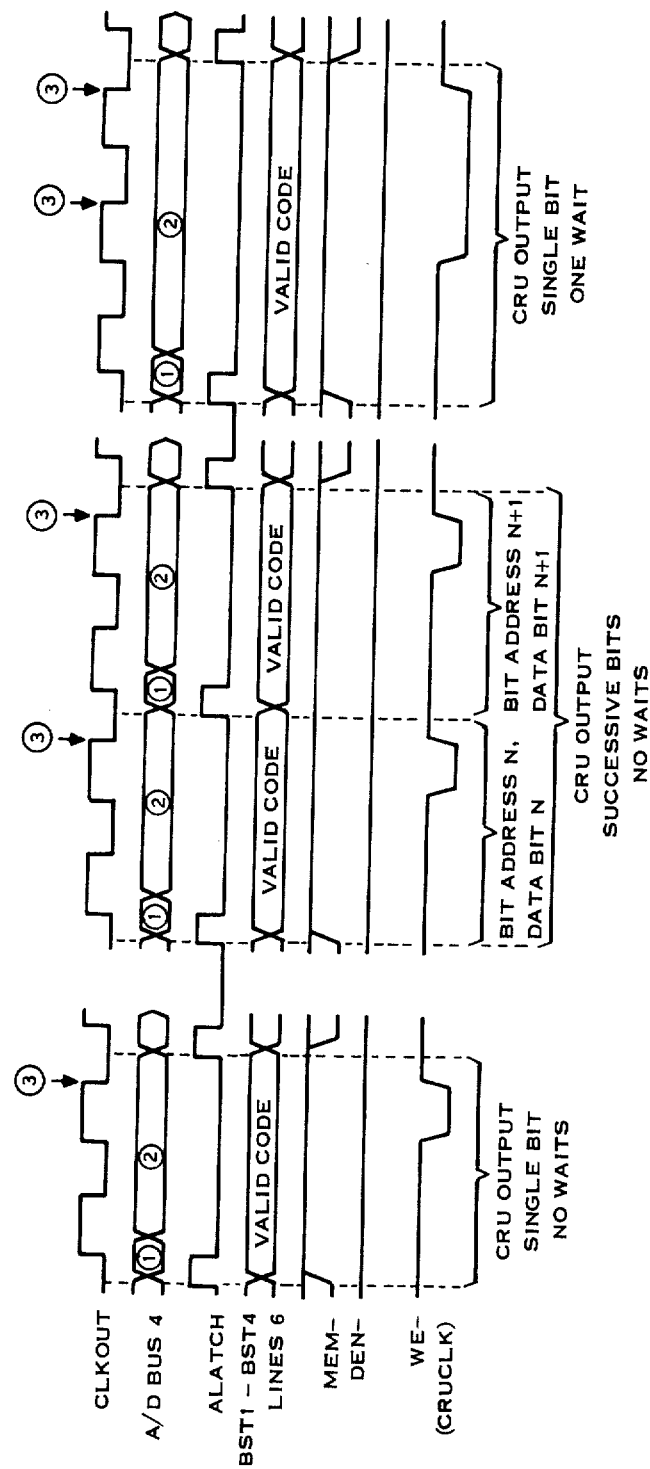
Fig. 2g  CRU TIMING – OUTPUT OPERATION

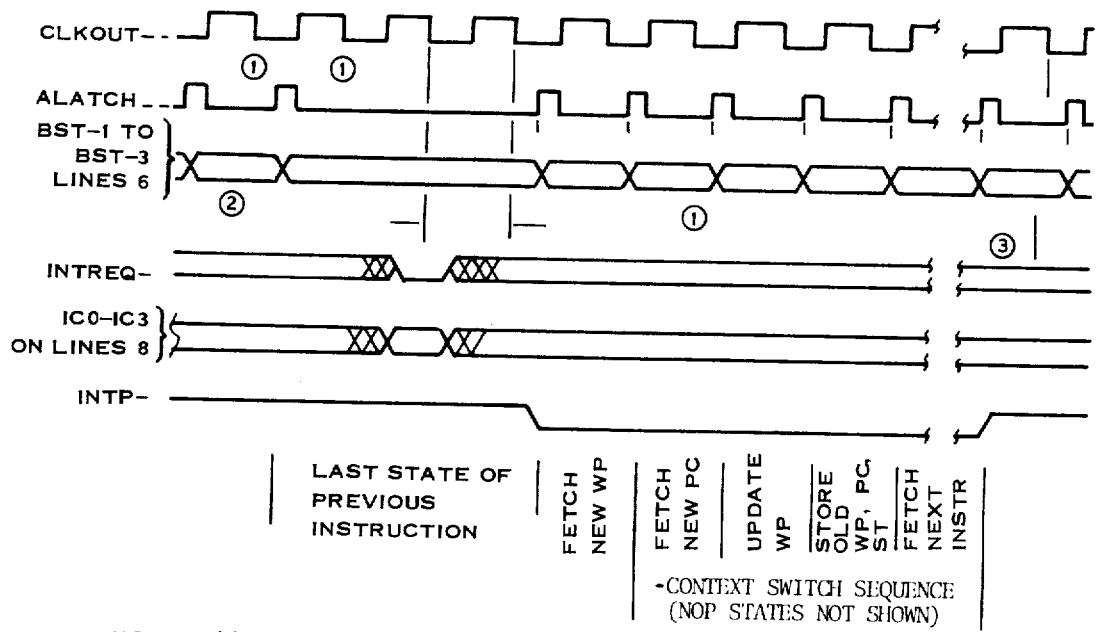

NOTES (1) INTREQ- AND IC (0–3) ARE FIRST SAMPLED IN THE IAQ STATE. IF THE WAIT STATES OCCUR IN THE FOLLOWING STATE, SAMPLES WILL CONTINUE TO BE TAKEN UNTIL ONE CLOCK BEFORE THE END OF THAT STATE.
(2) THE PREFETCHED INSTRUCTION WILL BE DISCARDED.
(3) INTREQ- WILL NOT BE SAMPLED DURING THE FIRST INSTRUCTION FETCH AFTER THE CONTEXT SWITCH SEQUENCE.

INTERRUPT SEQUENCE
FOR NMI, SEQUENCE IS SAME AS ABOVE EXCEPT NMI- IS SAMPLED AT SAME TIMING AS INTREQ-, AND IC-0 TO IC-3 LINES 8 STAY AS "DON'T CARE".

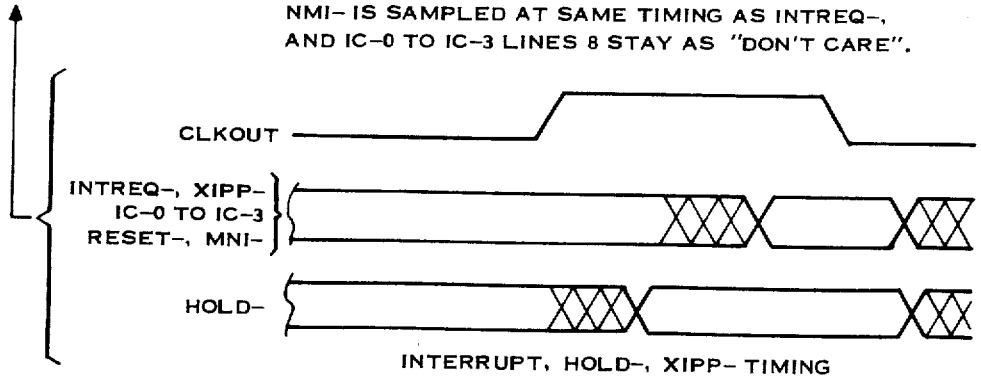

INTERRUPT, HOLD-, XIPP- TIMING

Fig. 2j

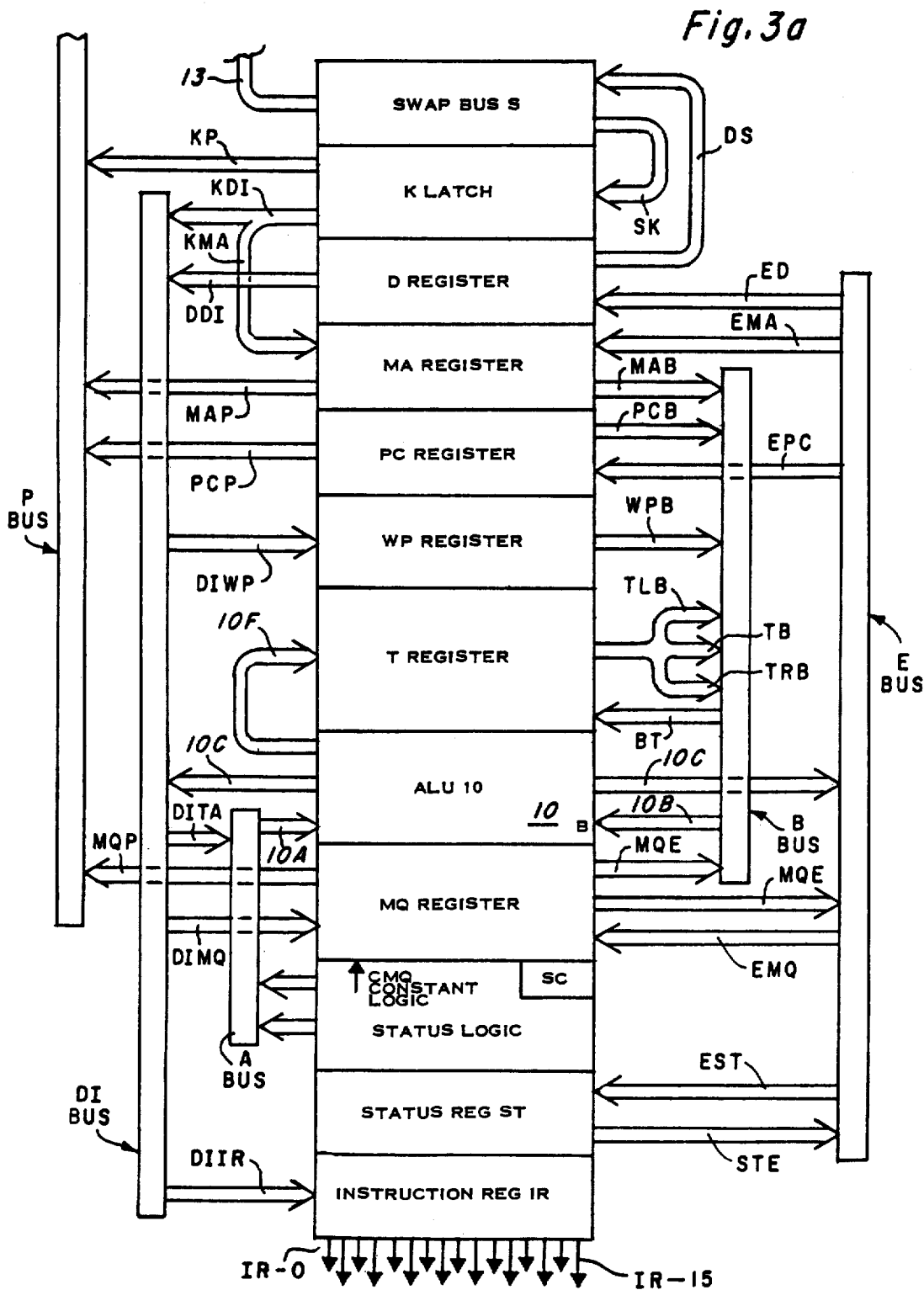

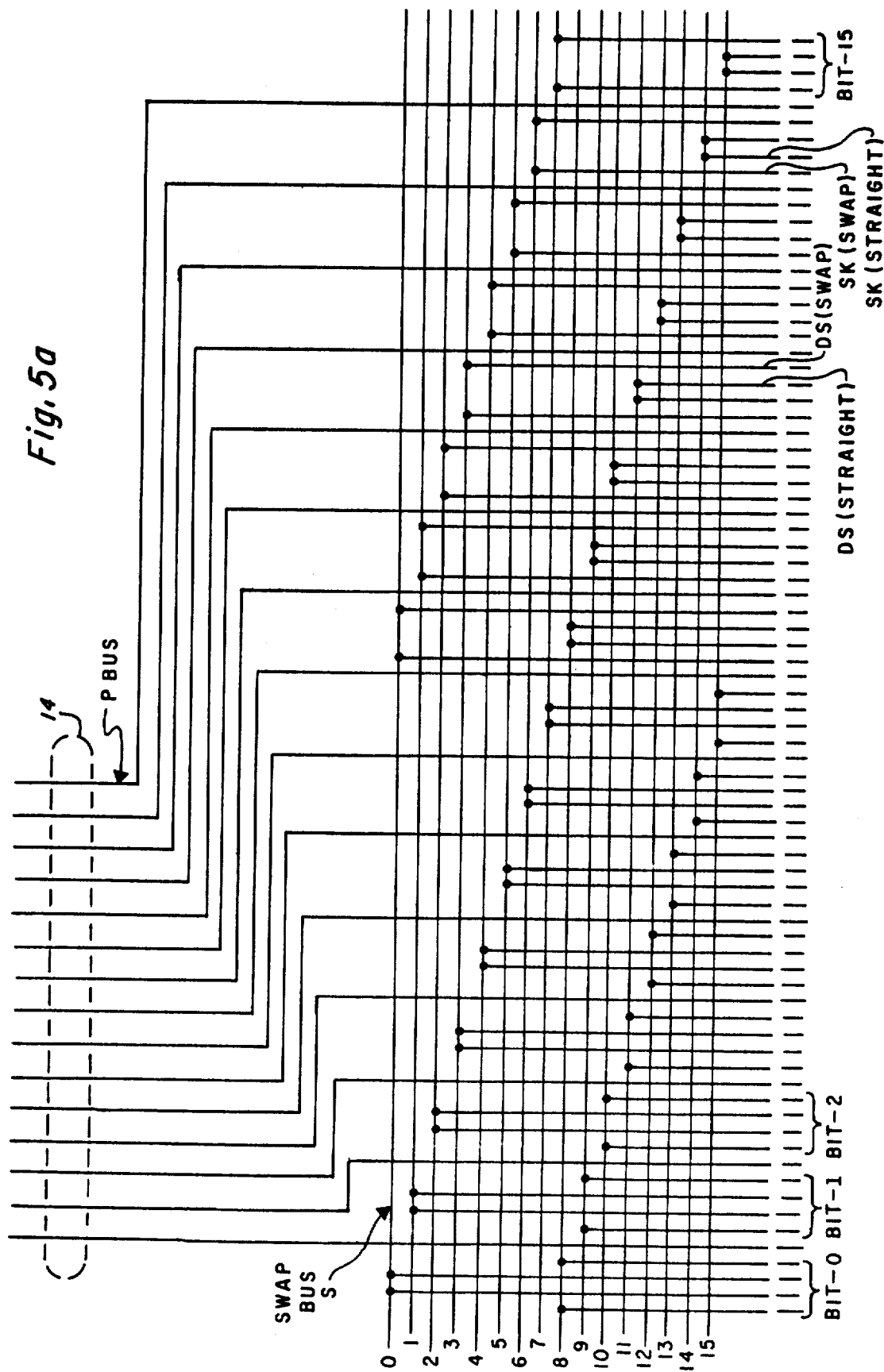

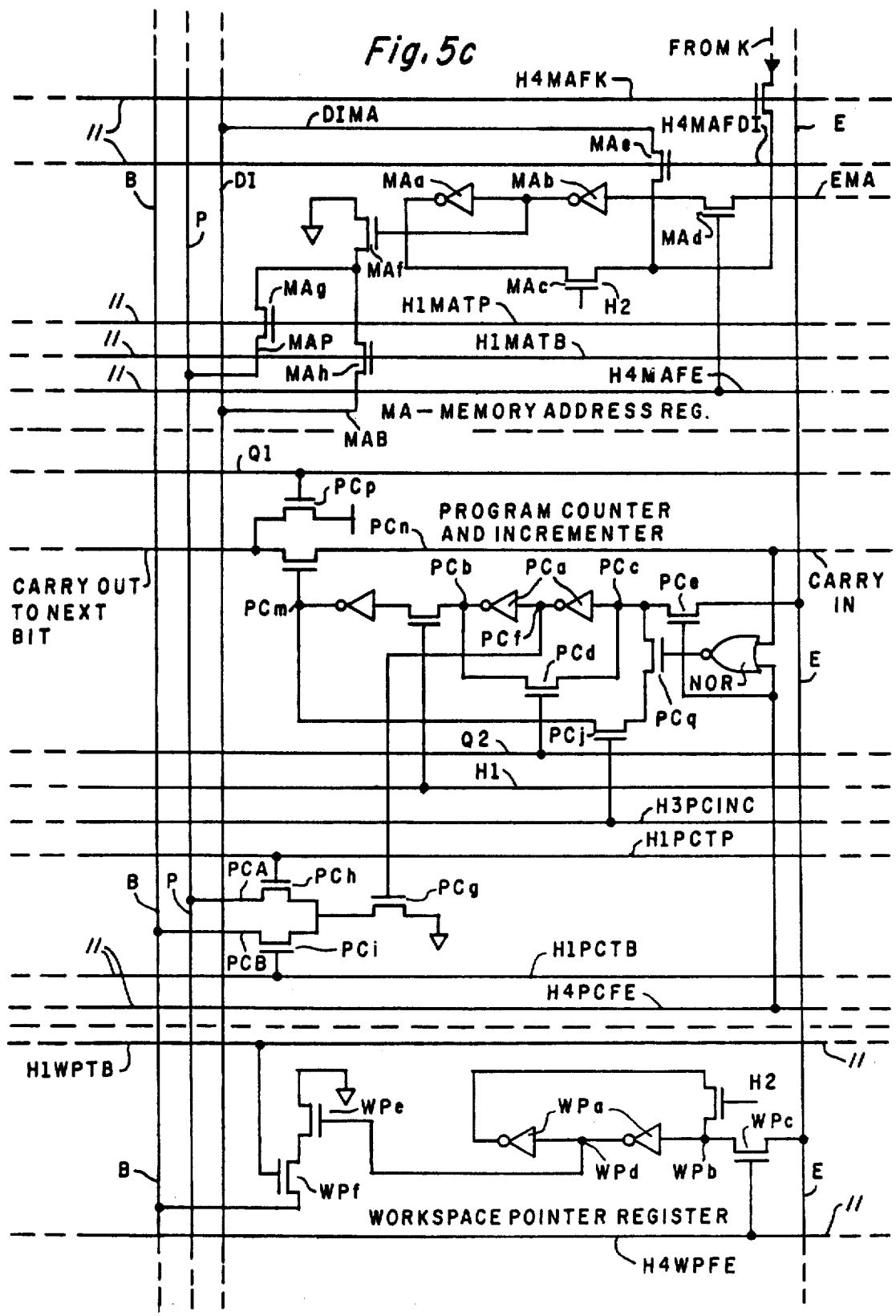

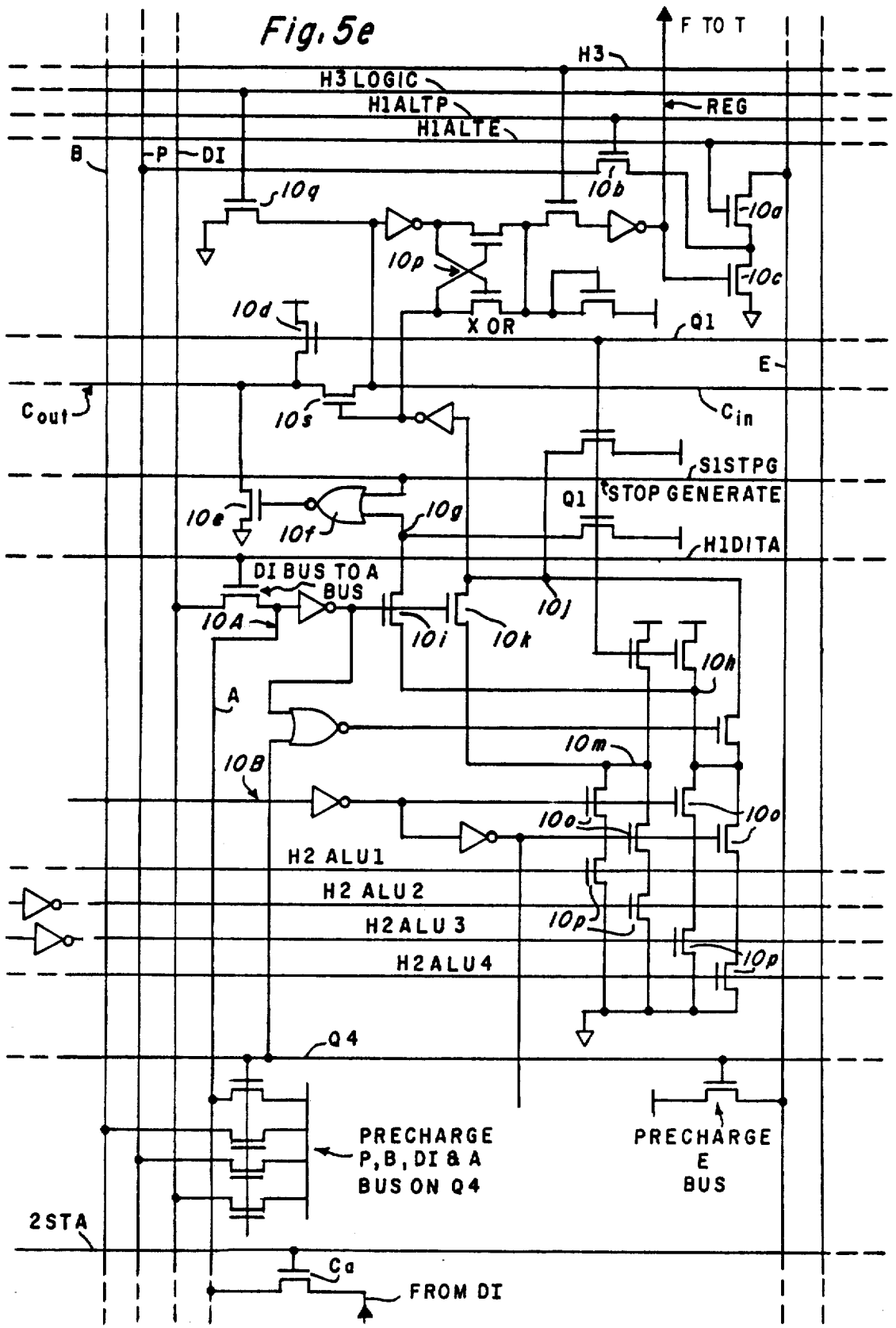

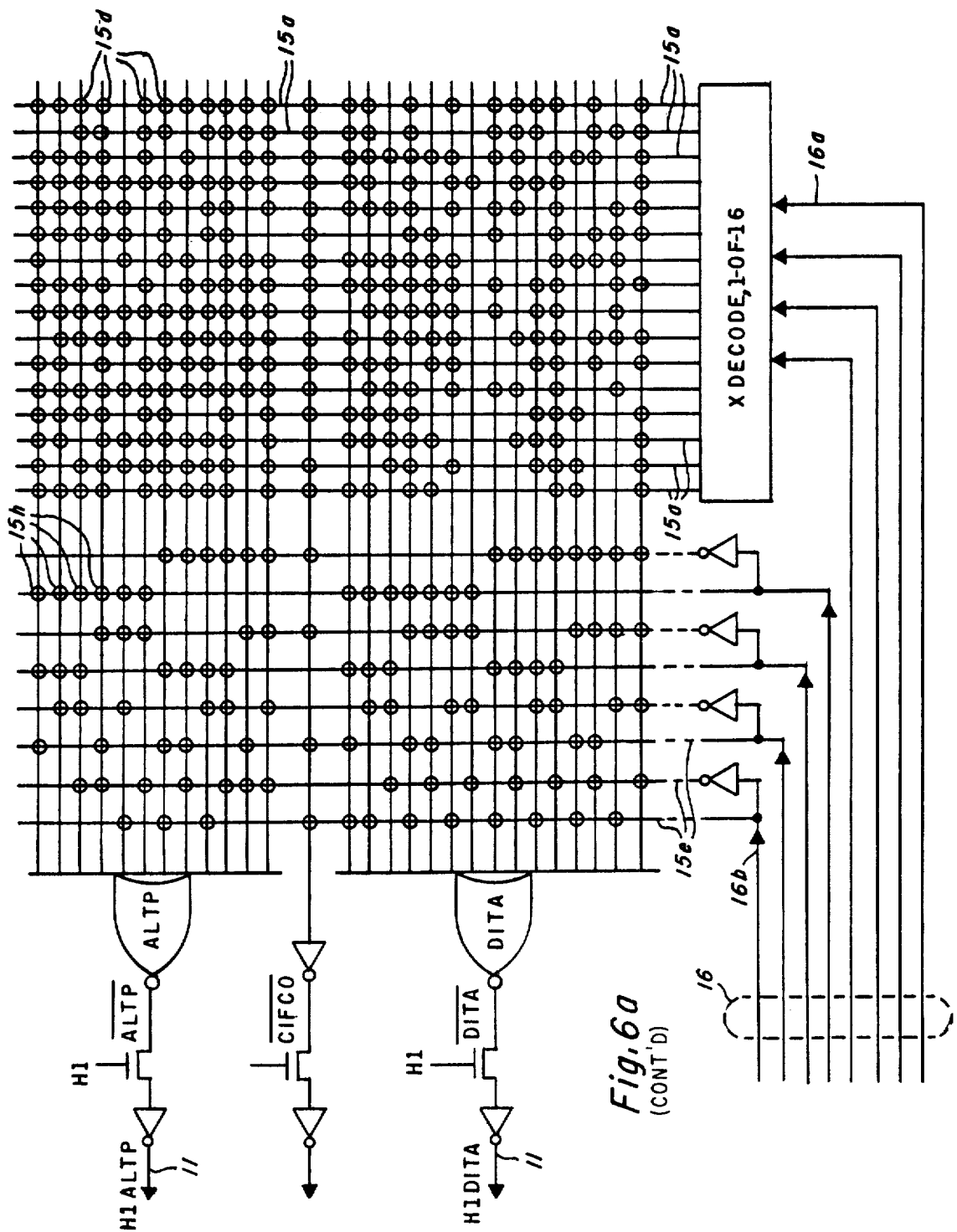

| STATE TIME | OPERATION | ALU INPUTS/OUTPUT | ADDRESS/DATA BUS 4 | OTHER |
|---|---|---|---|---|
| S1 | PRE-FETCH INSTRUCTION AT ADDRESS IN PC FOR THE ADD OPERATION; PERFORM ALU OPERATION FOR OLD INSTRUCTION | PERFORMS ALU OPERATION FOR OLD INSTRUCTION, RESULT TO E BUS DELAYED | READ CYCLE; ADDRESS FROM PC OUT VIA P BUS AND BUS 4; DATA BACK IN ON BUS 4 TO K REG VIA BUS S | INCREMENT PC DEN-ACTIVE |
| S2 | WRITE RESULT OF OLD INSTRUCTION AT OLD DESTINATION ADDRESS; CALCULATE SOURCE ADDRESS FOR NEW INSTRUCTION | ADDS 2s + WP; A INPUT IS S FIELD FOR INCOMING INSTRUCTION WORD OFF DI BUS; B INPUT IS WP VIA B BUS OUTPUT TO E, DELAYED | WRITE CYCLE; DEST. ADDRESS FOR OLD INSTRUCTION ON BUS 4 FROM MA, THEN DATA OUT ON BUS 4 FROM D REG. | LOAD IR VIA DI BUS AND DETERMINE ENTRY POINT FOR ADD INSTRUCTION |
| S3 | FETCH SOURCE OPERAND AT ADDRESS IN MA; CALCULATE ADDRESS OF DESTINATION REGISTER | ADDS 2D + WP; A INPUT IS D FIELD FROM INSTRUCTION; B INPUT IS WP RESULT TO MA VIA E DELAYED | READ CYCLE; SOURCE ADDRESS OUT FROM MA TO BUS 4; DATA BACK IN ON BUS 4 TO K REG. | DEN-ACTIVE |
| S4 | FETCH CONTENTS OF DESTINATION REGISTER | ADDS 2D + WP AGAIN; RESULT TO MA TO BE USED AS THE DESTINATION WRITE | READ CYCLE; ADDRESS (2D = WP) GOES OUT, CONTENTS OF THAT ADDRESS BACK IN TO BE USED FOR NEXT FETCH | DEN-ACTIVE |
| S5 | FETCH DESTINATION OPERAND | ADDS K PLUS ZERO AND STORES RESULT IN T REG. | READ CYCLE; DESTINATION ADDRESS FROM MA GOES OUT ON BUS 4; DEST. OPERAND COMES BACK ON BUS 4 INTO K REG. | DEN-ACTIVE |
| S6 | PERFORM THE ADD OPERATION FOR THIS INSTRUCTION, AND PRE-FETCH THE CONTENTS OF ADDRESS IN PC FOR THE NEXT INSTRUCTION | PERFORMS ADD OPERATION FOR CURRENT ADD INSTRUCTION; A INPUT IS FROM K, B INPUT FROM T VIA F, OUTPUT TO E DELAYED | READ CYCLE; ADDRESS FOR NEXT INSTRUCTION OUT VIA P BUS AND BUS 4; DATA BACK IN ON BUS 4 TO K REG. VIA BUS S | INCREMENT PC DEN-ACTIVE |
| S7 | WRITE RESULT OF THIS ADD OPERATION AT DESTINATION ADDRESS; CALCULATE SOURCE ADDRESS FOR NEXT INSTRUCTION | ADDS 2s + WP FOR NEXT INSTRUCTION | WRITE CYCLE; DESTINATION ADDRESS FOR ADD INSTRUCTION GOES OUT ON BUS 4 FROM MA, THEN DATA ONTO BUS 4 FROM D REG. | LOAD IR VIA DI BUS AND DETERMINE ENTRY POINT FOR NEXT INSTRUCTION |

Fig. 7

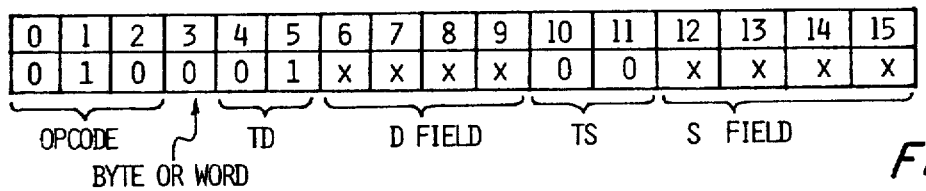

Fig. 7a

MICROPROCESSOR WITH COMPRESSED CONTROL ROM

RELATED CASES

This application discloses subject matter also disclosed and claimed in copending application Ser. Nos. 209,914; 210,105; 210,106; 210,108; 210,109; and 210,917, all filed herewith and assigned to Texas Instruments.

BACKGROUND OF THE INVENTION

This invention relates to integrated semiconductor devices and systems, and more particularly to features used in an electronic digital processing system which may employ a single-chip microprocessor or microcomputer device.

A microprocessor device is a central processing unit or CPU for a digital processor which is contained in a single semiconductor integrated circuit, usually fabricated by "MOS/LSI" technology as shown in U.S. Pat. No. 3,757,306 issued to Gary W. Boone and assigned to Texas Instruments. The Boone patent shows an 8-bit CPU on a chip including a parallel ALU, a register stack, an instruction register and a control decoder, all interconnected using a bidirectional parallel bus. The term microprocessor usually refers to a device which employs external memory for program and data storage, while the term microcomputer refers to such a device which has on-chip ROM and RAM for program and data storage; the terms are also used interchangeably, however. U.S. Pat. No. 4,074,351, issued to Gary W. Boone and Michael J. Cochran, assigned to Texas Instruments, shows a single-chip "microcomputer" type device which contains a 4-bit parallel ALU and its control and circuitry with ROM and RAM for program and data storage.

Subsequent to the time U.S. Pat. Nos. 3,757,306 and 4,074,351 were originally filed many improvements have been made in microprocessors and microcomputers to multiply the speed and capabilities of these devices and reduce the cost of manufacture. Generally, the trend in the semiconductor industry is toward providing more circuitry in less space, i.e., smaller chip size. As photolithographic techniques are improved the line widths and resolutions are improved, providing added density, but circuit and system improvements also contribute to the goals of increased performance with smaller chip size. Some of these improvements in microprocessors are disclosed in the following U.S. Patents, all assigned to Texas Instruments: 3,991,305 issued to Edward R. Caudel and Joseph H. Raymond Jr.; 4,156,927 issued to David J. McElroy and Graham S. Tubbs; 3,934,233 issued to R. J. Fisher and G. D. Rogers; 3,921,142 issued to J. D. Bryant and G. A. Hartsell; 3,900,722 issued to M. J. Cochran and C. P. Grant; 3,932,846 issued to C. W. Brixey et. al.; 3,939,335 issued to G. L. Brantingham, L. H. Phillips and L. T. Novak; 4,125,901 issued to S. P. Hamilton, L. L. Miles, et. al.; 4,158,432 issued to M. G. VanBavel; 3,757,308 and 3,984,816.

The demand for additional capabilities in microprocessor devices at lower cost continues, however, in spite of the advances which have been made in these technologies in recent years. Of course, not only the parts cost is of concern; the major concern is in lowering the cost of software and the amount of memory needed to store the programs, as well as the execution time for complex programs.

Examples of some of the various microprocessor and microcomputer devices in this evolution of the technology are described in publications as well as the above-mentioned patents. In Electronics, Sept. 25, 1972, p. 31-32, a 4-bit P-channel MOS microcomputer with on-chip ROM and RAM is shown which is similar to U.S. Pat. No. 3,991,305. Two of the most widely used 8-bit microprocessors like that of U.S. Pat. No. 3,757,306 are described in Electronics, Apr. 18, 1974 at pp. 88-95 (the Motorola 6800) and pp. 95-100 (the Intel 8080). A microcomputer version of the 6800 is described in Electronics, Feb. 2, 1978 at pp. 95-103. Likewise, a single-chip microcomputer version of the 8080 is shown in Electronics, Nov. 25, 1976 at pp. 99-105 and a 16-bit microprocessor evolving from the 8080 is described in Electronics, Feb. 16, 1978, pp. 99-104. Another single-chip microcomputer, the Mostek 3872, is shown in Electronics, May 11, 1978, at pp. 105-110. A microprocessor which is particularly adapted for digital processing of real-time analog signals, the Intel 2920, is shown at Electronics, Mar. 1, 1979, pp. 105-110. An improved version of the 6800 is disclosed in Electronics, Sept. 17, 1979 at pp. 122-125, while a 16-bit microprocessor identified as the 68000 which evolved from the 6800 is described in Electronic Design, Sept. 1, 1978 at pp. 100-107. Floating point arithmetic is performed in a 16-bit processor called the 8087, used as a co-processor with the 8086, as described in Electronics, May 8, 1980, pp. 114-121.

It is therefore the principal object of the invention to provide an improved microprocessor device and system, and an improved method of constructing and operating such apparatus. Another object is to provide improved performance or capabilities of a microprocessor or microcomputer while at the same time reducing the size (and thus cost) of the semiconductor device needed to implement the desired features. A further object is to reduce the area on the chip occupied by the control ROM as well as other instruction decode and microcode generator circuitry.

SUMMARY OF THE INVENTION

In accordance with one embodiment of the invention, an improved single-chip microprocessor device of the MOS/LSI type contains an ALU, several internal busses, a number of address/data registers, and an instruction register with associated control decode or microcontrol generator circuitry. The device communicates with external memory and peripherals by a bidirectional multiplexed address/data bus and a number of control lines. The control ROM is an array of rows and columns of potential MOS transistors. This ROM is compressed by eliminating column lines which contain no transistors, and eliminating column decode circuitry associated with such column lines. The number of lines which can be eliminated is increased by reducing the number of row lines (thereby lengthening the row lines) and selecting default conditions of controls (by inverting some outputs) to increase the number of vacant positions in the ROM.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is an electrical diagram in block form of a microprocessor system which may employ features of the invention;

FIG. 2a is a diagram of the word, byte and bit definitions of the 16-bit data word used in the system of FIG. 1;

FIG. 2b is a memory map for the main memory 2 of FIG. 1 and a diagram of a number of adjacent memory locations in the general memory area referred to as a "workspace";

FIG. 2c (three sheets) is a map of the opcodes for the instructions executed by the microprocessor in the system of FIG. 1;

FIG. 2d is a timing diagram showing voltage vs. time for the system of FIG. 1;

FIG. 2e (four sheets) is a logic flow chart of the execution of instructions and handling of interrupts of the microprocessor device of FIG. 1;

FIGS. 2f and 2g are timing diagrams for a CRU input and output operations in the system of FIG. 1;

FIG. 2j are timing diagrams for interrupts in the system of FIG. 1;

FIGS. 3 and 3a are an electrical diagram in block form of a MOS/LSI microprocessor chip including a CPU or central processor unit employed in the microprocessor system of FIG. 1 and utilizing features of the invention;

FIG. 4 is a greatly enlarged plan view of the semiconductor chip containing the microprocessor of FIG. 3 showing the physical layout of the various parts of the device;

FIG. 4a is an enlarged detail view of a part of the layout of FIG. 4 showing the register strip;

FIGS. 5a-5g are electrical schematic diagrams of various parts of the ALU and register strip within the microprocessor of FIGS. 3 and 4;

FIG. 6b is an expanded version of a part of the control ROM of FIG. 6 showing the compression feature;

FIG. 7 is a timing diagram showing conditions in the system of FIGS. 1 and 3 for an add operation;

FIG. 7a is a diagram of a sixteen bit instruction word for the add operation of FIG. 7; and FIG. 8 is a timing diagram showing conditions in the system of FIGS. 1 and 3 for a signed divide operation.

DETAILED DESCRIPTION OF SPECIFIC EMBODIMENT

MICROPROCESSOR SYSTEM

Figure 2H:
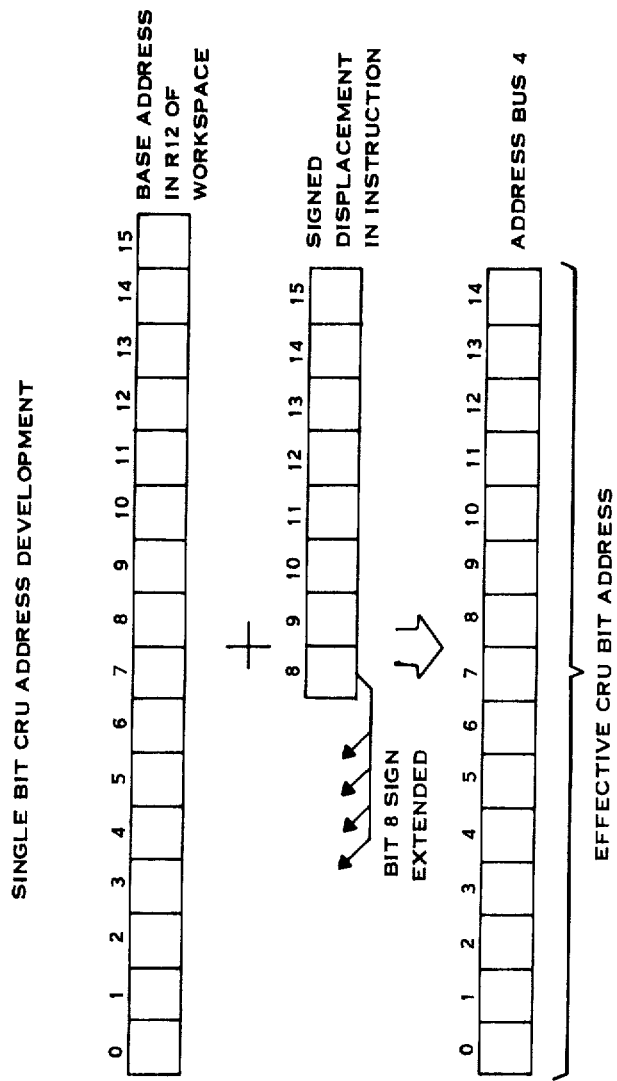
FIG. 2h is a diagram of single bit CRU address development for the system of FIG. 1.

The microprocessor device to be described herein may be of various configurations; in one embodiment the microprocessor device may be used in a system shown in generalllized form in FIG. 1. The system may be, for example, a single-board general purpose microcomputer, a word processing system, a computer terminal with display and typewriter keyboard, a communications switching or processing system, or any of many applications of this type. The system includes a single-chip MOS/LSI central processing unit or microprocessor 1 which will be described in detail, along with a memory 2 and input/output or I/O device 3. The microprocessor, memory and I/O communicate with one another by a 16-bit, parallel, bidirectional, multiplexed address/data bus 4, along with control lines 5. Suitable supply voltage and clock terminals are included; for example the device may employ a single +5 V Vcc supply and ground or Vss, and a crystal may be connected to terminals of the device 1 to control the frequency of an on-chip oscillator which will then define the system timing. It is understood that concepts of the invention may be used in a single-chip microcomputer with on-chip memory instead of the off-chip memory 2, as well as in a microprocessor having separate address and data busses instead of the bidirectional bus 4.

In general terms, of course, the system of FIG. 1 functions in traditional manner. The microprocessor 1 fetches an instruction by sending out an address on the bus 4 to the memory 2 then receiving the instruction via the bus 4 from the addressed location in the memory 2. The microprocessor then executes this instruction, which usually requires several machine cycles (as defined by a clock or crystal) including sending out via bus 4 addresses for the operands stored in the memory 2, and receiving this data back on bus 4, as well as writing a result into memory 2 by an address followed by data on the bus 4. The I/O devices 3 may be addressed like memory 2; this interface to external devices is accomplished using the address/data bus 4 and control lines 5 since the I/O devices 3 occupy locations in the memory address space. This is known as memory-mapped I/O.

In the example to be described in detail, a 15-bit address is applied to the bus 4 from the microprocessor 1 (the 16th bit is a hardwired 0 for addressing), which will directly address $2^{15}$ or 32K words of memory. Each 16-bit word in memory includes two 8-bit bytes, so the microprocessor can address 64K bytes. The instruction set of the microprocessor 1 allows either word or byte operations. FIG. 2a shows the data word and byte formats and bit definitions for the system of FIG. 1 as described herein. Words are assigned even numbered addresses in memory 2. A 16-bit byte address is explicitly manipulated by all addressing modes, internally, but only the 15-bit word address is provided to the memory system 2 via bus 4, providing direct addressing of a 32K word memory space. The CPU device 1 supports several methods of increasing the amount of physical memory space which it can address, including paging, functional separation and mapping. Paging is accomplished by using a status bit on one of the control lines 5 as a 16th address bit. Functional separation is accomplished using "bus status codes" on BST lines 6 to enable separate memory spaces for instructions or data. Mapping is accomplished by using external map logic devices which are managed by mapping instructions; this may extend the physical address range to 16M bytes or $2^{24}$, meaning the equivalent of a 24-bit address.

The system of FIG. 1 employs a memory-to-memory architecture in which the register files or working registers used by the CPU reside in the external memory 2 rather than in the microprocessor chip 1. This type of architecture allows faster response to interrupts and increased programming flexibility, compared to the traditional method of having most operands and return addresses stored in registers on the chip 1. The bulk of memory 2, particularly addresses 0080 to FFFA (all addresses are given in hexidecimal or base-16 in this description), is available for program storage or for "workspaces" as seen in FIG. 2b. The first word of a workspace is addressed by a workspace pointer (always an even address) and the remaining fifteen words are addressed by the workspace pointer plus 02 up to 1E (a 4-bit binary address). By maintaining the working registers in memory 2, a context switch or interrupt can be executed with a minimum of data transfer between microprocessor 1 and memory 2 because most of the data to be saved is already in the memory 2.

In addition to the parallel I/O 3, the system includes a bit-addressable input/output capability using a communications register unit or "CRU" 7 which employs one of the terminals (bit-0) of the address/data bus 4 as an input and another (bit-15) as an output, along with the lines 5 as control.

Interrupts are provided by four input lines 8 which define sixteen interrupt codes, sampled by the CPU 1 when an interrupt request line (one of three interrupt controls among the lines 9) is active and compared internally with an interrupt mask. If the code on the lines 8 is equal to or higher in priority than the mask, the interrupt sequence is initiated. If the comparison fails, the processor ignores the request. Another one of the control lines 9 produces a non-maskable interrupt, wherein priority codes on lines 8 are not material.

The system permits direct memory access (DMA) in which large blocks of memory words may be transferred via bus 4 between memory 2 and an I/O device 3 such as a disc memory. A "hold" command on one of the control lines 5 indicates to the processor 1 that an external controller desires to use the bus 4, so the processor enters a hold state with its terminals going to the bus 4 in a high impedence state.

A definition of the function of each of the control lines 5, bus status lines 6 and interrupt controls is given in Table A. The status bits for a sixteen bit status register ST are shown in Table B where the conditions for setting each bit for instructions in the instruction set are defined. A definition of the interrupt levels is given in Table C. Of course, this specific system is merely illustrative of contemporary microprocessor or microcomputer systems in which features of the invention may be used.

The CPU chip 1 of FIG. 1 executes the instruction set of Table D, although it is understood that other instructions could be defined for execution in addition to or in place of the particular ones described. Most of the instruction set of Table D is the same as that of a microprocessor sold by Texas Instruments under the part number TMS9900 and described in a book entitled "9900 Family Systems Design", published in 1978 by Texas Instruments Incorporated, P.O. Box 1443, M/S 6404, Houston, Tex. 77001, Library of Congress Catalog No. 78-058005; such book is incorporated herein by reference. The instructions of Table D which were not executed by the TMS9900 are: Signed Multiply and Division; long word add, substract, shift left and shift right; Branch Indirect; Branch & Push Link; long distance; Load Status and Load Workspace Pointer; Load Map File; and multiprocessor support instructions Test, Test & Clear, and Test & Set.

The source and destination addressing modes available in executing this instruction set are set forth below.

Generally, the two-bit T fields Td and Ts (bits 4-5 and 10-11) define the addressing modes in instructions such as Add, Subtract, Move, Compare and the like.

The 16-bit opcodes for the instructions of Table D are shown in FIG. 2c which occupies three sheets. FIG. 2c is arranged in descending order to show the groups (based on the left-most or most-significant "1") which are used in the entry point generator circuitry as will be explained.

THE CPU CHIP

Figure 3:
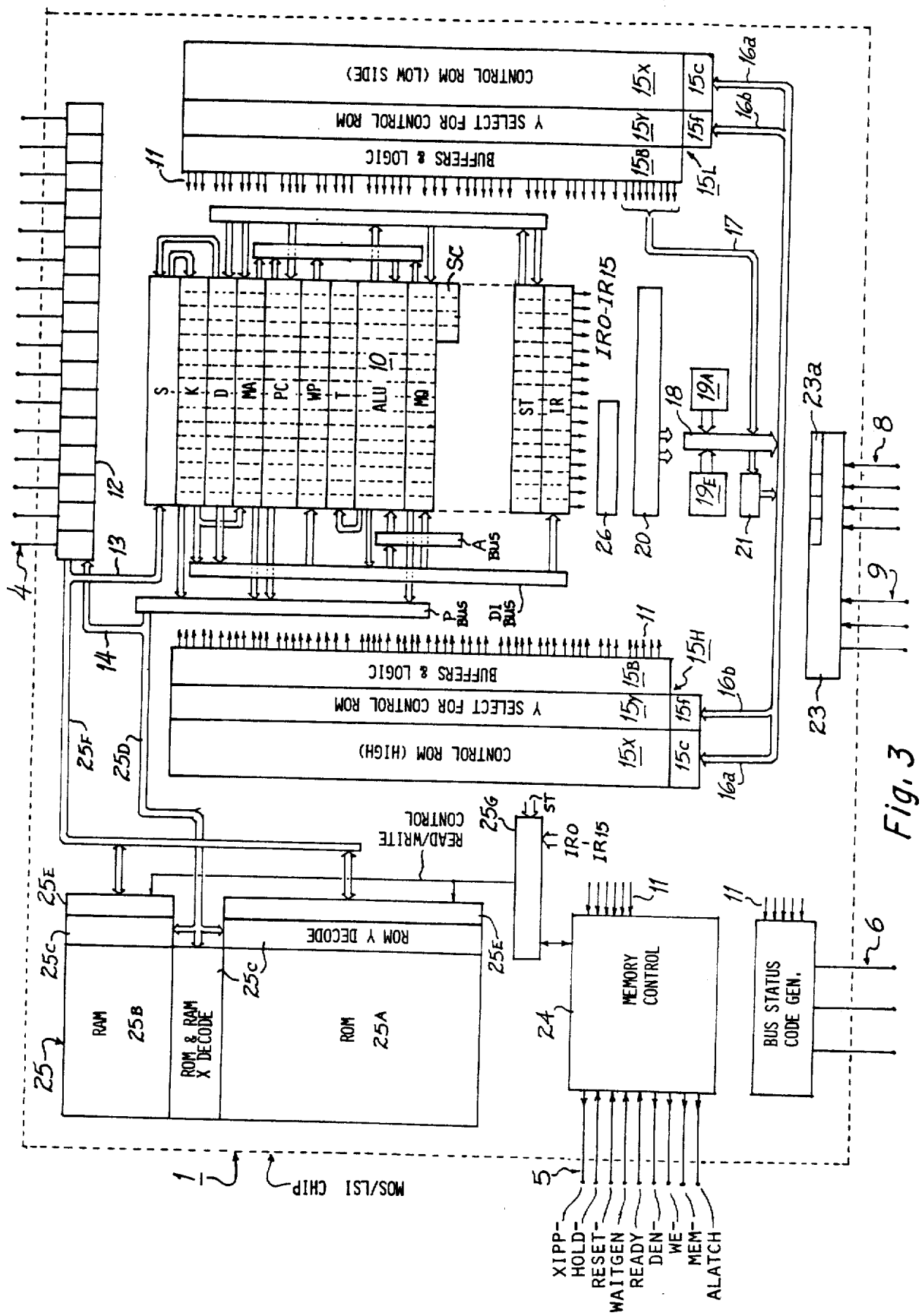
Figure 5B:
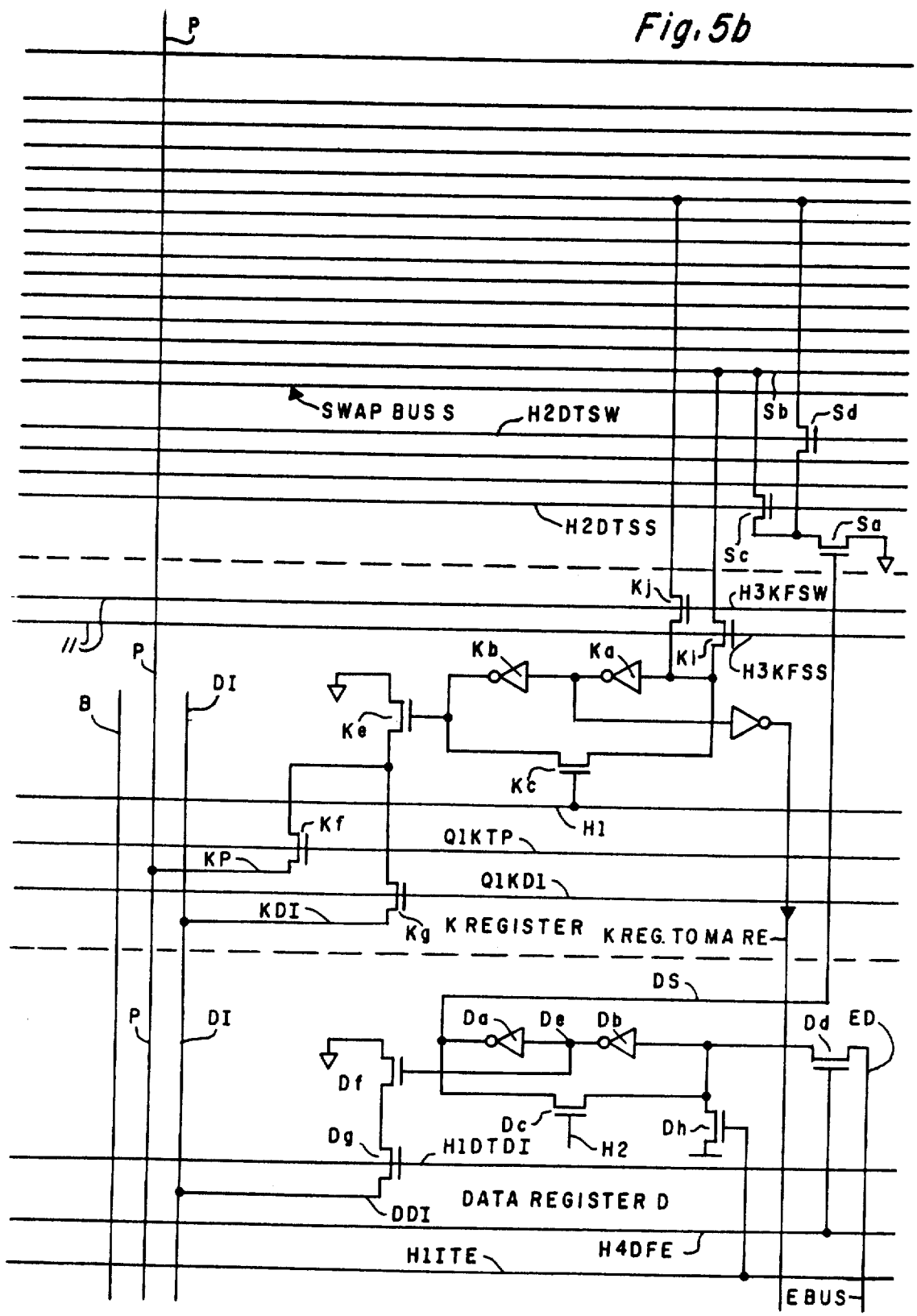
Figure 5F:
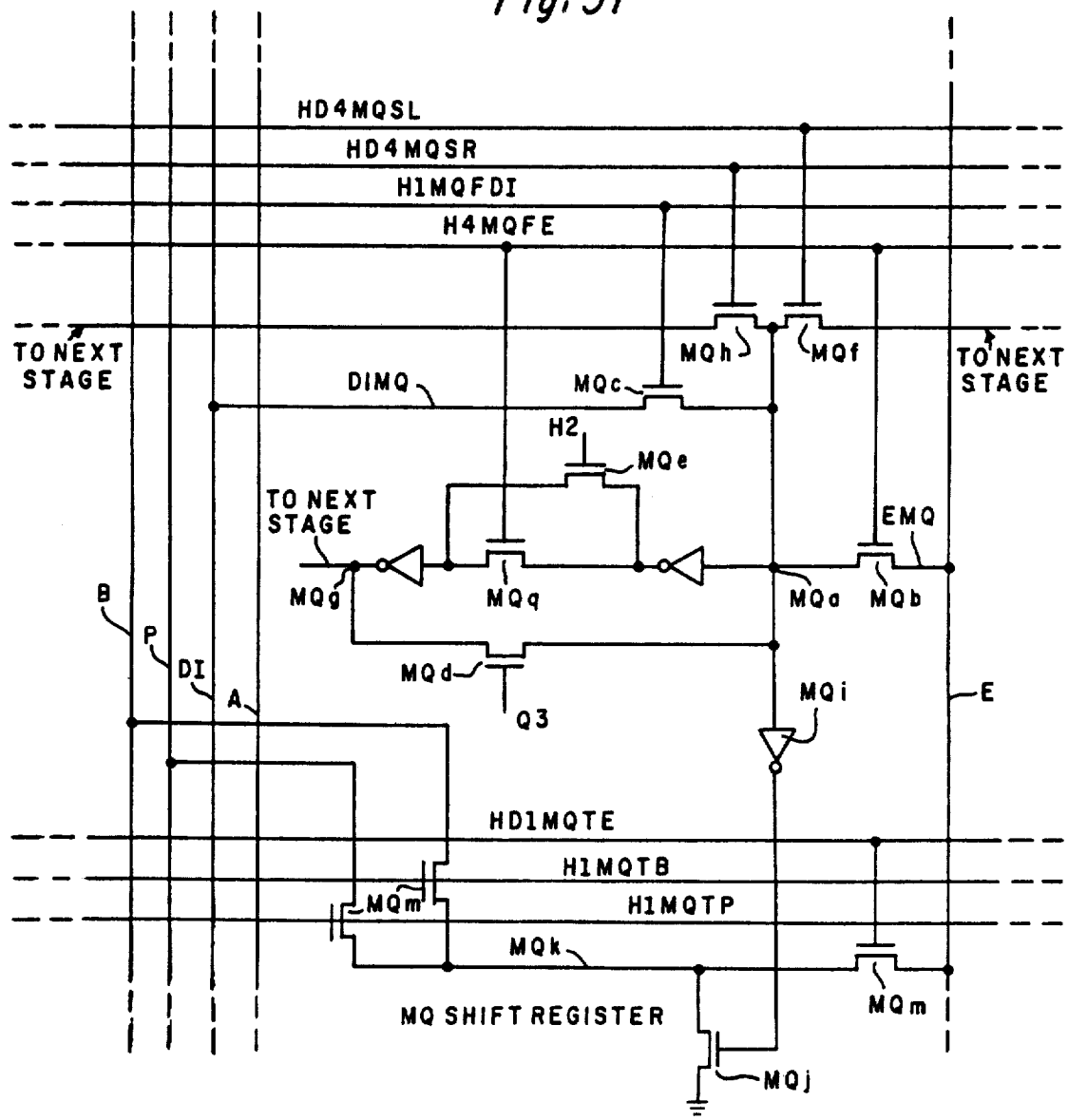
Figure 6:
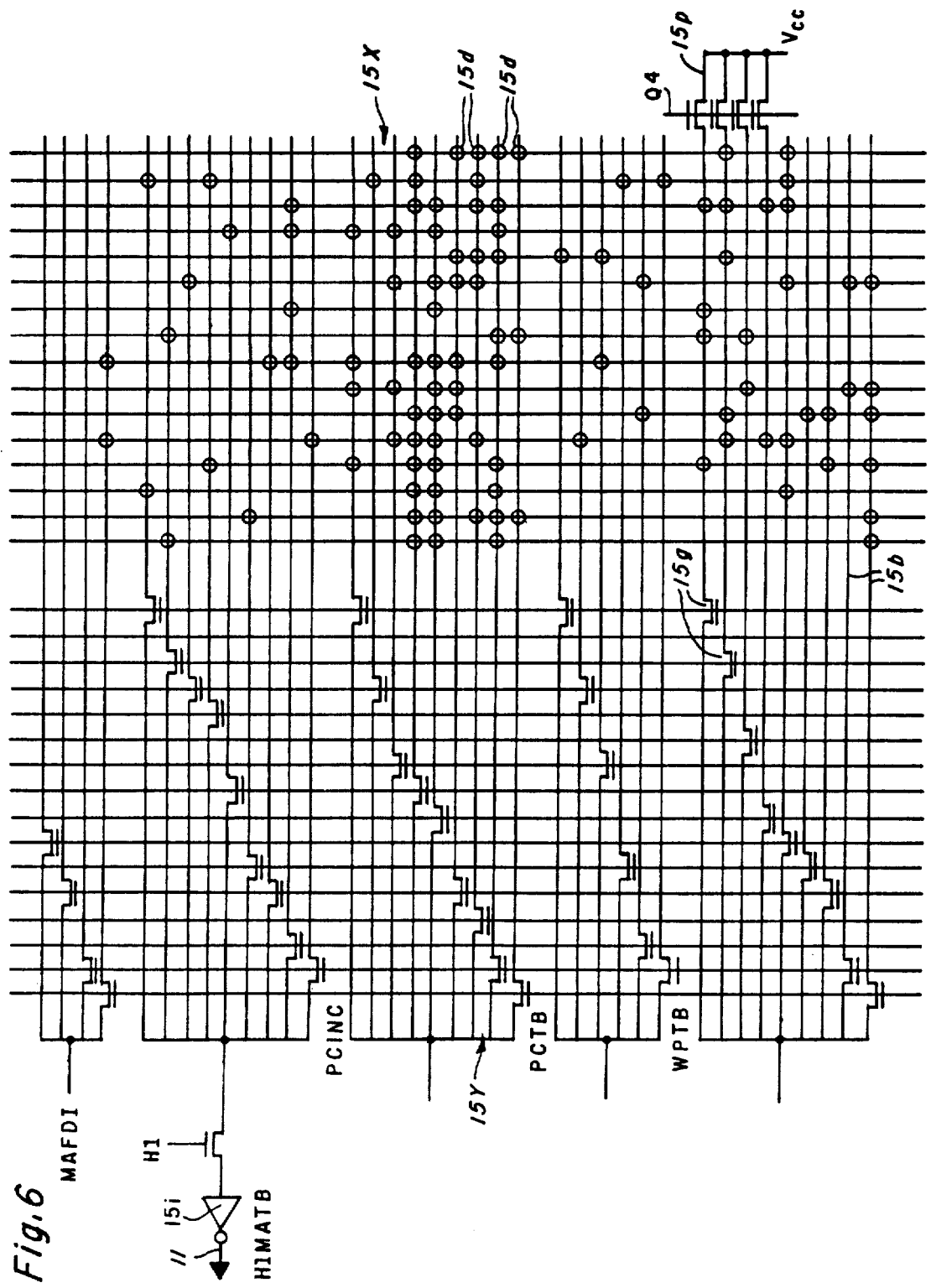
FIG. 6 is a detailed electrical schematic diagram of a compressed control ROM used in the microprocessor of FIGS. 3 and 4.
Figure 6:
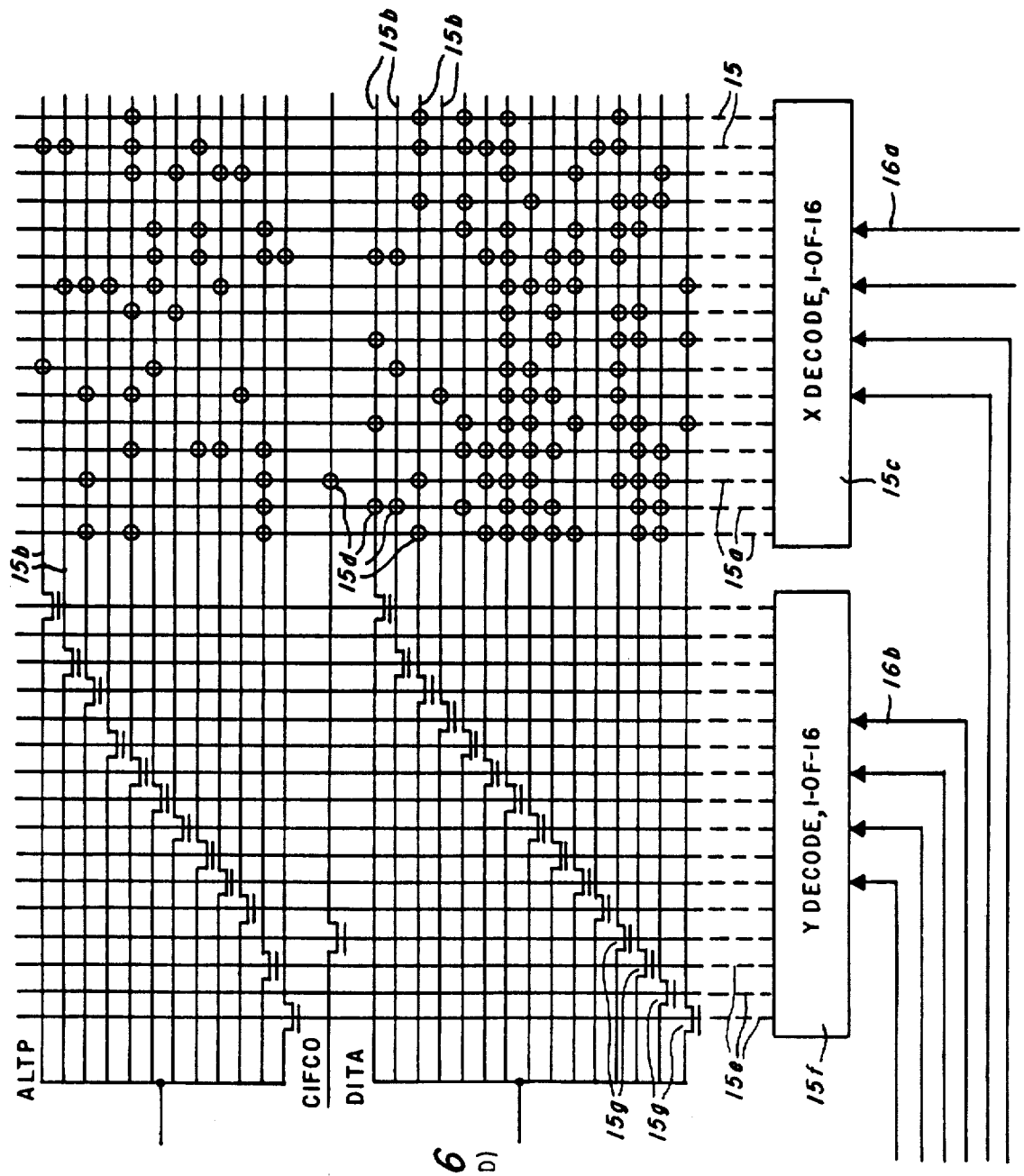

The processor architecture within the CPU chip 1 is shown in block diagram form in FIG. 3, in chip layout form in FIG. 4, and in logic diagram form in FIGS. 5 and 6. Generally, the processor includes an ALU or arithmetic logic unit 10 along with its associated registers, controls, data paths and related logic circuitry. This ALU is adapted for use in the system of FIG. 1, but features of this CPU architecture may be used in other similar systems.

The ALU 10 consists of sixteen parallel binary adder/logic states which function as the computational component of the processor. The ALU 10 receives a 16-bit "A" input 10A and a 16-bit "B" input 10B to produce a 16-bit parallel output 10C. The A input 10A of the ALU is from a 16-bit parallel A bus. The data on the A bus is active low; the indicators $\overline{A}$, A-, or NA should be used in referring to this bus to be technically accurate, and the same is true of the other busses. The A bus may receive data from any one of several sources as will be described, with selection of inputs being made by control inputs 11. Similarly, the B input 10B is from a 16-bit parallel B bus which may receive data from any one of several sources as defined by control inputs 11. The output 10C from the ALU 10 goes to either a P bus or an E bus under control on inputs 11. The ALU performs all the arithmetic and logic functions required to execute microinstructions in the processor such as the functions of addition, subtraction AND, OR, exclusive OR, complement, etc. as needed for the instructions of Table D.

The processor has a number of registers associated with the ALU 10, only three of which are accessable to the programmer. These three are a program counter or PC register, a workspace pointer or WP register, and a status register ST. Other internal registers which are used during the acquisition or execution of instructions are inaccessable to the programmer.

The program counter PC is a 15-bit counter that contains the word address of the next instruction following the instruction currently executing. The fifteen stages are left-justified with the 16th bit hardwired to 0; instructions in the memory 2 are constrained to word boundries, so a single byte is not accessed, only even addresses (words) can be used. The microprocessor references this address to fetch the next instruction from memory 2 and the program counter PC increments the address when the new instruction is executing. If the current instruction in the microprocessor 1 alters the contents of the program counter PC, then a program branch occurs to the location in memory 2 specified by the altered contents of the program counter. All context switching operations, such as interrupts, plus simple branch and jump instructions, affect the contents of the program counter. The program counter can be loaded from the E bus by lines EPC, or its contents applied to the B bus via lines PCB or alternatively to the P bus via lines PCP. All such transfers to or from the program counter are defined by control inputs 11, of course. Internally, the program counter PC includes binary add circuitry to add-1 to the count contained in the 15-bit register at the proper time, again under control of an input 11.

The status register ST is a 16-bit register that contains the results of program comparisons, indicates program status conditions, and supplies interrupt mask level to the interrupt priority circuits. Each of the sixteen bit positions in the status register signifies a particular function or condition that exists in the microprocessor 1; these bit position assignments are shown in Table B. Some instructions use the status register ST to check for a prerequisite condition; others affect the values of the bits in the register; and others load the entire status register with a new set of parameters. Interrupts also modify the status register. The detailed description of the instruction set (Table D) shows the effect of each instruction on the status register. All sixteen bits of the status register ST may be loaded from the E bus via lines EST or loaded onto the E bus via lines STE, upon a command on the control lines 11.

The processor 1 uses blocks of words in the memory 2, called workspaces, for instruction operand manipulation instead of internal hardware registers. A workspace occupies sixteen contiguous memory words as in FIG. 2b, in any part of memory 2 that is not reserved for other use. The individual workspace registers may contain data or addresses, and function as operand registers, accumulators, address registers, or index registers. Some workspace registers are dedicated to take on special significance during execution of certain instructions, as seen in Table D.

A large number of these 16-word workspaces may exist in the 32K words of memory 2, providing a high degree of program flexibility. To locate the workspace in memory 2, the hardware register WP or the workspace pointer is used. The workspace pointer WP is a 15-bit register (left justified with 16th or LSB hardwired to 0) that contains the memory address of the first word in the workspace of FIG. 2b.

The processor accesses any register in the workspace of FIG. 2b by adding twice the register number to the contents of the workspace pointer and initiating a memory request for that word. The 16th bit is 0 so this is equivalent to adding two times the register number to WP. FIG. 2b illustrates the relationship between the workspace pointer and its corresponding workspace in memory. The WP register is loaded onto the B bus via lines WPB, or loaded from the DI bus via lines DIWP, under command of the control lines 11.

This workspace concept is particularly advantageous during operations that require a context switch, which is a change from one program to another, as in the case of a subroutine or an interrupt. Such an operation using a conventional multi-register arrangement requires that at least part of the contents of the register file be stored and reloaded, using a memory cycle to store or fetch each word. The processor 1 accomplishes this operation by changing the workspace pointer WP. A complete context switch requires only three store cycles and three fetch cycles, exchanging the program counter PC, status register ST, and workspace pointer WP. After the switch, the workspace pointer WP contains the starting address of a new 16-word workspace (FIG. 2b) in memory 2 for use in the new routine. A corresponding time savings occurs when the original context is restored. As seen in Table D, instructions in the processor 1 that result in a context switch include: Branch and Load Workspace Pointer (BLWP), Return from Subroutine (RTWP), and an Extended Operation (XOP) instruction; device interrupts, the arithmetic overflow interrupt, illegal op-code detection trap, and others also cause a context switch by forcing the processor to trap to a service subroutine.

The internal registers not accessable to the user (programmer) in the processor 1 include a memory address or MA register, a data or D register, and a K register. The D register is connected as input to a swap bus S via parallel lines DS, and a swap bus output on lines SK may be applied to the K register, all under control of commands on the lines 11. The D register functions principally as a data output latch, and is loaded from the E bus via lines ED. The D register is applied to a DI bus by sixteen parallel lines DDI. The data path from the output 10C of the ALU to the E bus and thus to the D register via lines ED, then to the DI bus via lines DDI and to the A input of the ALU via the A bus is useful in divide routines, for example. Primarily, however, output data is loaded into the D register from the E bus, then to swap bus S via lines DS, and then to sixteen address/data buffers 12 via lines 13. Data can be transferred onto the swarp bus S straight or swapped, depending upon factors like byte operations being performed; these transfers are of course under control of commands on lines 11.

The address/data buffers 12 are sixteen bidirectional, tristate buffers of conventional form, each having an input/output terminal connected to one of the external bus lines 4. These buffers usually receive addresses from the P bus via lines 14, or data via lines 13, for output to the bus 4; for input to the microprocessor chip 1, program or data words are applied via lines 13 to the swap bus S, thence to the K register via lines SK. It is also possible to load the P bus from the K register via lines PK, under a command on a line 11, and thus output the K register via the P bus.

The addresses to memory 2 are usually sent out from the microprocessor 1 via the P bus which is loaded by sixteen lines MAP from the MA register. The bits in this register can also be transferred to the B bus via parallel lines MAB, thus to the B input 10B of the ALU; alternatively the MA register may be loaded from the E bus via lines EMA or from the K latch via lines KMA, all as defined by control lines 11.

Another internal register transparent to a user is the temporary or T register. This register receives a 16-bit parallel output 10F from the ALU 10, and applies its output to the B bus in three ways: either directly via lines TB, shifted left via path TLB or shifted right via path TRB. The T register can also receive the B input 10B to the ALU delayed by ¾ of a clock cycle by a path BT. The T register provides an important function in multiply and divide operation as will be explained.

A register also used in multiply and divide operations is referred to as the MQ shift register (for multiply/quotient). This register has the capability of right shift or left shift by commands on lines 11. The register may be loaded from the A bus or the DI bus by 16-bit parallel lines AMQ and DIMQ, or may be outputted to the E bus or the B bus via lines MQE or MQB. For bit or serial CRU operations involving the CRU 7, the "0" bit of the MQ register is loaded from the "0" A/D buffer 12 at a line CMQ; the output for this purpose is by way of the D register, in parallel, even though only one bit may be used.

An instruction register IR provides the usual function of containing the current instruction, the instruction being executed during a given microcode state time (machine cycle). The instruction register IR is loaded from the DI bus via lines DIIR, or may be loaded into the E bus via lines IRE, under control of lines 11. Various fields of the instruction going to IR also can go to A bus by 2-bit and 4-bit connections IR2 and IR4. During each cycle, however, the contents of the instruction register IR are transferred via sixteen parallel lines IR-0-IR15 to entry point and microcontrol generator circuits as well as miscellaneous control circuitry.

The control signals 11 are generated in a control ROM 15 which is in this case split into two halves, 15H for the high side and 15L for the low side of the ALU and registers. Since there are many controls 11 used on only part of the bits, high or low, rather than all sixteen, space is saved by splitting the control ROM 15 in this manner. Each half of the control ROM has an X array 15X and a Y-select array 15Y. Buffers 15B for each line 11 receive the select outputs from the Y array 15Y and introduce clock or other logic as may be needed to produce the controls in the lines 11. The number of microcontrol lines 11 is about 142, depending upon the instruction set (Table D) to be implemented, well within the addressing range (256) of an 8-bit address on lines 16 that go to both sides 15H and 15H. This 8-bit control ROM address is generated by entry point logic or by a microjump circuit. Microjump addresses, produced on eight lines 17 which receive outputs 11 from the control ROM, can generate a jump address for the next state. The microjump address on lines 17 is fed back to a logic array 18 that can also generate an entry point from inputs received from an execute entry point array 19E or a source/destination address entry point array 19A. A group detect circuit 20 receives the 16-bit instruction word from IR as well as status bits from ST and other controls and produces two inputs to the entry point arrays 19A and 19E, first a group identification and second a field. The group is determined by the left-most 1 of the opcode as seen in FIG. 2c, and the field is three or four bits starting with the left-most 1. The address to the control ROM 15 on the lines 16 may also be held in an 8-bit latch 21 so the same state is re-executed as in multiply or divide instructions; to this end a 4-bit state counter SC is provided which counts state-times up to sixteen, and an overflow output of the state counter can control release of the holding latch 21. Thus, operation of the processor is controlled by instructions loaded into the IR register to generate an entry point via group detect 20 and logic arrays 18, 19A, 19E; the entry point is a starting address for the control ROM 15 entered on address lines 16. This address results in a specific set of commands on the control lines 11; some lines 11 will be active and most not. The address may also produce a jump address on lines 17 to define the control ROM address for the next state, or the next state may be another entry point, or may be the same state due to the holding latch 21. When the last state needed for the instruction is reached, the next instruction is loaded into register IR and another entry point derived.

As described below, the control ROM 15 is of the "compressed ROM" configuration, according to a feature of one embodiment of the invention.

The control outputs 11 from the control ROM 15 also produce bus status codes for lines 6 by a generator circuit 22. The bus status codes of Table E are each generated in response to the specified conditions; an external device can by decoding BST1-BST3 on the lines 6 and MEM- on one of the lines 5 determine exactly what activity is presently being implemented on the bus 4.

The interrupt codes on the lines 8 and the controls 9 are applied to interrupt control circuitry 23 within the chip 1. Bits 12-15 from the status register ST are also applied to the circuitry 23 to provide the interrupt mask for comparison with an interrupt code from external logic. A logic flow chart defining how interrupts are handled by the processor 1 is shown in FIG. 2e (four sheets).

The external control lines 5 are connected to control generator circuitry 24 which responds to lines 11 from the control ROM as well as to other conditions within the chip, and to the lines 5, to produce the necessary internal controls and other external controls 5.

An on-chip memory array 25 is included on the processor chip 1 to provide added functions not in the instruction set of Table D. This memory 25 contains a section 25A of ROM, for example 512 words, and a section 25B of RAM, for example sixteen words or one workspace. The ROM 25A resides at hex addresses 0800-0BFE and the RAM 25B at hex addresses 0000-001E, but these are not within the memory map of FIG. 2b; these locations are merely examples. A memory address decode circuit 25C receives a memory address on lines 25D from the P bus and selects one word from the ROM or RAM 25A, 25B, which is input or output via data I/O circuit 25E to lines 13 on sixteen parallel lines 25F. An on-chip memory control 25G detects a specified opcode referred to as MID or macro-instruction detect (in this example either an illegal opcode or an XOP executed while bit-11 of status register ST is set to one; the control 25G is activated to transfer execution to the on-chip memory 25. When entering this operation, a context switch saves the WP, PC and ST register contents in registers R13, R14 and R15 of the 16-word workspace in RAM 25B. The CPU then executes assembly language instructions (Table D) from the ROM 25A; during execution of these macroinstructions, various microinstructions may access the external memory 2 in the usual manner using indirect, indirect autoincrement and indexed addressing modes. By providing this on-chip memory space 25 separate from the external user space (memory map of FIG. 2b), new instructions can be emulated in a manner completely transparent to the programmer. These new instructions are constructed using the Table D set plus special instructions; a customer for the processor chip 1 may specify certain added instructions to be implemented via on-chip memory 25, yet the customer can write the programs to be stored in ROM 25A to execute these instructions using the Table D instruction set. Detailed operation of the memory 25 is explained below.

An important feature is that the ALU 10 and its associated registers K, D, MA, PC, WP, T, MQ, ST and IR as described above are laid out on an MOS/LSI chip in a regular strip pattern as seen in FIG. 4a. Each of these registers as well as the ALU contains sixteen bits or stages which are laid out in a pattern like memory cells, the bits arranged horizontally in FIG. 4 as seen; the A, B, DI, E and P busses of FIG. 3 are each sixteen parallel metal strips on top of the cells of the ALU and registers (rather than beside the registers as depicted in FIG. 3), and all of the dozens of control lines 11 are horizontal polysilicon lines as they are used as the control gates of for transistors in the ALU 10 and its registers. The number of control lines 11 needed for the ALU 10 is greater than for a single register such as the WP register, for example, and it is a fortunate circumstance that the space needed to lay out the ALU stages is greater than for a single register, so waste space is minimized. That is, the space needed in the control ROM 15 to generate the controls is the same as the space needed for the controlled circuitry. This layout arrangement is indeed advantageous when used with the compressed "wide-word" control ROM or decoder as will be described because it fits exactly alongside the control ROM with virtually none of the wasted space which would be used only for routing conductors in conventional construction of microprocessors. That is, all bus lines A, B, DI, E and P etc., and all control lines 11 are routed over or under functional regions or cells of the chip rather than over unused silicon, and almost all 90° turns are produced inherently at functional cells rather than in conductor routing. In the prior devices the control ROM, the registers, the ALU, etc., were islands of circuitry connected by busses or conductors. The enlarged view of FIG. 4a shows a small part of the ALU 10 and registers, illustrating the metal bus lines and the polysilicon control lines 11 for an N-channel silicon gate MOS device made generally according to U.S. Pat. No. 4,055,444 assigned to Texas Instruments.

It is significant to note that most of the connecting lines such as KDI, ED, EMA, MAB, DINP, etc. as mentioned above are not physically lines or elongated conductors at all but instead are merely metal-to-silicon contact areas along the metal bus lines of FIG. 4a. That is, routing of 16-bit parallel conductors is minimized by the strip feature.

THE ALU AND REGISTER CIRCUITS

The detailed circuits employed in the ALU and its associated registers will be described with reference to FIGS. 5a-5g. These circuits fit together as seen in FIG. 3. Generally, only one bit of the sixteen bits is shown in a strip. For the most part the remaining fifteen bits are the same as the one shown in detail, with some exceptions.

The ALU

Referring to FIG. 5e, one of the bits of the ALU 10 consists of a complex logic circuit having its A input 10A connected to the A bus and its B input 10B connected to the B bus while its output 10C is connected by transistors 10a and 10b to the E and P busses, respectively. The transistors 10a and 10b have connected to their gates control lines 11 labelled HD1ALTE and H1ALTP, respectively. Throughout this description, the convention used for labelling commands or control lines 11 is (a) clock phase such as H1 or "half 1", then (b) the source such as "AL" (for ALU), and (c) "T" or "F" for to or from, followed by (d) the destination such as "P" or "E" bus. The half and quarter clocks are shown in the timing diagram of FIG. 2d. Using this convention, H1ALTP means this control 11 occurs during the H1 or half-1 clock and defines the connection from ALU to the P bus. An input to the A bus from the DI bus by line D1A and transistor 10c is controlled by an H1DITA command on a line 11, translating as "DI to A, on H1 clock". Carry-in and carry-out for this bit are on lines Cout and Cin respectively, which are connected to adjacent stages of the ALU. The carry-out line is precharged to 1 or Vcc on Q1 by transistor 10d, then conditionally discharged after Q1 goes low by a transistor 10e. A NOR gate 10f drives the gate of the transistor 10e based upon a S1STOPG input on one of the control lines 11 (meaning stop generate, on S1), and the voltage on a node 10g. The output of gate 10f is the carry generate condition, and is made unconditionally 0 if STOPG is active. The node 10g, precharged to 1 on Q1, is connected to a node 10h by a transistor 10i which has the inverted A input on its gate. Similarly, in the carry propogagte circuit a node 10j is precharged to 1 on Q1 and is connected by a transistor 10k (also receiving inverted A input) to a node 10m. The nodes 10h and 10n, precharged to 1 on Q1, are conditionally discharged by complex NAND/NOR logic circuit including transistors 10o driven by the $\overline{B}$ and $\overline{\overline{B}}$ input (inverted and twice-inverted), along with transistors 10p driven by the four control lines 11 labelled H2ALU1 to H2ALU4. The four controls ALU1-ALU4 define the operation performed in the ALU as set forth in Table H. The "H3Logic" control on a line 11 is the arithmetic/logic control; when this line is high the ALU performs logic functions by unconditionally grounding the Cin line by transistor 10q, but when low Cin is applied to an input of an exclusive NOR circuit 10p, the other input being the inverted propogate signal from node 10j. The propogate signal also drives the gate of a transistor 10s in conventional manner. An important feature of the ALU 10 is the NOR gate 10f and its stop-generate control which allows the function of two's complement A to be produced with the same code as "pass A" but with H3Logic=0. This is produced by negative A and absolute value of A.

A carry input to the LSB of the ALU 10 is produced by microcode controls 11. A CIFCO or "carry-in from carry-out" control applies the carry-out from the MSB of the prior state to the carry-in at the LSB for the current state. A STCIN control applies the status bit-3 to the carry-in. A CIN control produces an unconditional carry in to the LSB.

The Workspace Pointer Register

A detailed circuit diagram of the workspace pointer register WP is shown in the lower part of FIG. 5c. This register includes two static invertor stages WPa with an input node WPb connected to the output during H2. The input node can be loaded from the DI bus by a transistor WPc having an H4WPFDI (WP from DI, on H4) command on its gate. An intermediate node WPd is connected to the B bus via an inventor WPe and a transistor WPf wich has a command H1WPTB (WP to B on H1) on its gate. Fifteen bits are exactly the same, and bit sixteen is a hardwired 0 or Vss.

The workspace pointer register WP is used as the B input to the ALU 10 when generating the source and destination addresses for typical instructions of Table D. In a context switch, WP is saved by writing into memory 2, and the path for this operation is the B input of the ALU 10 and the P bus. WP is loaded from off-chip by the DI bus.

The Program Counter and Incrementer

Also seen in FIG. 5c, the program counter PC consists of a pair of static inverters PCa having an output node PCb connected to an input node PCc on Q2 by a transistor PCd. The input node PCc may be loaded from the vertical E bus by a transistor PCe having H4PCFE (PC from E, on H4) on its gate; this signal is on one of the control lines 11 running horizontally through the register matrix. The output of the program counter at an intermediate node PCf is connected to the gate of a transistor PCg, from which the program counter contents may be read out onto the vertical P or B busses by transistors PCh or PCi and lines PCP or PCB. The signals to control these transfers are H1PCTP (PC to P, on H1) and H1PCTB (PC to B, on H1) on separate horizontal control lines 11. The program counter is incremented when an H3PCINC signal appears on one of the control lines 11, turning on a transistor PCj; on H1 a transistor PCk turns on, loading the contents of this bit of the program counter onto the gate of a transistor PCm in series with a carry line PCn from the prior bit. Each bit of the carry path is precharged to 1 on Q1 by a transistor PCp. The carry-in for each bit on line PCn is connected by a NOR gate to the gate of a transistor PCq; the NOR gate also has the H4PCFE signal as one input. This circuit causes a carry to be propogated if the bit is 1 and carry-in is 1; or causes the bit to go from 0 to 1 if the carry-in is 1. The LSB stage is a hardwired 0 because only the 15-bit word address is sent out on the bus 4; the 16th bit is the byte address which is not used for access. For byte operation using the odd numbered byte, the next lower even number is the address then the byte swap circuitry S is activated. Thus, the 16th bit of the address is always 0. All the other fifteen bits are identical to that shown in FIG. 5c. The carry-out from the last bit is truncated as it would represent address FFFF (in hex).

The Memory Address Register

One bit of the MA register is seen in detail in the upper part of FIG. 5c. This register includes a pair of standard inverters MAa and MAb in each of the sixteen bits with feedback by a transistor MAc clocked on H2. The register is loaded from the E bus via sixteen separate lines EMA and a transistor MAd in each line. The gates of the sixteen transistors MAd are driven by a signal H4MAFE (MA from E, on H4) on one of the horizontal control lines 11. Likewise, each MA register bit is loaded from the K latch by a line KMA and a transistor MAe which has H4MAFK on its gate. Output from the MA register is taken at an intermediate node between the two inverters which is connected by a transistor MAf to two output transistors MAg and MAh. An H1MATP command on one of the control lines 11 turns on the transistor MAg and connects the output to the P bus via line MAP. An H1MATB command turns on the transistor MAh and connects the output to the B bus via the line MAB. Of course, it is understood that there are sixteen of each of the input and output lines to or from the busses, as is true for the other registers.

The MA register is usually loaded via P bus to the A/D buffers 12 as a basic part of most instruction sequences. It is usually loaded from the ALU output 10C via the E bus when an address is generated by adding WP+2S, for example, which is usually done for most instructions.

The Data Register

The D register or data register contains sixteen bits constructed as shown in detail in FIG. 5b. This register stage consists of a pair of inverters Da and Db with a feedback path via transistor Dc clocked on H2. The input of this register is from the E bus via transistor Dd and a line ED (one of sixteen lines ED), with the transistor Dd being controlled by an H4DFE (D from E) command on one of the lines 11. One of the outputs is from an intermediate node De and a transistor Df which connects to the DI bus by a transistor Dg and one of the sixteen lines DDI. This output is controlled by an H1DTDI (D to DI) command on a control line 11 which is connected to the gates of all sixteen of the transistors Dg. The other output from the D register is by sixteen lines DS, each going to the gate of a transistor Sa in the swap circuit S. The output of this transistor inverter is connected to the swap bus Sb by a transistor Sc having a "straight" command on its gate or a transistor Sd having a "swap" common on its gate. The line 11 connected to the gates of each of the sixteen transistors Sc carries the H2DTSS (D to swap-straight) command, while the line 11 carrying the H2DTSW (D to swap-swapped) is connected to the gates of the transistors Sd. E bus connects to Vcc via Dh and Dd.

The D register most often functions to receive the data output from the ALU10 via the E bus. Also, it functions as the source of an ALU operand input to the A side via the DI bus and the A bus. The D register is used mainly for data output, and also in ready and hold conditions and in divide operations, for example.

The K Latch

The K register or K latch contains sixteen identical stages, one of which is shown in FIG. 5b. The K register uses two standard inverters Ka and Kb with feedback on H1 by a transistor Kc. The output is connected to the gate of an inverter transistor Ke which is connected to output transistors Kf and Kg. A command Q1KTP (K to P) on one of the lines 11 turns on the transistor Kf and connects the output of the K register to the P bus via line KP. A command Q1KTDI (K to DI) turns on each of the sixteen transistors Kg and connects the output to the DI bus by sixteen lines KDI. The K register is loaded from the swap bus S in either straight or swapped condition by transistors Ki and Kj. A command H3KFSS on one of the control lines 11 connects the swap bus to the input of the K register via sixteen transistors Ki while a command H3KFSW connects the swap bus to the input of K via sixteen transistors Kj for swap or byte operations.

The Swap Circuit

The swap circuit S shown in FIG. 5a functions to connect the 16-bit D register to, or the K register from, the A/D buffers 12 via lines 13, either straight or with the high and low bytes swapped. Addresses are usually transferred in or out via the P bus that is connected to the A/D buffers without going through the swap bus, since addresses need not be swapped in byte operations, only data. Thus, data comes in via the K register and goes out via the D register, both using the swap bus S.

The Temporary Register

In FIG. 5d one stage of the sixteen stages of the T register or temporary register is seen in detail. This register consists of two standard inverter stages Ta and Tb with feedback on H2 via transistor Tc. Output from the T register is from a node Td at the output of the inverters, via an inverting transistor Te to a node Tf precharged to Vcc on Q3 via transistor Tg. A H1NLDI command on one of the lines 11 controls a transistor Th in series with transistor Te. Output from the node Tf directly to the B bus is by a line TB and a transistor Ti controlled by a H1TTB (T to B) command on a horizontal line 11. To shift left, the node Tf is connected by a transistor Tj to the B bus in the next more significant bit, to the left, via line TLB. To shift right, the node Tf is connected by a transistor Tk to the B bus in the next lower significant bit, to the right, via line TRB. The transistors Tj and Tk are controlled by commands H1TSLB and H1TSRB on two of the horizontal lines 11. The T register is loaded from the B bus by a line BT and a transistor Tm clocked on Q3 along with an inverter Tn and a transistor Tp which has H1TFB on its gate. This input is delayed by ¾ of a clock cycle. The transistor Tp at the inverter output has its output to the input node Tq to load the T register. The transistor Tr at the inverter output and a transistor Ts with H1TFB on its gate goes to node Tf as a path for replacing the B bus information on the B bus after a delay. Thus, H1TFB followed by H1TTB is a quicker path than loading T register then reading it out onto the B bus in the next cycle. The "F" output from the ALU 10 is connected to the input Tq through a transistor Tt, and to the gate of a transistor Tu. The transistor Tu is in series with a transistor Tv, and both Tu and Tv are controlled by H1TFF. The output of the transistor Tv goes to the node Tf as an output from F to the B bus, which may be either straight, left-shifted, or right-shifted. This arrangment of the T register has great advantages in divide operations as described later.

The MQ Shift Register

The MQ register consists of sixteen bits, one of which is shown in FIG. 5f. This register may be shifted left or right by controls 11 and so is used in multiply and divide instructions, in CRU operations, and the like. Also, the register can be used as a general purpose working register. To this end, an input node MQa may be loaded from the E bus via transistor MQb and line EMQ by control H4MQFE, or loaded from the DI bus via transistor MQc and line DIMQ by control H1MQFDI. Feedback on Q3 is provided by a transistor MQd, and the output of the first stage is connected to the input of the second during H2 by a transistor MQe. The left shift function is provided by a transistor MQf connecting the input node MQa to a node MQg in the next lesser significant bit of the register, this occurring when a command HD4MQSL appears on one of the lines 11. The HD4 prefix for this control means that it occurs at H4 in the next state time, or delayed one clock cycle, from the time this microcode is generated in the control ROM 15. The right shift function is produced when an HD4MQSR control occur on a line 11 turning on a transistor MQh to connect the node MQa to the input node MQa of the next more significant bit of the register. For CRU I/O operations, the first and last bits of the sixteen bits in the MQ register are used as input and outputs via the DI bus or other busses coupling to the bus 4. The contents of the MQ register are applied to the E, P or B busses by a circuit consisting of an inverter MQi and inverter transistor MQj connecting input made MQa (twice inverted) to output node MQk. The output node MQk is connected by transistors MQm to the B, P and E busses when H1MQTB, H1MQTP or HD1MQTE commands occur. The output MQn of the first inverter MQp is connected to the input of the second stage by a transistor MQp on H4MQFE, when MQb is activated.

The Status Register

One bit of the sixteen bit status register ST is shown in FIG. 5g. This stage consists of a pair of inverters STa and STb, with feedback on Q4 by a transistor STc. An input node STd may be loaded from the E bus through a transistor STe when a command H1STFE occurs. Several other input transistors STf may set or load the input node from other sources, such as other controls 11 from the control ROM 15, etc. The output of the status register is taken at an intermediate node STg by an inverting transistor STh with a transfer transistor STi going to the E bus, under control of an HD1STTE command on a line 11.

Among the controls 11 from the CROM 15 are twelve control status signals CS1 to CS12 and two set status signals SS0 and SS2. These control various transistors STf to set or conditionally set the status bits according to the instruction set of Table D and the status bit definitions of Table B.

The Instruction Register

The instruction register IR is a sixteen bit register, one bit of which is shown in FIG. 5g, containing two inverter stages IRa and IRb with feed-back via transistor IRc on H2. The instruction register is loaded from the DI bus at input node IRd through transistor IRc on an H4IRLD command. Also, the instruction register may be cleared by a transistor IRf connecting the input node IRd to Vcc on an H1IRCLR command. True and complement outputs from the instruction register IR are taken at nodes IRg and IRh; these outputs go to the group detect 20 as the IR0-IR15 (and $\overline{\text{IR0}}$-$\overline{\text{IR15}}$) signals, and are of course used to generate entry point addresses, etc. Coming in, bits which define the addresses of registers in the workspace are fed directly to the A inputs of the ALU for source and destination address generation, under control of commands 11 before reaching IR.

Certain ones of the IR outputs and ST outputs are used in a jump detect circuit 26 (FIG. 3) to detect any of the jump instructions and/or conditions as defined by the instruction set of Table D. The bits received by the jump detect circuit are ST0-ST3, ST5, $\overline{\text{ST0}}$-$\overline{\text{ST4}}$, IR4-IR7, and $\overline{\text{IR4}}$-$\overline{\text{IR7}}$.

The group detect 20 receives all fifteen IR bits and complements and determines which of the eleven groups G0 to G10 the instruction word falls in, as defined in FIG. 2c. This is based on the position of the leading "1". Then, the four bit (or in some cases three bit or two bit) field defined also in FIG. 2c is used to generate the entry point address in a PLA.

THE COMPRESSED CONTROL ROM

The control signals on the lines 11 which define the operation of the processor are generated in a control ROM 15 as seen in FIG. 6. According to an important feature of this processor, the control ROM is compressed so that it uses much less space on the chip than prior control decoders. The control ROM 15 generates a set of microcontrol signals on the lines 11 for each individual address applied to the eight input address lines 16; the input is split into a four-bit X address on lines 16a and a four-bit Y address on the lines 16b. For each of the 256 possible address inputs, a unique combination of outputs could be produced, but in a typical embodiment less than 256 are required because an instruction set can be implemented with fewer than 256 states. In a processor which executes the instruction set of Table D, for example, 239 addresses or microcode states are used to selectively activate 142 controls 11 (including eight microjump addresses for lines 17). FIG. 6 shows only eight of the control lines 11, as examples, these being for the MAFDI, MATB, PCINC, PCTB, WPTB, ALTP, CIFCO and DITA signals. The others are similarly coded, depending upon the instruction set.

The control ROM 15 is split into an X-select portion 15x and a Y-select portion 15Y. The X-select portion contains sixteen X lines 15a and a variable number of Y lines 15b, depending upon the degree of compression, as will be explained. The X address on the lines 16a selects one-of-sixteen of the lines 15a using a standard decoder 15c.

Where a circle 15d appears at the intersection of an X line 15a and a Y line 15b, a transistor is formed which connects the Y line 15b to ground through a source-to-drain path. The X lines 15a are poly lines forming the transistor gates. Note that all of the Y lines 15b are populated, i.e., all have circles or transistors 15d. This is in contrast to control ROMs in prior microprocessors where a large part of the ROM is unpopulated (or if the opposite polarity logic is used, is almost totally populated). The control ROM 15 of FIG. 6 is compressed by eliminating all of the Y lines 15b which do not contain a transistor 15d.

The Y select portion 15Y of the control ROM of FIG. 6 includes sixteen lines 15e, only one of which is selected by a one-of-sixteen Y decoder 15f. The transistors 15g, in series with the lines 15b, cause the selection of one and only one of sixteen possible Y lines 15b in each group according which line 15e is high, determined by the binary code on the four lines 16b; all other Y lines 15b in each group are isolated from the control line 11 via transistors 15g.

Figure 6A:
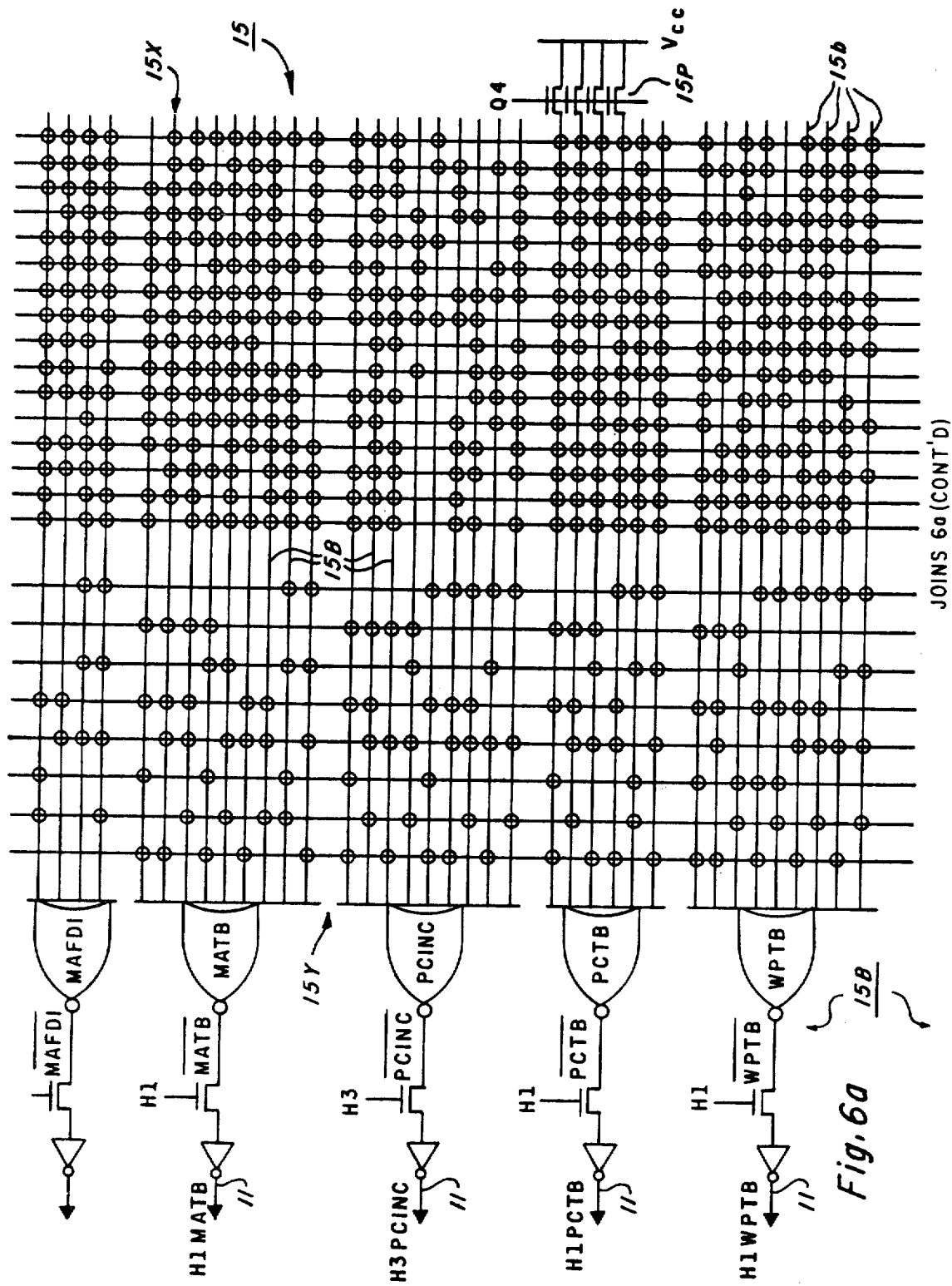
FIG. 6a is a detailed electrical schematic diagram of a Y decode for the compressed control ROM of FIG. 6 according to another embodiment.

In place of the Y select of FIG. 6, a Y select as seen in FIG. 6a can be used; here eight lines 15e are used; only one Y line 15b is selected by a one-of-sixteen decode arrangement responsive to the four Y address bits from line 16b and their four complements. A transistor 15h is formed in shunt with Y line 15b in each place a circle is shown. The Y select of FIG. 6 uses more lines 15e, but fewer transistors 15g than the transistors 15h of FIG. 6a. In either case, the function of the Y select 15Y is to cause only one of the several Y lines 15b in each group to be controlling, as determined by Y address 16b. The embodiment of FIG. 6a employs opposite logic for the X select 15X, compared to that of FIG. 6; a logic form is used in FIG. 6a wherein non-selected lines have a circle or transistor 15d, so that output from a line 15b to a control 11 includes an inverting NOR gate for each group, along with a clock and an inverting buffer 15i. In FIG. 6, all lines 15b are connected together as a hardwired AND in the output to a line 11 in each group with only one inverter 15i.

The compressed ROM of FIG. 6 employs false logic in that the line 15b goes low when the control line 11 which it drives is supposed to go high, generally. Each line 15b has a precharge transistor 15p connected to it so that on each Q4 clock the lines 15b are precharged to Vcc. An invertor 15i produces a 1 on a line 11 when its corresponding Y line 15b is 0. On Q1 of each state time the lines 15a and 15e become valid, conditionally discharging one line 15b in each group and leaving all other at Vcc or 1. The selected line, inverted, becomes a positive control on a line 11 for each group. In some cases such as the ALU control for add, as explained, the output is again inverted to facilitate ROM compression.

In FIG. 6b two of the groups of FIG. 6 are shown without the compression feature, these two groups being the lines 15b for producing the MAFDI and MATB commands. Each group potentially contains sixteen lines 15b and sixty-four transistors 15f. By eliminating the unused lines 15b in each group (shown dotted) where no transistors 15d are present, and eliminating the Y select transistors 15f for these lines, a large saving in space and complexity is produced. For the MAFDI group only four lines 15b are needed, saving twelve Y lines and forty-eight transistors 15f. The MATB group needs only nine Y lines, saving five lines 15b and twenty transistors 15f. Each of the remaining six groups of FIG. 6 requires less than sixteen lines 15b as follows: PCINC has nine lines 15b; PCTB six; WPTB nine; ALTB twelve; CIFCO one; and DITA fifteen. For these eight control lines chosen as an example for FIG. 6, the total saving is sixth-three of 128 possible Y lines 15b, and 252 transistors 15f of a possible 512, or 49%. Considered another way, if a fully implemented ROM was used the X select part 15X would contain $16 \times 16 \times 8 = 2,048$ potential transistors. The compressed ROM of FIG. 6 contains $16(4+9+9+6+9+12+1+15)$ or $16 \times 65 = 1040$ potential transistors 15d or cross points. Again, the saving is 49%.

For an instruction set used for one embodiment, 142 lines 11 are needed so a fully implemented control ROM would contain $142 \times 16 \times 16 = 36,252$ bits. By compression, this is reduced to less than 10,000, a saving of 72%.

In control ROMs for microprocessors, most of the potential ROM bit locations are coded to contain no transistor. The most common action for a given control output 11 is to be off (logic 0). For a typical 16-bit microprocessor with 142 primary control signals 11, usually less than thirty (sometimes only a few) are active during any given state. There are many reasons for this fact. For example, while several registers (MA, PC, WP, T or MQ) may go to one input (B) of the ALU, only one can go to a single input at a time and therefore the control signals for the other possible paths are inactive. Also a number of special control signals may be used in only a few states. This fact was used in prior control decoders for microprocessors by employing secondary decoders; some control signals came from a min control ROM as secondary controls that were decoded in smaller ROMs or random logic to produce primary controls. Ordinarily the primary signals were encoded where only one of several was needed for a given state. In such a scheme, control ROM is saved at the expense of more random outside the control ROM; this makes microprogramming more difficult since the microcode is one level removed from the final control signals, and also slows down the device since time is required to go through the decode states.

The compressed control ROM of FIG. 6 basically uses unencoded control outputs 11. Some controls contain logic circuits in their paths but this is a minimum compared to prior approaches. Most of the control signals are clocked by H1, Q1, etc. in standard clocked gates so that the signals are valid only during a selected time period.

The depth of the control ROM is selected to enhance compressability. Assuming a totally random distribution of control signal occurances, the chance of getting a column that can be eliminated is (by a derivation of hypergeometric probability) approximately $$\frac{(\#S - \#P)! (\#S - B/C)!}{((\#S - \#P) - \#B/C)! (\#S)!}$$

Where #S=number of states, #P=number of occurances of the control signal, and #B/C=the number of potential bits per column i.e., the number of lines 15a in FIG. 6. For example, assuming a control ROM with 256 states, with a control signal that occurs ten times, and sixty-four X lines, i.e. columns with bits sixty-four deep, the probability of eliminating a column is 5%. Clearly the compression technique would not be practical with this chance of reduction. This is a primary reason this ROM compression has not been previously considered. However, several methods can be used to increase the chances of eliminating columns or Y lines.

One method of increasing the likelihood of compression is to directly attack the probability equation above by reducing the number B/C, the bits per column. In the example in the previous paragraph, if the bits per column (the number of X lines) is reduced from sixty-four to sixteen the probability of reduction goes from 5% to 52%. This modification is contrary to established practice because ROMs in integrated circuits are made relatively square (same number of X and Y lines) since this tends to reduce the area of the associated control circuitry for the ROM. Assuming the same number of bits in a ROM, by reducing the number of bits per column (number of X lines) the number of columns (Y lines) is correspondingly increased. However, the compressed ROM approach according to FIG. 6 offsets the increase by reducing the number of columns and thus the number of bits. More columns are created (by reducing the bits per column) so that columns can be eliminated. Even with elimination of unpopulated columns, the number of columns created by reducing the bits per column is not fully absorbed so that the control ROM tends to be wide in the direction of the ROM output lines (longer X lines 15a) while getting shorter in the length of column lines 15b. The increase in the number of column lines 15b increases the number of Y select transistors 15f and at some point this increase is not offset by the reduction in the ROM array 15X due to reducing the bits per column. For a given CPU with a specified register and ALU architecture and instruction set, therefore, there will be a peak point at which the reduction due to column length or number of X lines is at an optimum.

Another type of compression is accomplished by changing the addresses of states. The probability equation above assumes a random accurance of signals. By moving the X and Y addresses around (principally by analysis) more "blank" columns can be created and thus eliminated. First, for this purpose it should be noted that the column reduction is done on the basis of bits 15d which have the same Y select (same Y address). Those states which have the same Y select are said to be in the same partition. In the example shown in FIG. 6, sixteen possible X addresses 0 through F (in hex) have a Y address of 0 (but some are unused) and thus are in the same partition, i.e., there are sixteen states per partition. By rearranging the state addresses the number of bit colums 15b with all zeros (and thus columns that can be eliminated) is increased. For example, ignoring DITA, a Y address of "8" is used only twice in the example shown in FIG. 6, and each time it contains only two transistors on the column lines in the X array 15X, so this is a candidate for consideration. By changing the Y address to "5" instead of "8", "5" is already implemented for those output groups, and moving the transistors to the "5" column, then two more lines and four Y select transistors would be eliminated. Of course, this example would not be possible in actuality because the X position on the Y=5 column is already occupied on some other control line groups not seen in FIG. 6, as well as DITA.

There are some practical problems with changing state addresses, the biggest of these problems being that of generating starting addresses of micro-routines. When the starting address or entry point is generated in random logic rather than by logic arrays or ROMs, it has been found best to let the starting addresses be fixed conveniently by the random logic and then work the compression around these fixed addresses.

The changing of state addresses (the 8-bit addresses on the lines 16) has a closed loop effect on the microcode, since the jump fields 17 in the micro-word outputs 11 change to jump to the changed address. While the columns which produce the jump fields 17 can be reduced by changing addresses, it is a difficult problem to optimize for. This is particularly true if the Y addresses are changed because this affects other reductions. Thus, in attempting to reduce the jump fields 17 it is best to only change X addresses, thus not affecting other reductions.

Another method of compressing the control ROM is by changing the polarity of control signals. By correctly choosing the default conditions of control signals, significant control ROM column reductions can be achieved. By default condition is meant the condition of a signal on a line 11 when a transistor 15d is not coded (i.e., not present). In the example of FIG. 6, as thus far described, it has been assumed that the default condition has been an inactive output on a line 11 (output a logic 0) if no transistor 15d is present; however, this is not necessarily the best default for all cases. If a command on a line 11 is active in more states than inactive it may thus be advantageous to add an invertor in the buffer 15B and then code the inverse into the control 15X.

The best sample of how choosing optimum defaults can work to advantage is given by the controls 11 for the ALU 10. There are eight control signals 11 for the ALU, these being ALU1, ALU2, ALU3, ALU4, STPG (stop generate, preventing carry generate), H3Logic which is 1 for logic and 0 for arithmetic, CIFCO, and CIN which affects only the first bit. If coded conventionally, the ALU circuit of FIG. 5d produces the ADD function with ALU1-ALU4 at 0110, STPG at 0, H3Logic at 0, CIFCO at 0, and CIN at 0. This is the most commonly used condition in a typical instruction set, so if the two 1's in the ALU1-ALU4 controls can be eliminated the possibility of compressing the control ROM 15 can be enhanced. Thus, invertors 10i are added in series with the lines 11 for the ALU2 and ALU3 signals (seen in FIG. 5d). Thus, ADD is a default condition coded with no transistors in the ROM 15X, allowing a maximum of compression. In this case it becomes preferable to code a PASS of either the A or B input in the ALU as an ADD plus zero rather than use the ALU function of PASS which is coded as 0011 for pass A or as 0101 for pass B (uninverted) with H3Logic=1. Much more compression is made possible by using ADD plus zero instead of PASS in coding the ALU operation because no transistors (all zero outputs) are required for the control ROM 15. In one embodiment, the inversion of the ALU2 and ALU3 results in use of the ALU1-ALU4 control columns 15b in only twenty-four out of a possible sixty-four times, i.e., the columns have transistors 15d and are thus present in twenty-four and are absent in forty cases for a particular instruction set.

Use of the control ROM compression as described herein significantly alters the overall design approach used for a microprocessor chip, because control ROM becomes very inexpensive in terms of space utilized. For example, suppose one particular instruction needs a special control signal 11 during one state of execution. Previously this would require an instruction decode signal combined with a general purpose control ROM output signal that indicates when to use. With the compressed control ROM feature, only one column 15b is added and since the columns are short this represents a more compact and thus lower cost solution than if random logic were used. Therefore even special purpose signals may be best generated in the control ROM rather than in random logic with the compression feature minimizing the cost. This ability to relegate almost all the control signals to the control ROM simplifies designing the microprocessor 1, and at the same time gives a small chip area (translating to lower chip cost).

One of the additional advantages to using the compressed control ROM is that controls 11 are generated by the associated column lines 15b using so little space that the lines 15b can be duplicated if controls 11 are needed in two different areas of the chip of FIG. 4, rather than by generating it once and routing conductors from one place to another on the chip. This is, if a control is needed in bit-0 and bit-15 only, it may be more space-efficient to generate it on both sides by a column 15b on both sides, instead of a line 11 going all the way accross the strip. Or, if a control 11 is needed in the area of the instruction register IR at the bottom of the strip and also in the area of the swap bus S at the top of the strip, then the control can be generated in the control ROM 15 at both places, rather than running a metal or poly line from one area to the other.

REGISTER-TO-REGISTER ADD OPERATION

One of the most common instructions in any processor is "add". In the processor described herein, the add instruction uses workspace addressing. The two operands are obtained from registers in the main memory 2 via bus 4 and the result is stored in a register in the memory 2. Various addressing modes may be used, including direct, indirect, automatic incrementing, indexed, immediate or relative. The example uses register direct addressing for one operand located in the workspace, and register indirect addressing for the other operand which is in a register whose address is located in the workspace; the result is stored in the same register which is directly accessed for an operand. This instruction is referred to as "ADD *R, R" for programming purposes.

Execution of the add instruction of the example uses parts of seven "state" times or clock cycles. The timing sequence of clocks used in the microprocessor 1 is shown in FIG. 2d and includes four overlapping half-cycle clocks H1, H2, H3 and H4. The clock H4 of course occupies part of the state time after the one in question. Also, a state time contains four quarter cycle clocks Q1, Q2, Q3 and Q4. The device is built using N-channel technology, so the clocks are positive-going. Typically, the state time is 200 nsec., or the repetition rate is 5 MHZ. The clock input Φ to the chip or the crystal frequency is four times the state frequency or about 20 MHZ.

The memory 2 can be accessed within a state time of the microprocessor 1, so when an address is sent out on the bus 4 during Q2 of a given state time the contents of the addressed location will appear on the bus 4 for input to the microprocessor chip 1 during Q4 or H4 in the same state time. The add instruction of the example requires five memory access operations: one to fetch the instruction, one to fetch the address of the "source" operand, two for the "source" and "destination" operands, and one to store the result in the memory 2 at the "destination" location.

The instruction for the add operation of this example is fetched before the previous instruction has completed execution. This pre-fetch feature results in a significant advantage in operating speed. It will be assumed that the prior instruction was also an add operation, and that the next instruction following the one of the example is also an add operation, to illustrate the pre-fetch feature and overlap of operations. Of the seven state times partially occupied by the add operation of this example, the first two are shared with the prior instruction and the last two are shared with the following instruction execution; thus only the central three are exculsively used by this add operation.

Referring now to FIG. 7 a timing chart for execution of the ADD *R, R instruction is illustrated. The seven state times to be discussed are designated S1 through S7. Briefly, during S1 (which overlaps the prior add instruction) the instruction word in question is pre-fetched by sending out the address which is in the PC register onto the bus 4 to access a location in the memory 2 (ordinarily the ROM part which contains program rather than the RAM part which is used for workspaces); then the contents of this location are received back on the bus 4 and loaded in to the instruction register IR. During S2, the result of the prior operation is written into the location in the memory 2 which is in the memory address register MA; the contents of MA register are sent out on the bus 4 followed by the result of the previous add operation. Meanwhile, during S2, the contents of the WP register are added in the ALU 10 to a number derived from the instruction word pre-fetched during S1; this number is two times the source register number, or 2S. So, the address of the source register is calculated during S2 and is stored in the MA register, then during S3 this address is sent out on the bus 4 to access the source address contained in the selected register of the workspace; this source address is read from the memory 2 and returns via bus 4 to be stored in MA and K registers in microprocessor 1. During S4 state time the address of the source operand is sent out from the K register onto bus 4 and the contents at this address in memory 2 returned via bus 4 to the K register.

Also during S4 the destination address is calculated in ALU 10 by adding the contents of the WP register to two times the "D" field of the instruction word and storing the result in the MA register. Next, during S5, this calculated D address (within the workspace, thus "direct") is sent out from MA register on bus 4 while the operand in the K register is moved to the T register. Then, the contents of the addressed register in memory 2 is returned via bus 4 to be stored in the K register of the chip 1, still during S5. Now the add operation is ready to be implemented; the S operand is in the T register and the D operand is in the K register. Thus, during state S6 the add operation is executed by adding the contents of K and T and putting the result in the D register. Meanwhile, however, during S6 the instruction for the next operation is pre-fetched by sending out the address in the program counter PC (which has been incremented) onto bus 4 and receiving the contents of this address in memory 2 back via bus 4 to be loaded during S7 in the instruction register IR in chip 1. Also, during S7 state time, the result of our example add operation is written into memory 2 by first sending out the address in the MA register (which is the D or destination address calculated during S4) onto bus 4, followed by the contents of the D register, completing execution of the ADD *R, R instruction. During S7, incidentially, the source address for the next instruction is calculated in the ALU 10 adding the contents of the workspace pointer WP to two times the S field of the instruction word accessed in S6, so another add operation is already two state times into its execution sequence. Accordingly, the states S6 and S7 correspond to the states S1 and S2 of FIG. 7.

The instruction word for "ADD R*, R" is shown in FIG. 7a. This is the sixteen bit word which is read during S1 state time in FIG. 7, i.e., the contents of the location addressed by the PC register, in this example. The first 3-bit field 010 says "add". The "B" field, bit 3, defines whether this is a byte operation or a word operation; in this example it is a word operation. If B=1, the operands are bytes and the operand addresses are byte addresses. With B=0, the operands are words. The TD and TS fields, bits 4, 5 and 10, 11, determine the addressing mode of that operand. In the example, TS is 00 so the S field (bits 12-15) contains the register number in the workspace which has the source operand. TD is 01, meaning indirect workspace register addressing mode, so the D field (bits 6-9) contains the register number in the workspace which has the address of the distination operand in it.

Considering the execution of the ADD *R, R instruction example in more detail, it will be noted that FIG. 7 also shows the contents of the various registers and busses as a function of time, as well as other features. Each of register and bus operations will be examined for each microcode state time, along with the control signals produced on the lines 11 to produce these operations.

In the S1 state time of FIG. 7, the control line 11 for H1PCTP (see FIG. 5c) is high during H1, turning on transistors PCi and placing the contents of the PC register on the P bus. Then the DEN command goes high on H1, so the P bus is loaded into the output buffers 12 and thus to the bus 4. The program counter PC is incremented during H3 time by the H3PCINC command on a line 11, turning on transistors PCj and PCm of FIG. 5c, so later at S6 the next instruction in sequence will be accessed. A DEN signal comes up on H2 on a control line 11 to produce a DEN-command at H3 on one of the lines 5 to enable the memory 2 to put data on the bus 4 beginning at Q4. The instruction word fetched here is valid on the bus 4 beginning at Q4, and is loaded into the K register via lines SK by a control H3 KFSS generated every H3 except when blanked; this control turns on the sixteen transistors Ki of FIG. 5b. During this state time S1 an add operation for the prior instruction occurs just as will be described for S6, directing the result to the E bus. A control SAMPI on one of the lines 11 causes the interrupt lines 8 to be sampled so that if an interrupt is present a context switch will occur.

Turning now to the S2 state time of FIG. 7, the instruction which is in the K register is connected to the DI bus at Q1 when the Q1KTDI command goes high and turns on the sixteen transistors Kg; this command occurs every Q1 unless blanked by a control line 11. A command 2STA at H1 causes the S field of the instruction word on the DI bus to be left-shifted and connected by four transistors Ca to bit-11 through bit-14 of the A bus as seen in FIG. 5e. The contents of the workspace pointer register WP are transferred to the B bus at H1 by the H1WPTB command on a line 11 turning on the transistors WPf of FIG. 5c. Thus, with WP on the B bus and 2S on the A bus, when the ALU 10 operates (at H2 and H3) an output will be produced at node 10C during H3 which is the sum (WP+2S). A command ALTE on a line 11 occurs at delayed H1 time, meaning delayed one state time, so at H1 of the next cycle the ALU output is connected by transistors 10a to the E bus. As will be described below with reference to the S7 state, the result of the previous operation is written into memory 2 from D register which was loaded from the E bus at H4; the ALU 10 loaded the E bus at S2, H1 (the same as HD1 for S1).

During the S3 state time of FIG. 7, the address of the register which will contain the source address is generated by an ALU operation. In this operation the contents of the workspace pointer register WP are applied to the B bus by an H1WPTB command turning on transistors WPf and an IR2D command at H1 which applies bit-6 through bit-9 of the instruction register IR to bit-11 through bit-14 of the DI bus via the transistors IRe' of FIG. 5g. The IR2D command in effect left shifts the D field of the instruction word (see FIG. 7a) by one bit to multiply by binary two, then applies it to the A input of the adder via the DI bus. The ALU 10 is in the add condition by default, none of the ALU 1–ALU 4 commands being present, and the input 10c is applied to the E bus at H1 of the next state time by the HD1ALTE command on the line 11 to the gates of transistors 10a (FIG. 5d).

EXECUTION OF SIGNED DIVIDE INSTRUCTION

The processor 1 executes the signed divide instruction (DIVS in Table D) in a preferred manner, compared to prior processor devices. Generally the processor implements the algorithm set forth at pp. 364–368 of "Digital Systems: Hardware Organization and Design", by Hill and Peterson, published 1973 by Wiley & Sons, Inc. The 16-bit divisor is fetched from the source address in memory 2 and its absolute value stored in the D register. The 32-bit dividend is fetched from workspace registers 0 and 1 in memory 2 and its absolute value placed in the T register (MSB's) and the MQ register (LSB's). The quotient is shifted one bit at a time into the LSB of the MQ register as the dividend is left-shifted. The sign of the result is the exclusive-OR of the signs of the divisor and dividend. The remainder is in the T register at the end of the algorithm, and is written into the workspace register 1, and has the same sign as the dividend. The signed quotient is written into workspace register 0 from the T register.

An important feature of the processor 1 particularly for the divide instruction is the construction of the B input to the ALU 10 with the shifted input from the T register and the ability to write the B input back into the T register in the next state time, depending upon the result of the ALU operation. Prior CPU's did the shift function at the ALU output instead of input, and used additional machine cycles to evaluate the result of each subtraction and restore the original number if it was negative. The CPU described herein can execute each subtract-test-restore sequence in one state time instead of several state times.

The divide algorithm requires sixteen repetitions of one basic sequence. The divisor is placed on the A input of the ALU 10 from the D register, the sixteen MSB bits of the dividend are placed on the B input from the T register, and the ALU does a subtract operation. If the result is positive, the result goes into the T register and the original MSB bits from the B input discarded; if negative, however, the sixteen MSM bits are restored in the T register from the B input and the result discarded. Also, if the result is positive a one is shifted into the LSB of the MQ register in the next cycle, or if the result is negative, a 0 is written into the LSB of the MQ register when it is left shifted in the next cycle; thus the quotient is generated in the MQ register. The T register is left shifted as it is transferred to the B input in the next stop, and the MQ register is left shifted, putting its MSB onto the B bus to fill the LSB position vacated when the T register is left shifted. All of these operations occur in one state time in the basic sequence, and the sequence is repeated sixteen times in sixteen state times as the 4-bit state counter SC is incremented to overflow.

The signed divide instruction is executed in thirty-four state times, the first two and last two of which overlap the preceding and succeeding instructions because of the prefetch feature. A state-by-state description of the execution of this invention is seen in FIG. 8.

In S1 of FIG. 8, the instruction is fetched by placing the program counter PC on the P bus and enabling DEN-; the program counter is incremented on H3. This state is usually part of a preceding instruction, as is the next state S2 in which the workspace pointer register WP is placed on the B bus, the A bus has a constant 2 placed on it by the constant generator circuit (a 1 is placed in bit-14 of the A bus providing "10" or binary 2), and the ALU does an add operation with the result to the E bus on the next cycle. This gives the address of one of the operands, WP+2 or WR1. The state S2 also includes the write operation for the result of a prior instruction.

The S3 state is a read cycle for the operand at WP+2. The MA register is loaded from the E bus during H4 at the beginning of this state, then an MATP control at H3 sends out this address on the bus 4. In the ALU, the two's complement of the contents of the K register (which is assumed to have been previously fetched and left in the K register) is generated and placed on the E bus during H1 of the next state.

In the S4 state, the result of the previous ALU operation is transferred from the E bus to the D register, and the contents of the WP register transferred through the ALU by a WPTB control and a pass B operation, the result going to the E bus on the next cycle by a HD1ALTE command.

During the S5 state, the MA register is loaded from the E bus during H4, then the MA register transferred to the P bus during H1 and DEN- activated. This fetches the contents of workspace register RO since WP+0 was sent out at an address on the bus 4. RO, the MSB's of the dividend, is loaded from A/D buffer 12 into the K register, and an ALU operation of K+O is preformed by KTDI (automatic) and D1TA commands. The result of the ALU operations goes into the T register at H1 of the next cycle.

In S6, the T register is loaded from the F output of the ALU by a TFF command, and the negative of the contents of the D register is generated by D1TA and DTDI commands and ALU 1, ALU 4 and STPG controls. The result goes to the E bus in the next cycle.

This is followed by a conditional subtract operation in S7 to check for a divisor of zero. The T register goes to the B input by a TTB command, and the negative of the K register goes to the A input. All four ALU controls ALU 1–ALU 4 are active. The result goes to the E bus on the next cycle.

EXECUTION FROM ON-CHIP MEMORY

The auxiliary on-chip memory 25 provides a method for adding new functions not in Table D and enhancing the performance of specific kernels of software, thereby increasing the total capabilities of the system of FIG. 1. The memory space 25 is separate from the user space 2 or FIG. 2b and is contained within the microprocessor chip 1. Assembly language program segments located in this space 25 benefit from the full performance capabilities of the processor 1 since no wait states are required for memory accesses. While executing in the on-chip memory 25, certain control capabilities are available which are not accessible by ordinary programs. The auxiliary on-chip memory 25 permits a new instruction to be emulated in a manner completely transparent to the programmer.

The memory 25 consists of 512 16-bit words in ROM 25A and 16 words in RAM 25B. The ROM resides at addresses (in hexadecimal) 0800–0BFE, and the RAM resides at addresses 0000–001E, serving as workspace storage during execution in memory 25.

Whenever the processor 1 encounters an MID opcode (an illegal opcode or an XOP executed while status bit-11 is set to 1), a check is made to determine whether an attached processor is prepared to respond to the MID opcode. If not, program control is transferred to the memory 25.

The memory 25 is entered via an entry point table occupying the first ten words of the ROM 25A. Each entry in the table contains the start address in ROM 25A of an emulation routine for a particular MID opcode or group of opcodes. Illegal single-word opcodes are divided into eight groups, with the entry addresses for each group as indicated in Table F. Illegal two-word opcodes are treated as a ninth group, and XOPs as a tenth, as shown in Table F. When the illegal opcode or XOP is encountered, instruction execution transfers to the ROM 25A address in the entry-point table corresponding to that opcode.

A context switch occurs after the entry-point address has been read from the table. The workspace pointer is set to 0000 and the program counter is set to the entry-point address. The old WP, PC, and ST are placed in the RAM 25B at locations in the workspace corresponding to R13, R14 and R15, respectively. The PC value saved in R15 points to the word following the MID opcode. If the MID opcode is a multiple-word instruction, the saved PC points to the location following the first word of the instruction.

To exit the memory 25, a context switch is invoked by executing a RTWP instruction (opcode 0380 in hex). Interrupts are checked prior to executing the next instruction. In those instances where interrupts (maskable or non-maskable), should not be checked before executing the next instruction, the exit from the memory 25 is invoked using the opcode 0381, a special form of the RTWP instruction. In either case, the WP, PC, and ST registers are updated with R13, R14 and R15 from the RAM 25B. If the memory 25 is entered upon detection of an MID opcode not supported by the memory 25, a level-2 trap must be executed to indicate that an attempt has been made to execute an undefined opcode. The opcode 0382 is provided to exit the memory 25 under these conditions. When this opcode is executed in memory 25, an RTWP occurs followed by a level-2 trap. The opcodes 0380, 0381 and 0382 (hex) provide the only valid means for performing an exit for memory 25.

During emulation of an MID opcode in memory 25, the emulation routine can modify the saved status register in R15 in accordance with the results of the emulated opcode. Upon return from the memory 25, the updated status is passed to the main instruction stream. If the status is not updated, it will be restored in its original form.

During execution in the memory 25, several processor functions are modified to provide increased control. These are interrupts, external memory accessing, an evaluate address instruction EVAD, and conditional jump, as will now be described.

All interrupts except reset are inhibited while executing from memory 25. However, pending interrupts can be detected using the conditional jumps described below.

During execution from memory 25, data in external (off-chip) memory 2 is accessed using the indirect, indirect autoincrement and indexed addressing modes. Workspace registers R2, R6, R7, R8, R9, R10, R13 and R14 in the RAM 25B are used as base registers during external accesses. An external access using one of these registers is accompanied by a bus status code indicating a particular type of memory cycle, and MEM- is active low. The bus status code corresponding to the use of each register is indicated in Table G. An external access should utilize a base register whose use is accompanied by a bus status code appropriate to the type of access being performed; the programmer selects a register from Table G accordingly.

Two examples illustrate use of the external access capability. First, R13 in the RAM 25B contains the user's workspace pointer. To read into register R1 in the workspace of RAM 25B the contents of register R4 in the workspace in memory 2 from the main instruction stream executing just prior to entering memory 25 (i.e. the "user's" workspace), the instruction

MOV @8(R13),R1 is executed from memory 25. This instruction says move the contents of the location of address at R13 plus 2×4=8 into R1. A WS bus status code is output during this operation (MEM=0, BST=110). Second, to read immediate data or a symbolic address (following an MID opcode in the user's program) into R4 in RAM 25B, the instruction

MOV*R14+,R1 is executed while in memory 25. This causes the user's PC in R14 in RAM 25B to be incremented by two, and an IOP bus status code is output (MEM=0, BST=010).

Using register R0, R1, R3, R4, R5, R11 and R15 as base register for indirect, indirect autoincrement or indexed addressing results in an internal access in the memory 25. During internal accesses, the MEM-, WE- and DEN- signals output from the processor 1 remain inactive high. During execution from memory 25, a NOP bus status code is output during each machine cycle except when an external access is in progress, as explained above.

An EVAD (evaluate address) instruction is provided during execution from memory 25 to permit convenient calculation of effective source and destination addresses for MID opcodes. EVAD assumes that the MID opcode contains a four-bit opcode, a six bit source field and a six-bit destination field. The address calculations are based upon the original WP of the user, saved in R13 in RAM 25B. If the contents of a register in the user's workspace are fetched as part of the address calculation, a WS bus status code is output by the processor 1 while the external access takes place. The saved PC (in R14 of RAM 25B) is incremented appropriately if symbolic or indexed addressing is used. The contents of any workspace register in RAM 25B except R0 can be evaluated using EVAD. When EVAD is executed, the calculated effective source address is placed in R8 in RAM 25B, and the calculated destination address in R7. If the source or destination field specifies autoincrement mode, the address of the user's register is placed in R9 or R10, respectively. A summary of the EVAD instruction, including its effect on status bits 0 and 2, is given at the end of Table D.

For EVAD instructions, if only the source field of an MID opcode is to be evaluated, the destination field should be cleared to prevent unnecessary external accesses or unintentional modification of the user's PC. For example, if the MID opcode resides in R5 in RAM 25B, the instruction sequence

ANDI R5, 003F

EVAD R5 is executed while in the memory 25 to calculate the effective source address. The destination field, which is all zeros, is interrupted as register direct addressing mode (and ST2 is cleared).

The TB (test bit), SBO (set bit to one) and SBZ (set bit to zero) instructions are not available during execution from memory 25. In place of these operations and using the same opcodes are conditional jump instructions used to detect pending interrupts. These instructions, described at the end of Table D, allow interrupts to be tested at interruptible points in routines executed from memory 25. Instructions requiring long execution times, such as block move instructions for a minicomputer, can be emulated in a way that permits them to be interrupted and resumed after interrupt servicing.

One restriction exists regarding the use of MID opcodes within interrupt service routines. An MID opcode encountered in the interrupt routine for an NMI or level-1 interrupt, or for a reset routine that does not cause complete system reinitialization, must not result in an exit from the memory 25 by means of opcode 0382, the special form of RTWP that causes a level-2 trap. The reason is that the level-2 routine can be interrupted by an NMI, by a level-1 interrupt or by reset, possibly destroying the return linkage established previously. In general, this restriction can be interpreted to mean that an MID opcode in the service routine of an interrupt of higher priority than level-2 must either be recognized by an external instruction set processor or defined by an emulation routine in the memory 25, The last sixteen words of the ROM 25A may be reserved for self-test software used to verify ROM 25A and RAM 25B operation. MID opcode 002D, defined to be opcode for an execute, micro-diagnostic instruction in a minicomputer, is executed in the user program to invoke the self-test routine. Upon encountering this opcode, the processor 1 transfers control to the ROM 25A location (start address of the test routine) pointed to by the address contained in entry-point table location 0804, in the manner indicated in Table F.

EMULATION OF THE ON-CHIP MEMORY

In order to allow emulation of the processor 1 with an on-chip memory 25, the processor may be constructed to access an off-chip memory as if it were the ROM memory 25A. This is important for systems development or prototyping purposes. The "software" or firmware written for the ROM 25A must be checked out and de-bugged before the masks are made to produce the chips 1 in volume for a specific customer application.

To this end, the control circuitry 24 responds to a special indication in the form of pulling RESET- and XIPP- low and releasing them simultaneously. This is accomplished by wiring the two together at the external pins. Referring to FIG. 1a, when this emulator mode is thus entered, the ROM 25A is no longer used, and addresses 088-0BFE access an external memory 25A' (but not within the memory map 2b). The on-chip RAM 25B is still active and is used, so addresses 0000-001E are responsed to in the usual manner by the memory 25. In this mode, accesses to the ROM 25A are instead directed to the memory 25A' off-chip, and this memory 25A' may be either ROM, EPROM or RAM. These accesses are accompanied by active WE- and DEN- signals on the lines 5, along with a NOP or 001 code on the BST lines 6. When operating in this mode, the memory 2 is connected to receive the BST lines 6 so that it will not respond when the bus status code is NOP, which distinguishes memory 25 accesses from accesses of the user memory 2 address space of FIG. 2b.

This emulator mode has other advantages in addition to systems development. Parts manufactured with unusable codes in the ROM 25A, or non-functional ROM 25A, need not be discarded, but instead can be used as emulator devices. Also, small volume custom applications may use the processor 1 exclusively in the emulator mode, with all the accesses to memory 25A going to the off-chip memory 25A instead. As production volume for such an application rises, the firmware can then be moved on-chip to reduce the system parts count. This has advantages for applications where the initial cost of the completely-custom internal firmware for the on-chip ROM 25A is not justified.

EXTENDED (OFF-CHIP) ACCESSES FOR ON-CHIP MEMORY

As described above, all accesses to the memory 25 in the normal mode are accompanied by a NOP bus status code on lines 6 to indicate that an internal cycle is in progress. The address to the memory 25 are actually output via buffers 12 and bus 4, and data from the memory 25 is likewise output. This is only to facilitate debugging and testing because the memory 2 does not respond since the WE- and DEN- outputs on lines 5 from control circuitry 24 are inactive. A useful alternative is to permit accesses to additional off-chip auxiliary memory to expand the memory 25, still separate from the memory map of FIG. 2b.

To this end, accesses to memory 25 space not within the defined addresses 0800 to 0BFE and 0000-001E is responded to in a special way. When in the MID mode, i.e. accessing memory 25 as described above, an address outside the range of memory 25 will cause the control circuitry 24 to activate WE- and DEN- outputs on the lines 5; NOP (and MEM- high) still appears on the BST lines 6. When this occurs, a memory 2' is accessed as indicated in FIG. 1a. The system memory 2 is connected to the BST lines 6 so it will not respond when NOP is involved.

This mode of operation has advantages in adding to the flexibility of the system. The memory 25, off-chip or on-chip, is entirely separate from the user memory space, so complex system functions (added instruction set) are implemented while leaving the user (programmer's) address space intact for simplicity. Speed-critical functions otherwise built up in software can be implemented in extended memory 2' for increased efficiency. Part or all of the off-chip memory 2' can be fast RAM, which will execute faster than if ROM were used because no wait states are needed; the RAM can be used for scratch storage, or loaded upon command with updated emulation software. Of course, the extend off-chip memory 2' for memory 25 provides room for more functions than can fit on the on-chip memory alone, so more complex systems can make use of the processor 1. Indeed, attached-processor type functions can be implemented using the extended memory 2', needed nothing other than memory components and software written in standard assembly language. As with the on-chip memory 25, the off-chip extension 2' of the memory 25 is completely transparent to the user-programmer (all the software is generated in the systems design), and resides in address space entirely separate from the user memory 2.

COMMUNICATION REGISTER UNIT INTERFACE

The communications register unit or CRU 7 is a direct command driven bit-oriented I/O interface. The CRU 7 may directly address in bit-fields of one to sixteen bits up to 32768 peripheral input bits, and up to 32768 peripheral output bits. The processor 1 executes three single-bit and two multiple-bit CRU instructions as explained in Table D. The single-bit instruction include Test Bit (TB), Set Bit to One (SBO), and Set Bit to Zero (SBZ); the multiple-bit instructions included Load CRU (LDCR) and Store CRU (STCR). As shown in FIG. 1, the interface to the CRU 7 from the processor 1 utilizes the same signal lines as the memory interface. FIGS. 2f and 2g illustrate the input and output timing for the CRU.

To transfer a data bit from the MQ register in the processor 1 to a CRU device 7, the processor 1 first asserts ALATCH on one of these lines 5 and outputs the appropriate CRU bit address on the A/D bus 4 and also takes MEM-high. The ST8-signal is forced high for all CRU cycles regardless of the actual state of ST bit-8 in the status register ST of the processor chip 1. The control 24 then pulls ALATCH low, and the processor 1 outputs the CRU bit from MQ bit-15 on bit-15 of the bus 4 and pulses WE- (now functioning as CRUCLK-).

To transfer a data bit from a CRU device 7 to bit-0 of the MQ register, the processor first takes ALATCH high and output the appropriate CRU bit address on the bus 4 and also takes MEM-high. The control 24 of the processor 1 then pulls ALATCH low, prepares to input the CRU bit on bit-0 of the bus 4, and pulses DEN-. (A pulse of DEN- while MEM- is inactive uniquely denotes a CRU input.)

These input and output cycles are repeated until transfer of the entire field of data bits specified by the CRU instruction being executed has been accomplished. The READY and WAITGEN inputs are used by the control 24 of the processor 1 to determine the completion of each bit transfer. A bus status code (see Table E) accompanies each bit transfer.

Single-Bit CRU Operations:

The processor 1 performs three single-bit CRU functions: Test Bit (TB), Set Bit to One (SBO), and Set Bit to Zero (SBZ). The SBO instruction places a one on bit-15 of the bus 4. The SBZ instruction places a zero on the bit-15 of the bus 4. A test bit instruction transfers the addressed CRU bit from the bit-0 of the bus 4 to bit-2 of the status register ST (the Equal or EQ bit).

The processor develops a CRU bit address for the single-bit operations from the CRU base address contained in workspace register R12, bits 0-14, and the signed displacement count contained in bits 8-15 of the instruction word. The displacement allows two's complement addressing from base minus 128 bits through base plus 127 bits. The base address from workspace register R12 is added to the signed displacement specified in the instruction and this effective base address is placed onto the address bus. FIG. 2h illustrates the development of a single-bit CRU address.

Figure 2I:
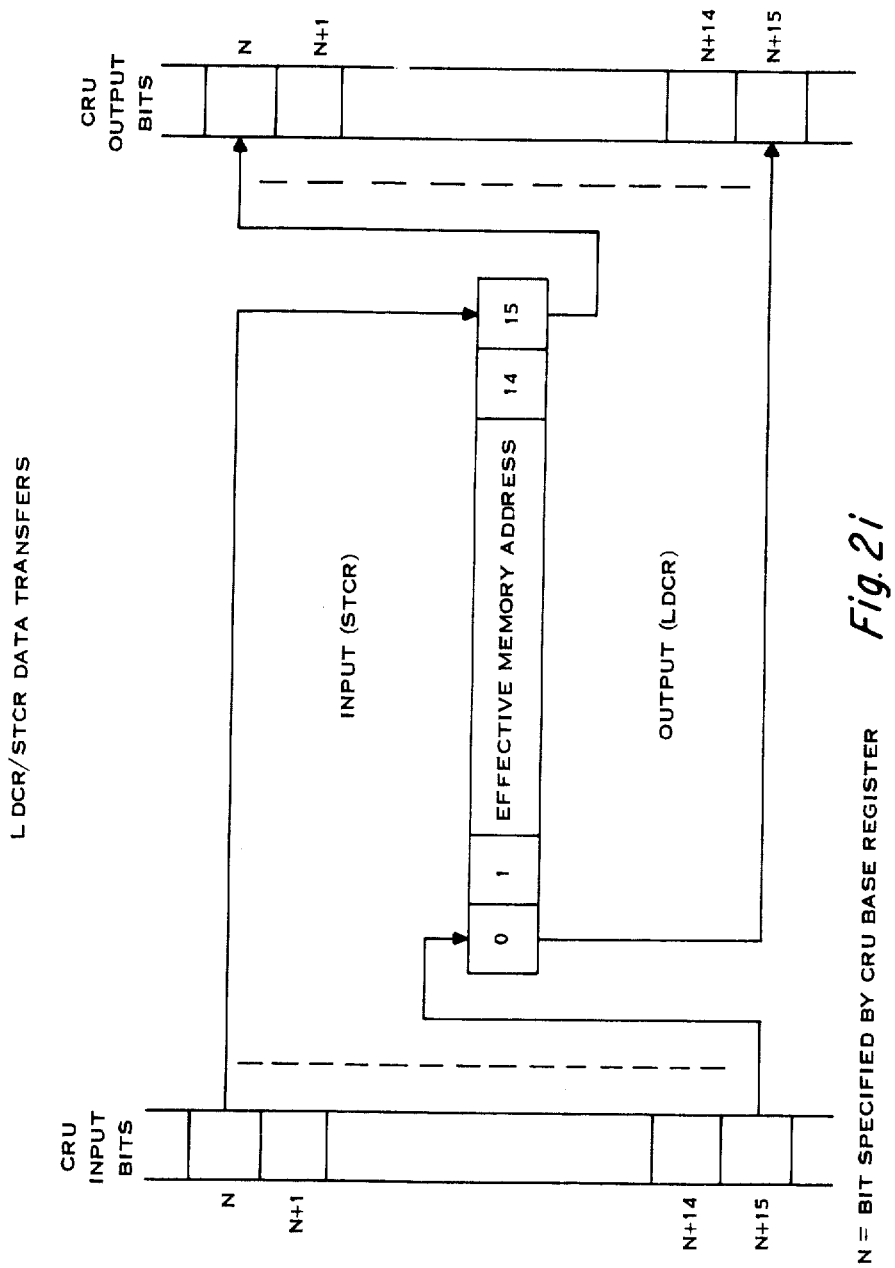
FIG. 2i is a diagram of data transfers for certain CRU operations of the system of FIG. 1.

Multiple Bit CRU Operations:

The processor performs two multiple-bit CRU operations or instructions: store communications register (STCR) and load communications register (LDCR). Both operations perform a data transfer from the CRU-to-memory or from memory-to-CRU as illustrated in FIG. 2i. Although the figure illustrates a full 16-bit transfer operation, any number of bits from one through sixteen may be involved. The LDCR instruction fetches a word from memory 2 and right shifts it to serially transfer it to CRU output bits. If the LDCR involves eight or fewer bits, those bits come from the right-justified field within the addressed byte of the memory word. If the LDCR involves nine or more bits, those bits come from the right-justified field within the whole memory word. Workspace register R12, bits 0-14, defines the starting bit address. When transferred to the CRU device 7, each successive bit receives an address that is sequentially greater than the address for the previous bit. This addressing mechanism results in an order reversal of the bits; that is, bit-15 of the memory word (or bit-7 for byte operations) becomes the lowest addressed bit in the CRU 7 and bit-0 becomes the highest bit in the CRU field.

A STCR instruction transfers data from the CRU to memory 2. If the operation involves a byte or less transfer, the transferred data will be stored right-justified in the memory byte with leading bits set to zero. If the operation involves from nine to sixteen bits, the transferred data is stored right-justified in the memory word with leading bits set to zero. When the input from the CRU device 7 is complete, the lowest addressed bit from the CRU is the least significant bit position in the memory word or byte.

Parallel CRU Operation:

When the most significant bit of the CRU address of a STCR or LDCR instruction is a one, the CRU transfer will take place in one cycle. One word (sixteen bits) of data will be transferred to or from the CRU via the A/D bus 4, if the count specified nine or more bits. A byte of data will be transferred on A/D bus lines bit-0 to bit-7 if the count specified eight or less bits. Additionally, workspace register R12 may be auto-incremented. The timing of the CRU parallel transfer will be indentical to a single bit CRU transfer, as shown in FIGS. 2g and 2f. Wait states will be generated as specified by READY and WAITGEN. This mechanism is used to provide high speed system transfers to a mapper. CRU input and output cycles are denoted by individual bus status codes (see Table E).

Other Operations:

A wait state is the extension of the present machine cycle by one CLKOUT cycle. Wait states can be generated for both memory 2 and CRU 7 bus cycles using the READY and WAITGEN inputs 5 of the processor 1. READY and WAITGEN generation of wait states is defined in Table A. READY is defined to by a "typical" ready signal while WAITGEN is inactivated; wait states equal to one machine state are inserted until READY becomes active. If WAITGEN is active, one wait state is unconditionally inserted. After this one wait state, additional wait states will be inserted until READY becomes active. WAITGEN is used to minimize problems associated with propagating a ready wait indication to the processor 1 in large, multi-board systems. Timing relationships for memory bus cycles as shown in FIG. 2d, and timing relationships for CPU bus cycles are shown in FIGS. 2f&2g.

When the processor 1 is performing an operation internally and is not performing a transfer on the bus 4, a bus cycle occurs that begins with the processor 1 asserting the ALATCH signal in control lines 5 high and outputting a non-specific address on the bus 4, and also taking MEM- high. The control 24 in the processor then pulls ALATCH low and puts the bus 4 in the high-impedance state. Both DEN- and WE- are kept at level high for the cycle. READY and WAITGEN input levels have no effect on the duration of the bus cycle (cycle length is the same as that of memory cycle with no Wait states). The "internal ALU operation" bus status code is output on lines 6 to indicate this bus cycle. Also, the MPILCK status code can become active during an internal cycle.

ADDRESSING MODES

The instructions of Table D may be used with a variety of available modes for addressing random memory data (e.g., program parameters and flags), or formatted memory data (character strings, data lists, etc.). These addressing modes are:

(a) Workspace Register Addressing
(b) Workspace Register Indirect Addressing
(c) Workspace Register Indirect Auto Incrementing Addressing
(d) Symbolic (Direct) Addressing
(e) Indexed Addressing
(f) Immediate Addressing
(g) Program Counter Relative Addressing
(h) CRU Relative Addressing The following description explains the derivation of the effective address for each addressing mode. The applicability of addressing modes to particular instructions is included in Table D along with the description of the operations performed by the instruction. The symbols following the names of the addressing modes (R, *R, *R+, @LABEL or @TABLE (R)) are the general forms used to select the addressing modes for a register R.

Workspace Register Addressing, R

The workspace register R contains the operand, so the workspace pointer WP plus 2R gives the address of the operand. The workspace register addressing mode is specified by setting the two-bit T-field (TS or TD) of the instruction word equal to 00.

Workspace Register Indirect Addressing, *R

The workspace register R contains the address of the operand, so the workspace pointer WP plus 2R gives the address of the register R containing the address of the operand. The workspace register indirect addressing mode is specified by setting the two-bit T-field (TS or TD) in the instruction word equal to 01.

Workspace Register Indirect Auto Increment Addressing, *R+

The workspace register R contains the address of the operand just as in WR indirect addressing, but after acquiring the address of the operand, the contents of workspace register R are incremented. The workspace register indirect auto increment addressing mode is specified by setting the two-bit T-field (TS or TD) in the instruction word equal to 11.

Symbolic (Direct) Addressing, @LABEL

For this mode, the word following the instruction contains the address of the operand. The program counter PC contains the address of the instruction and (PC)+2 is the address of the operand. The symbolic address mode is specified by setting the two-bit T-field (TS or TD) in the instruction word equal to 10 and setting the corresponding S or D field equal to 0.

Indexed Addressing, @TABLE (R)

For indexed addressing, the word following the instruction contains the base address, the workspace register R contains the index value, and the sum of the base address and the index value results in the effective address of the operand. The indexed addressing mode is specified by setting the two-bit T-field (TS or TD) of the instruction word equal to 10 and setting the corresponding S or D field not equal to 0. The value in the S or D field is the register which contains the index value.

Immediate Addressing

Here the word following the instruction (i.e. PC plus 2) contains the operand. No T-field is pertinent here because only immediate instructions use this mode.

Program Counter Relative Addressing

For this mode, the eight-bit signed displacement in the right byte (bits 8–15) of the instruction is multiplied by two and added to the updated contents of the program counter PC; the result is placed in the PC.

CRU Relative Addressing

For CRU relative addressing, the eight-bit signed displacement in the right byte of the instruction is added to the CRU base address (bits 0–14 of the wordspace register R12). The result is the CRU address of the selected CRU bit.

THE INTERRUPT INTERFACE

The processor 1 employs sixteen interrupt levels, with the highest priority level-0 and lowest level-15. Level-0 is reserved for the Reset function. Level-2 is reserved for an illegal op-code trap, a privileged violation trap, and at the user's option for the arithmetic overflow interrupt. Interrupt level-1 through level-15 may be used for external device interrupts. External device interrupts are input to the processor via the interrupt request (INTREQ-) signal line among the control lines 9 and the four interrupt code lines 8 (IC-0–IC3). FIG. 2j shows the timing for the sampling of these inputs by the processor and their effects on processor operation. Activation of the INTREQ- input causes the control 23 in the processor to compare the interrupt code (IC0–IC3) with the interrupt mask contained in status register ST bits 12–15. When the level of the pending interrupt is less than or equal to the enabling mask level (higher or equal priority interrupt), the control 23 recognizes the interrupt and initiates a context switch following completion of the currently executing instruction. The processor fetches the new context (WP and PC) from the interrupt vector locations while holding ST8- high as shown in FIG. 2j. While WP and PC are being fetched, the Interrupt Acknowledge code (IACK, see Table E) is placed on the bus status lines 6. Then the previous context (WP, PC, and ST) is stored in workspace registers R13, R14 and R15, respectively, of the new workspace. Status register ST bits 7–11 are then set to zero. This is done so that the overflow interrupt enable (ST10), map enable (ST8), and privileged mode (ST7) are not dependent on an unrelated program segment. The control 23 then forces the interrupt mask to a value that is one less than the level of the interrupt being serviced, except for level zero interrupt, which loads zero into the mask. This allows only interrupts of higher priority to interrupt a service routine. The control 23 also inhibits interrupts until the first instruction of the service routine has been executed.

The interrupt vector is normally read from the memory 2, but a system could be easily constructed in which the interrupting I/O or peripheral device 3 itself supplies the interrupt vector via the memory bus 4. In this case, a decoder using the IACK bus status code on lines 6 and the six LSB's of the address on bus 4 would enable the interrupting device 3 and disable memory 2 when processor 1 fetched the interrupt vectors.

If a higher priority interrupt occurs, a second context switch occurs to service the higher priority interrupt. When that routine is complete, a return instruction (RTWP) restores the routine parameters to the processor 1 to complete processing of the lower priority interrupt. All interrupt subroutines should terminate with the return instruction to restore original program parameters. The interrupt vector locations, device assignment, enabling mask value, and the interrupt codes are shown in Table C.

Interrupt Level 0-Reset

Interrupt Level 0 is reserved for the RESET- input on a line 5 to the processor. When asserted (logic 0 level), RESET- causes the control 23 to stop instruction execution and inhibit WE-, DEN- and MEM-. The processor will remain in this state until RESET- is released.

When RESET- is released, the processor initiates a level zero interrupt sequence which acquires the WP and PC trap vectors from memory locations 0000 and 0002 (in hex), stores the old WP, PC and ST in the new workspace, sets all status register ST bits to logic level 0, sets the error status bits which are implemented internal to the processor to logic level 0, and then fetches the first instruction of the reset program environment, if NMI- on a line 9 is not active. If NMI- is active, the non-maskable interrupt trap occurs after the reset function is completed. The control 24 in the processor continuously samples RESET- on high-to-low CLKOUT clock transitions.

Non-Maskable Interrupt (NMI)

The NMI- signal on a line 9 is the request input for the NMI level interrupt and allows ROM loaders, single-step/breakpoint/maintenance panel functions, or other user-defined functions to be implemented for the system of FIG. 1. This signal and its associated interrupt level are named "Load" in some prior microprocessors such as the 9900.

NMI- being active (low) according to the timing illustrated in FIG. 2d constitutes a request for the NMI level interrupt. The processor 1 services this request exactly according to the basic interrupt sequence previously described, with the priority level, trap vector location, and enabling/resulting status register interrupt mask values as definwed in Table C. Note that the processor will always grant a request for the NMI level interrupt immediately after execution of the currently executing instruction is completed since NMI is exempt from the interrupt-disabling-after-execution characteristic of certain instructions and the current value of the interrupt mask.

Interrupt Level-2

Interrupt level-2 has three additional capabilities associated with its usage in addition to being an external interrupt: arithmetic overflow interrupt, macro instruction detection (MID) trap and privileged opcode violation interrupt. The external level-2 interrupt should be reserved for system errors, such as memory errors.

Arithmetic overflow conditions as indicated by status register ST bit-4 being set to a 1, will cause a level-2 interrupt to be requested. This request will occur at a time such that if the request is granted, it will be granted immediately after the instruction that caused the overflow condition. The processor services this request according to the standard interrupt sequence described above. The PC which is stored will point to the instruction following the one which caused the error.

In addition to being maskable with the interrupt mask, the overflow interrupt is enable/disabled by status register ST bit-10, the arithmetic overflow enable bit (i.e., ST(10)=1 enables overflow interrupt; ST(10)=0 disables overflow interrupt). If servicing the overflow interrupt is overridden by the servicing of a higher priority (level-0 or level-1) interrupt, the occurrence of the overflow condition will be retained in the error status register and in the contents of the status register ST, which is saved by the higher priority interrupt context switch. Returning from the higher priority interrupt subroutine via an RTWP instruction causes the overflow condition to be reloaded into status register ST bit-4 and the overflow interrupt to be requested again (upon completion of the RTWP instruction). The arithmetic overflow interrupt service routine therefore must reset bit-4 or bit-10 in the status word saved in workspace register R15 to zero as well as bit-4 of the error staus register before the routine is compelte to prevent generating another overflow interrupt immediately after the return.

Macro Instruction Detection (MID) Trap

The acquisition and attempted execution of a macroinstruction opcode will cause the MID trap to occur before execution of the next instruction. Macro-instruction opcodes which cause the trap are listed in Table F. The MID interrupt has basically two applications. The MID opcodes can be considered to be illegal opcodes and the MID trap is then used to detect errors of this nature. The second, and primary application of the MID trap is to allow the definition of additional instructions for the processor, using the on-chip memory 25 or using software in the MID trap service routine to emulate the execution of these instructions. MID opcodes are used as the opcodes for these "macro" instructions. The benefit of this implementation of macro instructions is that the macro instructions can be implemented in the memory 25, in microcode in other processors, or in software by the service routine, and software will then be directly transportable among these processors.

When instruction emulation is performed, the subroutine can modify the saved status register ST in workspace register R15 in accordance with the results of the emulated instruction. The updated status will then be passed to the main instruction stream. Otherwise, unmodified status will be restored by the return.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

TABLE A

DEFINITION OF CONTROL LINES

ALATCH

Address latch. When active (high), ALATCH indicates that address information is present on the bus 4. When inactive (low), ALATCH indicates that either memory data or CRU data is present on the bus 4, or that the bus 4 is in another state, depending upon the values of the BUS STATUS bits and MEM-. (ALATCH=0 is a strobe for decoding MEM- and BST1-BST3, which will be stable when ALATCH=0.) ALATCH has a low-to-high followed by a high-to-low transition at the beginning of every bus cycle. During a HOLD state, ALATCH will remain low when the READY and WAITGEN signals indicate a wait state.

MEM-

Memory cycle. When low, MEM- indicates that the bus 4 is in a memory cycle, and when high, MEM- indiates that the bus 4 is in another type of cycle or state, depending upon BST1-3. MEM- assumes the high impedance state when HOLDA is active. An internal resistive pull-up maintains a high level.

WE-

Write enable (also inverted CRU clock). When low, WE- indicates that memory write data is available on the bus 4 (when MEM-=0); or that CRU data out is available on bit-15 of the bus 4. (CRU bus status); WE- is a three-state signal and assumes the high impedance state when HOLDA is active. An internal resistive pull-up maintains a high level.

DEN-

Data driver enable. When active (low), DEN- indicates that a read (memory or CRU) cycle is taking place on the bus 4 and that external devices such as in memory 2 or CRU 7 may enable 3-state drivers that output data onto the bus 4. DEN- is a 3-state signal and assumes the high impedance state when HOLDA is active. An internal resistance pull-up maintains a high level.

READY

Ready: When active (high), READY indicates that memory 2 or the CRU 7 is ready to complete the present bus cycle. When not-ready is indicated, a Wait state (defined as extension of the present bus cycle by two clock cycles) is entered. At thwe end of each Wait state READY is examined to determine if another Wait state is to be generated or if the bus cycle is to be completed.

WAITGEN

Wait state generate. When active (high) at the first sample time of READY in a memory or CRU bus cycle, WAITGEN will generate the first Wait state regardless of the logic level of READY. After this first sample time, the logic level of WAITGEN is ignored and extension or completion of bus cycles is determined by READY alone. WAITGEN may be tied high to provide a simple means of generating a single Wait state, and can help minimize problems associated with propagating a Ready/Wait indication to the processor 1 in large, multi-board systems.

RESET-

Reset. When active (low), RESET- causes the processor 1 to set all status bits in status register ST to zero and inhibits WE-, DBIN- and MEM-. When RESET- is released, the processor 1 initiates a level zero interrupt sequence that acquires WP and PC from locations 0000 and 0002 in memory 2, sets all status register bits to zero, and starts execution. RESET- will also terminate an idle state. RESET- must be held active for a minimum of one CLKOUT cycle. RESET- is a Schmitt-trigger input.

HOLD-

Hold. Used as a DMA or direct memory access request. When active (low), HOLD- indicates to the processor 1 that an external controller 3 desires to use the bus 4. The processor 1 enters the Hold state following a hold signal when it has completed its present bus cycle. The processor 1 then places the bus 4 in the high impedance state (along with MEM-, ALATCH, BST1-3, DEN-, and WE-) and responds with a HOLDA encoding on BST1-BST3. When HOLD- is removed, the processor 1 returns to normal operation.

BST1-BST3

Bus status codes. When decoded in conjunction with MEM-, BST1-BST3 provide information about the type of bus cyclwe or state currently in progress (e.g., Memory, Internal ALU, HOLDA, Interrupt Acknowledge, Instruction Acquisition, and Multi-Processor Interlock). ALATCH provides the appropriate timing to strobe this decode (MEM- and BST1-BST3 valid when ALATCH low). BST1-3 assume a high impedance state when HOLDA is active. An internal resistive pull-up maintains a high level (HOLDA Bus Code).

XIPP-

External Instruction Processor Present. When the processor 1 fetches an illegal op-code (or an XOP), the XIPP- signal will be sampled at the end of the MID bus state. If XIPP- is true, the processor 1 will execute the trap to the Level 2 interrupt vector (XOP vector for an XOP). It will fetch the new WP and store the old WP, PC, and ST in the new workspace (registers 13, 14, and 15 respectively). At this point, the processor 1 enters the Hold state and responds with HOLDA encoding on BST1-BST3. After completing the instruction, the external processor 3 releases XIPP (after first updating WP, PC, and ST as required by the instruction). The release of XIPP- signals the processor 1 to refetch the updated WP, PC, and ST from trap registers 13, 14, and 15 and continue normal execution. (If there is no external processor 3 present, the processor 1 completes the trap and performs the instruction in software.)

INTP-

Interrupt Pending. The INTP- is true whenever an interrupt which is not masked or a non maskable interrupt (NMI-) is detected. This signal is not tri-state and may be used to interrupt an external instruction processor 3 which is doing a series of instructions.

INTREQ-

Interrupt request. When active (low), INTREQ- indicates that an external interrupt is requested. If INTREQ- is active, the processor 1 loads the data on the interrupt-code-input lines 8 (IC0-IC3) into an internal interrupt-code-storage register 23. The code is compared to the interrupt mask bits of the status register ST. If equal or higher priority than the enabled interrupt level (interrupt code equal or less than status register bit-12 to bit-15 the interrupt sequence in initiated. If the comparison fails, the processor 1 ignores the request. INTREQ- should remain active and the processor will continue to sample lines 8 (IC0-IC3) until the program enables a sufficiently low priority to accept the request interrupt.

IC0-IC3

Interrupt codes. Applied to lines 8. IC0 is the MSB of the interrupt code, which is sampled when INTREQ- is active. IC3 is the LSB. When IC0-IC3 are LLLH, the highest external priority interrupt is being requested and when HHHH, the lowest priority interrupt is being requested. Interrupt levels are shown in Table C.

NMI-

Non Maskable Interrupt. When active (low), NMI- causes the processor 1 to execute a nonmaskable interrupt with memory address FFFC containing the trap vector (WP and PC). The NMI sequence begins after the instruction being executed is completed. NMI- will also terminate an idle state. If NMI- is active during the time RESET- is released, then the NMI- trap will occur after the RESET- function is completed. NMI- must be active for at least one clock cycle to be recognized and will only be recognized once for each high-to-low transition.

TABLE B

STATUS REGISTER BIT DEFINITIONS

| BIT | NAME | INSTRUCTION | CONDITION TO SET BIT TO 1, OTHERWISE SET TO 0 |
|---|---|---|---|
| ST0 | LOGICAL GREATER THAN, LGT | C, CB | If MSB(SA) = 1 and MSB(DA) = 0, or if MSB(SA) = MSB(DA) and MSB of ((DA) − (SA)) = 1 |
| | | CI | If MSB(W) = 1 and MSB of IOP = 0, or if MSB(W) = MSB of IOP and MSB of (IOP − (W)) = 1 |
| | | ABS, LDCR | If (SA) ≠ 0 |
| | | RTWP | If bit (0) of WR15 is 1 |
| | | LST | If bit (0) of selected WR is 1 |
| | | A, AB, AI, AM, ANDI, DEC, DECT, LI, MOV, MOVB, NEG, ORI, S, SB, DIVS, MPYS, INC, INCT, INV, SLA, SLAM, SM, SOC, SOCB, SRA, SRAM, SRC, SRL, STCR, SZC, SZCB, XOR. | If Result ≠ 0 |
| | | Reset Interrupt | Unconditionally sets status bit to 0 |
| | | All other Instructions and Interrupts | Do not affect the status bit |
| ST1 | ARITHMETIC GREATER THAN, AGT | C, CB | If MSB(SA) = 0 and MSB(DA) = 1, or if MSB(SA) = MSB(DA) and MSB of (DA) − (SA) = 1 |
| | | CI | If MSB(W) = 0 and MSB of IOP = 1, or if MSB(W) = MSB of IOP and MSB of IOP − (W) = 1 |
| | | ABS, LDCR | if MSB(SA) = 0 and (SA) ≠ 0 |
| | | RTWP | If bit (1) of WR15 is 1 |
| | | LST | If bit (1) of selected WR is 1 |
| | | A, AB, AI, AM, ANDI, DEC, DECT, LI, MOV, MOVB, NEG, ORI, S, SB, DIVS, MPYS, INC, INCT, INV, SLA, SLAM, SM, SOC, SOCB, SRA, SRAM, SRC, SRL, STCR, SZC, SZCB, XOR | If MSB of Result = 0, and Result ≠ 0 |
| | | Reset Interrupt | Unconditionally sets status bit to 0 |
| | | All other Instructions and Interrupts | Do not affect the status bit |
| ST2 | EQUAL, EQ | C, CB | If (SA) = (DA) |
| | | CI | If (W) = IOP |
| | | COC | If (SA) and (DA) = 0 |
| | | CZC | If (SA) and (DA) = 0 |
| | | TB. | If CRUIN = 1 for addressed CRU bit |
| | | TSMB, TCMB, TMB | If Addressed mem bit = 1 |
| | | ABS, LDCR | If (SA) = 0 |
| | | RTWP | If bit (2) of WR15 is 1 |
| | | LST | If bit (2) of selected WR is 1 |
| | | A, AB, AM, ANDI, DEC, DECT, LI, MOV, MOVB, NEG, ORI, S, SB, DIVS, MPYS, INC, INCT, INV, SLA, SLAM, SM, SOC, SOCB, SRA, SRAM, SRC, SRL, STCR. | If result = 0 |

TABLE B-continued
STATUS REGISTER BIT DEFINITIONS

| BIT | NAME | INSTRUCTION | CONDITION TO SET BIT TO 1, OTHERWISE SET TO 0 |
|---|---|---|---|
| | | SZC, SZCB, XOR | |
| | | Reset | Unconditionally sets status bit to 0 |
| | | Interrupt | |
| | | All other Instructions and Interrupts | Do not affect the status bit |
| ST3 | CARRY, C | A, AB, ABS, AI, AM, DEC, DECT, INC, INCT NEG, S, SM, SB, | If CARRY OUT = 1 |
| | | SLA, SRA, SRL, SRC, SRAM, SLAM | If last bit shifted out = 1 |
| | | RTWP | If bit (3) of WR15 is 1 |
| | | LST | If bit (3) of selected WR is 1 |
| | | Reset | Unconditionally sets status bit to 0 |
| | | Interrupt | |
| | | All other Instructions and Interrupts | Do not affect the status bit |
| ST4 | OVERFLOW, OV | A, AB, AM | If MSB(SA) = MSB(DA) and MSB of result ≠ MSB(DA) |
| | | AI | If MSB(W) = MSB of IOP and MSB of result ≠ MSB(W) |
| | | S, SB, SM | If MSB(SA) ≠ MSB(DA) and MSB of result = MSB(DA) |
| | | DEC, DECT | If MSB(SA) = 1 and MSB of result = 0 |
| | | INC, INCT | If MSB(SA) = 0 and MSB of result = 1 |
| | | SLA, SLAM | If MSB changes during shift |
| | | DIV | If MSB(SA) = 0 and MSB(DA) = 1, or if MSB(SA) = MSB(DA) and MSB of ((DA) − (SA)) = 0 |
| | | DIVS | If the quotient cannot be expressed as a signed 16 bit quantity (8000(16) is a valid negative number). |
| | | ABS, NEG | If (SA) = 8000(16) |
| | | RTWP | If bit (4) of WR15 is 1 |
| | | LST | If bit (4) of selected WR is 1 |
| | | Reset | Unconditionally sets status bit to 0 |
| | | Interrupt | |
| | | All other Instructions And Interrupts | Do not offset the status bit |
| ST5 | PARITY, OP | CB, MOVB | If (SA) has odd number of 1's |
| | | LDCR | If C = 1 − 8 and (SA) has odd number of 1's If C = 0 or C = 9-15, does not affect the status bit. |
| | | AB, SB, SOCB, SZCB, | If result has odd number of 1's |
| | | STCR | If result has odd number of 1's If C = 1-8 and the stored bits have an odd number of 1's. If C = 0 or C = 9-15, does not affect the status bit. |
| | | RTWP | If bit (5) of WR15 is 1 |
| | | LST | If bit (5) of selected WR is 1 |
| | | Reset | Unconditionally sets status bit to 0. |
| | | Interrupt | |
| | | All other Instructions and Interrupts | Do not affect the status bit |
| ST6 | | XOP | If XOP instruction is executed (after the context switch) |
| | | RTWP | If bit (6) of WR15 is 1 |
| | | LST | If bit (6) of selected WR is 1 |
| | | Reset | Unconditionally sets status bit to 0 |
| | | Interrupt | |
| | | All other Instructions and Interrupts | Do not affect the status bit |
| ST7 | PRIVILEGED | RTWP | If corresponding bit of WR15 is 1 |
| ST9 | UNUSED | LST | If corresponding bit of selected WR is 1 |
| ST11 | UNUSED | XOP, any Interrupt | Unconditionally set to 0 |

TABLE B-continued

STATUS REGISTER BIT DEFINITIONS

| BIT | NAME | INSTRUCTION | CONDITION TO SET BIT TO 1, OTHERWISE SET TO 0 |
|---|---|---|---|
| | | All other Instructions | Do not affect these status bits |
| ST8 | MAP FILE SELECT | RTWP | If corresponding bit of WR15 is 1 |
| | | LST | If corresponding bit of selected WR is 1 |
| | | XOP, any Interrupt | Unconditionally set to 0 prior to fetching trap vectors. Previous value is saved. |
| | | LDCR, STCR, SBO, SBZ, TB | Overridden to 0 while the CRU address is on the address bus |
| | | LDD | Modified during destination fetch/write of the next instruction |
| | | LDS | Modified during source fetch/write of the next instruction |
| | | All other Instructions | Do not affect the status bit |
| ST10 | ARITHMETIC OVERFLOW ENABLE | RTWP | If bit (10) of WR15 is 1 |
| | | LST | If bit (10) of selected WR is 1 |
| | | XOP, any Interrupt | Unconditionally set to 0 |
| | | All other Instructions | Do not affect these status bits |
| ST12- ST15 | INTERRUPT MASK | LIMI | If corresponding bit of IOP is 1 |
| | | RTWP | If corresponding bit of WR15 is 1 |
| | | LST | If corresponding bit of selected WR is 1 |
| | | RST, Reset, NMI | Unconditionally set to 0 |
| | | All Other Interrupts | If ST12-ST15 = 0, no change. If ST12-ST15 ≠ 0, set to interrupt level minus 1 |
| | | All Other Instructions | Do not affect these status bits |

TABLE C

INTERRUPT LEVEL DATA

| INTERRUPT LEVEL | | VECTOR LOCATION (MEMORY ADDRESS IN HEX) | DEVICE ASSIGNMENT | MASK VALUES TO ENABLE (ST12 THRU ST15) | VALUE MASK SET TO UPON TAKING THE INTERRUPT (ST12-ST15) |
|---|---|---|---|---|---|
| (Highest priority) | 0 | 00 | Reset | 0 through F (see Note 1) | 0000 |
| | MID | 08 | Internal:MID | (see Note 3) | 0001 |
| | NMI | FFFC | External (NMI-) | 1 through F | 0000 |
| | 1 | 04 | External Device | 1 through F | 0000 |
| | 2 | 08 | Arithmetic Overflow | 2 through F (see Note 2) | 0001 |
| | 2 | 08 | External Device | 2 through F | 0001 |
| | 3 | 0C | External Device | 3 through F | 0010 |
| | 4 | 10 | External Device | 4 through F | 0011 |
| | 5 | 14 | External Device | 5 through F | 0100 |
| | 6 | 18 | External Device | 6 through F | 0101 |
| | 7 | 1C | External Device | 7 through F | 0110 |
| | 8 | 20 | External Device | 8 through F | 0111 |
| | 9 | 24 | External Device | 9 through F | 1000 |
| | 10 | 28 | External Device | A through F | 1001 |
| | 11 | 2C | External Device | B through F | 1010 |
| | 12 | 30 | External Device | C through F | 1011 |
| | 13 | 34 | External Device | D through F | 1100 |
| | 14 | 38 | External Device | E and F | 1101 |
| (Lowest | 15 | 3C | External | F only | 1110 |

TABLE C-continued

| | | INTERRUPT LEVEL DATA | | |
|---|---|---|---|---|
| INTERRUPT LEVEL | VECTOR LOCATION (MEMORY ADDRESS IN HEX) | DEVICE ASSIGNMENT | MASK VALUES TO ENABLE (ST12 THRU ST15) | VALUE MASK SET TO UPON TAKING THE INTERRUPT (ST12–ST15) |
| priority) | | Device | | |

NOTES:
(1) Level 0 cannot be disabled.
(2) Arithmetic overflow interrupt is generated internal to processor 1 and is enabled/disabled by bit-10 of the status register ST.
(3) MID interrupt is generated internal to device and it cannot be disabled by the interrupt mask.

TABLE D

THE INSTRUCTION SET

Data Transfer Instructions

The MOV instructions are used to transfer data from one part of the memory 2 to another part, or from one location in the memory map to any other. The LOAD instructions are used to initialize registers to desired values. The STORE instructions provide for saving the status register (ST) or the workspace pointer (WP) in a specified workspace register.

Load Immediate-LI
  Operation: The 16 bit data value located at the address given in the word immediately following the instruction LI is loaded into the workspace register R specified by the 4-bit field of bits 12–15.
  Affect on Status BITS: LGT, AGT and EQ
  Applications: The LI instruction is used to initialize a selected workspace register with a program constant such as a counter value or data mask.

Load Interrupt Mask Immediate-LIMI
  Operation: The low order 4 bit value (bits 12–15) in the word immediately following the instruction is loaded into the interrupt mask portion of the status register (bits 12–15).
  Affect on Status: Interrupt mask code only.
  Application: The LIMI instruction is used to initialize the interrupt mask to control which system interrupts will be recognized.

LOAD Workspace Pointer Immediate-LWPI
  Operation: The 16 bit value contained in the word immediately following the instruction is loaded into the workspace pointer WP.
  Affect of Status: None
  Application: LWPI is used to establish the workspace memory area for a section of the program.

MOVE Word-MOV
  Operation: The word in the source location specified by bits 10–15 is transferred to the destination location specified by bits 4–9, without affecting the data stored in the source location. During the transfer, the word (source data) is compared to 0 with the result of the comparison stored in the status register.
  Status Bits Affected: LGT, AGT and EQ
  Application: MOV is used to transfer data from one part of the system to another part.

MOVE Byte-MOVB
  Operation: Like MOV except operates on bytes. The Byte addressed by bits 10–15 is transferred to the byte location specified by bits 4–9. If workspace register addressing is used, the most significant byte is selected. Otherwise even addresses select the most significant byte; odd addresses select the least significant byte. During the transfer, the source byte is compared to zero and the results of the comparison and stored in the status register.
  Status Bits Affected: LGT, AGT, EQ and OP
  Application: MOVB is used to transfer 8 bit bytes from one byte location to another.

Swap Bytes-SWPB
  Operation: The most significant byte and the least significant bytes of the word at the memory location specified by bits 10–15 are exchanged.
  Affect on Status: None
  Application: Used to interchange bytes if needed for subsequent byte operations.

Store Status-STST
  Operation: The contents of the status register ST are stored in the workspace register specified by bits 12–15.
  Affect on Status: None
  Application: STST is used to save the contents of status register ST for later reference.

Store Workspace Pointer-STWP
  Operation: The contents of the workspace pointer WP are stored in the workspace register specified by bits 12–15.
  Affect on Status: None
  Application: STWP is used to save the contents of the workspace pointer register WP for later reference.

Arithmetic Instructions

These instructions perform the following basic arithmetic operations: addition (byte or word), subtraction (byte or word), multiplication, division, negation, and absolute value. More complicated mathematical functions must be developed using these basic operations. The basic instruction set will be adequate for many system requirements.

Add-A
  Operation: The data located at the source address specified by bits 10–15 is added to the data located at the destination address specified by bits 4–9. The resulting sum is placed in the destination location and is compared to zero.
  Status Bits Affected: LGT, AGT, EQ, C and OV
  Binary addition affects on status bits can be understood by studying the following examples:

| Source Operand | Destination Operand | Sum | LGT | AGT** | EQ | C | OV* |
|---|---|---|---|---|---|---|---|
| 1000 | 0001 | 1001 | 1 | 1 | 0 | 0 | 0 |
| F000 | 1000 | 0000 | 0 | 0 | 1 | 1 | 0 |
| F000 | 8000 | 7000 | 1 | 1 | 0 | 1 | 1 |
| 4000 | 4000 | 8000 | 1 | 0 | 0 | 0 | 1 |

Application: Binary addition is the basic arithmetic operation required to generate many mathematical functions. This instruction can be used to develop programs to do multiword addition, decimal addition, code conversion, and so on.

Add Bytes-AB
 Operation: Like A but for bytes instead of words. The source byte addressed by bits 12-15 is added to the destination byte addressed by bits 4-9 and the sum byte is placed in the destination byte location. Recall that even addresses select the most significant byte and odd addresses select the least significant byte. The sum byte is compared to 0.
 Status Bits Affected: LGT, AGT, EQ, C, OV and OP
 Application: AB is one of the byte operations available on the processor. These can be useful when dealing with subsystems or data that use 8 bit units, such as ASCII codes.

Add Immediate-AI
 Operation: The 16-bit value contained in the word immediately following the instruction is added to the contents of the workspace register specified by bits 12-15.
 Status Bits Affected: LGT, AGT, EQ, C and OV
 Application: This instruction is used to add a constant to a workspace register. Such an operation is useful for adding a constant displacement to an address contained in the workspace register.

Subtract Words-S
 Operation: The 16-bit source data (location specified by bits 10-15) is subtracted from the destination data (location specified by bits 4-9) with the result placed in the destination location. The result is compared to 0.
 Status Bits Affected: LGT, AGT, EQ, C and OV
 Application: Provides 16 bit binary subtraction.

Subtract Bytes-SB
 Operation: Like S except for bytes instead of words. The source byte addressed by bits 10-15 is subtracted from the destination byte addressed by bits 4-9 with the result placed in destination byte location. The result is compared to 0. Even addresses select the most significant byte and odd addresses select the least significant byte. If workspace register addressing is used, the most significant byte of the register is used.
 Status Bits Affected: LGT, AGT, C, EQ, OV and OP
 Application: SB provides byte subtraction when 8 bit operations are required by the system.

Increment-INC
 Operation: The data located at the source address indicated by bits 10-15 is incremented and the result is placed in the source location and compared to 0.
 Status Bits Affected: LGT, AGT, EQ, C and OV
 Application: INC is used to increment byte addresses and to increment byte counters. Autoincrementing addressing on byte instructions automatically includes this operation.

Increment by Two-INCT
 Operation: Two is added to the data at the location specified by the source address in bits 10-15 and the result is stored at the same source location and is compared to 0. Similar to INC.
 Status Bits Affected: LGT, AGT, EQ, C and OV
 Application: This can be used to increment word addresses, though autoincrementing on word instructions does this automatically.

Decrement-DEC
 Operation: One is subtracted from the data at the location specified by bits 10-15, the result is stored at that location and is compared to 0. Similar to INC.
 Status Bits Affected: LGT, AGT, EQ, C and OV
 Application: This instruction is most often used to decrement byte counters or to work through byte addresses in descending order.

Decrement by Two-DECT
 Operation: Two is subtracted from the data at the location specified by bits 10-15 and the result is stored at that location and is compared to 0. Similar to INC.
 Status Bits Affected: LGT, AGT, EQ, C and OV
 Application: This instruction is used to decrement word counters and to work through word addresses in descending order.

Negate-NEG
 Operation: The data at the address specified bits 10-15 is replaced by its two's complement. The result is compared to 0. For example, if the specified data location contained $A342_{16}$, this instruction would cause the contents at this location to be changed to $5CBE_{16}$ and will cause the LGT and AGT status bits to be set to 1.
 Status Bits Affected: LGT, AGT, EQ and OV (OV set only when operand = $8000_{16}$)
 Application: NEG is used to form the 2's complement of 16 bit numbers.

Absolute Value-ABS
 Operation: The data at the address specified by bits 10-15 is compared to 0. Then the absolute value of this data is placed in the same location.
 Status Bits Affected: LGT, AGT, EQ and OV (OV set only when operand = $8000_{16}$).
 Application: This instruction is used to test the data in the specified location and then replace the data by its absolute value. This could be used for unsigned arithmetic algorithms such as multiplication.

Multiply-MPY
 Operation: The 16 bit data at the source address designated by bits 10-15 is multiplied by the 16-bit data contained in the destination workspace register R specified by bits 6-9. The unsigned binary product (32-bits) is placed in workspace registers R and R+1.
 Affect on Status: None Application: MPY can be used to perform 16-bit by 16-bit binary multiplication. Several such 32-bit subproducts can be combined in such a way to perform multiplication involving larger multipliers and multiplicands such as a 32-bit by 32-bit multiplication.

Divide-DIV
Operation: The -32 bit number contained in workspace registers R and R+1 (where R is a destination address specified at bits 6–9) is divided by the 16-bit divisor contained at the source address specified by bits 10–15. The workspace register R then contains the quotient and workspace R+1 contains the 16-bit remainder. The division will occur only if the divisor at the source address is greater than the data contained in R.
Affect on Status: Overflow (OV) is set if the divisor is less then the data contained in R. If OV is set, R and R+1 are not changed.
Application: DIV provides basic binary division of a 32-bit number by a 16-bit number.

Signed Multiply-MPYS
Operation: The signed two's complement integer in workspace register 0 is multiplied by the signed two's complement integer specified by the source address (bits 10–15). The result is a signed 32-bit product which is placed in workspace register 0 (for the 16 MSB's) and workspace register 1 (the 16 LSB's). The result is compared to zero.
Status bits affected: LGT, AGT and EQ.
Application: Provides signed multiplication for the system.

Signed Divide-DIVS
Operation: The signed 32-bit two's complement integer (dividend) in workspace registers 0 and 1 is divided by the signed 16-bit two's complement integer (divisor) specified by the source address (bits 10–15). The signed quotient is placed in workspace register 0 and the signed remainder is placed in workspace register 1. The sign of the quotient is determined by algebraic rules. The sign of the remainder is the same as the sign of the dividend and Remainder Divisor. The result is compared to zero. If the quotient cannot be expressed as a signed 16-bit quantity, status bit-4, OV or overflow is set.
Status bits affect: LGT, AGT, EQ and OV.
Application: Provides signed division for the system.

Add Double-AM
Operation: Two instruction words define this operation. The 32-bit operand defined by the source address (bits 10–15) of the second word) and source address plus 2 is added to the 32-bit operand defined by the destination address (bits 4–9 of the second word) and destination address plus 2. The result is placed at the destination address and (DA+2).
Status bits affected: Same as Add.
Application: Same as Add but for 32-bit, double precision arithmetic.

Subtract Double-SM
Operation: Same as Add Double but the operation performed is subtraction.
Status bits: Same as subtract.

Application: Same as subtract but used for 32-bit double-precision arithmetic.

Comparison Instructions

These instructions are used to test words or bytes by comparing them with a reference constant or with another word or byte. Such operations are used in certain types of division algorithms, number conversion, and in recognition of input command or limit conditions.

Compare Words-C
Operation: The 2's complement 16 bit data specified by the source address at bits 10–15 is compared to the 2's complement 16 bit data specified by the destination at bits 4–9. The contents of both locations remain unchanged. This instruction has the following example results:

| Source Data | Destination Data | Results of Comparison | | |
|---|---|---|---|---|
| | | LGT | AGT | EQ |
| FFFF | 0000 | 1 | 0 | 0 |
| 7FFF | 0000 | 1 | 1 | 0 |
| 8000 | 0000 | 1 | 0 | 0 |
| 8000 | 7FFF | 1 | 0 | 0 |
| 7FFF | 7FFF | 0 | 0 | 1 |
| 7FFF | 8000 | 0 | 1 | 0 |

Status Bits Affected: LGT, AGT and EQ
Application: The need to compare two words occurs in such system functions as division, number conversion, and pattern recognition.

Compare Bytes-CB
Operation: The 2's complement 8 bit byte at the source address (bits 10–15) is compared to the 2's complement 8 bit byte at the destination address (bits 4–9). OP (odd parity) is based on the number of bits in the source byte.
Typical results (assuming destination address is for an odd byte):

| Source Data | Destination Data | Results of Comparison | | | |
|---|---|---|---|---|---|
| | | LGT | AGT | EQ | OP |
| FFFF | FF00 | 1 | 0 | 0 | 0 |
| 7F00 | FF00 | 1 | 1 | 0 | 1 |
| 8000 | FF00 | 1 | 0 | 0 | 1 |
| 8000 | FF7F | 1 | 0 | 0 | 1 |
| 7F00 | 007F | 0 | 0 | 1 | 1 |

The underlined entries indicate the byte addressed.

Status Bits Affected: LGT, AGT, EQ and OP
Application: In cases where 8 bit operations are required, CB provides a means of performing byte comparisons for special conversion and recognition problems.

Compare Immediate-CI
Operation: CI compares the contents of the specified workspace register R (bits 12–15) to the value contained in the word immediately following the instruction, and sets status bits accordingly.
Status Bits Affected: LGT, AGT and EQ Application: CI is used to test data to see if system or program limits have been met or exceeded or to recognize command words.

Compare Ones Corresponding-COC
Operation: The data in the source location addressed by bits 10-15 act as a mask for the bits to be tested in workspace register R specified by bits 6-9. That is, only the bit position that contain ones in the source data will be checked in R. Then, if R contains ones in all the bit positions selected by the source data, the equal (EQ) status bit will be set to 1. For example, if R contains $E306_{16}$ and source location contains $C102_{16}$,

| Source Mask = | 1100 | 0001 | 0000 | 0010 |
|---|---|---|---|---|
| R = | 1̄1̄10 | 001̄1̄ | 0000 | 01̄1̄0 | equal (EQ) would be set to 1 since everywhere the test mask data contains a 1 (underlined positions), R also contains a 1.
Status Bits Affected: EQ
Application: COC is used to selectively test groups of bits to check the status of certain sub-systems or to examine certain aspects of data words.

Compare Zeroes Corresponding-CZC
Operation: The data located in the source address specified by bits 10-15 act as a mask for the bits to be tested in the workspace register R specified by bits 6-9. That is, only the bit positions that contain ones in the source data are the bit positions to be checked in R. Then if R contains zeroes in all the selected bit positions, the equal (EQ) status bit will be set to 1. For example, if the source location contains the value $C102_{16}$ and the R location contains $2301_{16}$,

| Source Data = | 1100 | 0001 | 0000 | 0010 |
|---|---|---|---|---|
| R = | 0̄0̄10 | 001̄1̄ | 0000 | 000̄1̄ |
| | | | X | | the equal status bit would be reset to zero since not all the bits of R (note the X position) are zero in the positions that the source data contains ones.
Status Bits Affected: EQ
Application: Similar to the COC instruction.

Logic Instructions

The logic instructions allow the processor to perform boolean logic for the system. Since AND, OR, INVERT, and Exclusive OR (XOR) are available, any boolean function can be performed on system data.

AND Immediate-INDI
Operation: The bits of the workspace register specified by bits 12-15 are logically ANDed with the corresponding bits of the 16-bit binary constant value contained in the word immediately following the instruction. The 16-bit result is compared to zero and is placed in the register R. Recall that the AND operation results in 1 only if both inputs are 1.
Status Bits Affected: LGT, AGT and EQ
Application: ANDI is used to zero all bits that are not of interest and leave the selected bits (those with ones in Value) unchanged. This can be used to test single bits or isolate portions of the word, such as a four-bit group.

OR Immediate-ORI
Operation: The bits of the specified workspace register R are ORed with the corresponding bits of the 16-bit binary constant contained in the word immediately following instruction. The 16-bit result is placed in R and is compared to zero. Recall that the OR operation results in a 1 if either of the inputs is a 1.
Status Bits Affected: LGT, AGT and EQ
Application: Used to implement the OR logic in the system.

Exclusive OR-XOR
Operation: The exclusive OR is performed between corresponding bits of the source data addressed by bits 10-15 and the contents of workspace register specified by bits 6-9. The result is placed in workspace register R and is compared to 0. Note that the exclusive OR operation will result in a 1 if only one of the inputs is a 1.
Status Bits Affected: LGT, AGT and EQ
Application: XOR is used to implement the exclusive OR logic for the system.

Invert-INV
Operation: The bits of the data addressed by the source address bits 10-15 G are replaced by their complement. The result is compared to 0 and is stored at the source location. For example, if R contains $00FF_{16}$, the instruction would change the contents to $FF00_{16}$, causing the LGT status bit to set to 1.
Status Bits Affected: LGT, AGT and EQ
Application: INV is used to form the 1's complement of 16 bit binary numbers, or to invert system data.

Clear-CLR
Operation: Zeroes are placed in the memory location specified by bits 10-15.
Affected on Status: None
Application: CLR is used to set problem arguments to 0 and to initialize memory locations to zero during system start-up operations.

Set To One-SETO
Operation: All ones (or hex FFFF) are placed in the memory location specified by bits 10-15.
Affect on Status: None
Application: Similar to CLR.

Set Ones Corresponding-SOC
Operation: This instruction performs the OR operation between corresponding bits of the source data address by bits 10-15 and the destination data addressed by bits 4-9. The result is compared to 0 and is placed in the destination location.
Status Bits Affected: LGT, AFT and EQ
Application: Provides the OR function between any two words in memory.

Set Ones Corresponding Byte-SOCB
Operation: Like SOC except used for bytes instead of words. The logical OR is performed between corresponding bits of the byte addressed by source address bits 10-15 and the byte addressed by the destination address of bits 4-9 with the result compared to 0 and placed in destination location.
Status Bits Affected: LGT, AGT, EQ and OP
Application: The SOCB provides the logical OR function on system bytes.

Set to Zeroes Corresponding-SZC
Operation: The source data addressed by bits 10-15 forms a mask for this operation. The bits in the destination data (addressed by bits 4-9) that correspond to the one bits of the source data (addressed by 10-15) are cleared. The result is compared to zero and is stored in the destination location.
Status Bits Affected: LGT, AGT and EQ
Application: SZC allows the programmer to selectively clear bits of data words. For example, when an interrupt has been serviced, the interrupt request bit can be cleared by using the SZC instruction.

Set to Zeroes Corresponding, Bytes-SZCB
Operation: Like SZC except for bytes instead of words. The byte addressed by the source address bits 10-15 will provide a mask for clearing certain bits of the byte addressed by the destination address bits 4-9. The bits in the destination byte that will be cleared are the bits that are one in the source byte. The result is compared to zero and is placed in the destination byte.
Status Bits Affected: LGT, AGT, EQ and OP
Application: Provides selective clearing of bits of system bytes.

Shift Instructions

These instructions are used to perform simple binary multiplication and division on words in memory and to rearrange the location of bits in the word in order to examine a given bit with the carry (C) status bit.

Shift Right Arithmetic-SRA
Operation: The contents of the workspace register R specified by bits 12-15 are shifted right by a number of times specified by bits 8-11, referred to as Cnt, filling the vacated bit position with the sign (most significant bit) bit: The shifted number is compared to zero.
Status Bits Affected: LGT, AGT, EQ and C
Number of Shifts: Cnt (number from 0 to 15 contained in the instruction) specifies the number of bits shifted unless Cnt is zero in which case the shift count is taken from the four least significant bits of workspace register 0. If both Cnt and these four bits are 0, a 16-bit position shift is performed.
Application: SRA provides binary division by a power of two defined by Cnt.

Shift Left Arithmetic-SLA
Operation: The contents of workspace register R specified by bits 12-15 are shifted left Cnt times (or if Cnt=0, the number of times specified by the least four bits of R0) filling the vacated positions with zeroes. Cnt is specified by bits 8-11. The carry contains the value of the last bit shifted out to the left and the shifted number is compared to zero.
Status Bits Affected: LGT, AGT, EQ, C and OV
Application: SLA performs binary multiplication by a power of 2 defined by Cnt.

Shift Right Logical-SRL
Operation: The contents of the workspace register R specified by bits 12-15 are shifted right Cnt times, where Cnt is specified by bits 8-11, (or if Cnt=0, the number of times specified by the least four bits or R0) filling in the vacated positions with zeroes. The carry contains the value of the last bit shifted out to the right and the shifted number if compared to zero.
Status Bits Affected: LGT, AGT, EQ and C
Application: Performs binary division by a power of 2 defined by Cnt.

Shift Right Circular-SRC
Operation: Workspace register R defined by bits 12-15 is right shifted Cnt time defined by bits 8-11. On each shift the bit shifted and the shifted number is compared to 0. The number of shifts to be performed is the number Cnt, or if Cnt=0, the number contained in the least significant four bits of R0.
Status Bits Affected: LGT, AGT, EQ and C
Application: SRC can be used to examine a certain bit in the data word, change the location of 4-bit groups, or swap bytes.

Shift Left Arithmetic Double-SLAM
Operation: Same as shift left arithmetic but the 32-bit operand defined by the source address (bits 10-15 of second word) plus SA+2 is shifted. Vacated bit positions are filled with zeroes. If the count Cnt=0, the count is in bit 4-7 of workspace register 0.
Application: Same as SLA except used for double precision arithmetic. Multiplies by a selected power of 2.

Shift Right Arithmetic Double-SRAM
Operation: Same as SRA except the 32-bit operand defined by SA plus SA+2 is shifted. Vacated bit positions filled with MSB.
Application: Same as SRA, but provides double precision arithmetic. Divides by a selected power of 2.

Unconditional Branch Instructions

These instructions give the programmer the capability of choosing to perform the next instruction in sequence or to go to some other part of the memory to get the next instruction to be executed. The branch can be a subroutine type of branch, in which case the programmer can return to the point from which the branch occurred.

Branch-B
Operation: The source address, bits 10-15, is placed in the program counter, causing the next instruction to be obtained from the location specified by this source address.
Affect on Status: None
Application: This instruction is used to jump to another part of the program when the current task has been completed.

Branch and Link-BL
Operation: The source address at bits 10-15 is placed in the program counter and the address of the instruction following the BL instruction is saved in workspace register 11.
Affect on Status: None Application: This is a shared workspace subroutine jump. Both the main program and the subroutine use the same workspace registers. To get back to the main program at the branch point, a BL instruction can be used at the end of the subroutine which causes the R11 contents (old PC value) to be loaded into the program counter.

Unconditional Jump-JMP
Operation: The signed displacement defined by bits 8-15 is added to the current contents of the program counter PC to generate the new value of the program counter. The location jumped to must be within −128 to +127 words of the present location.
Affect on Status: None
Application: If the subprogram to be jumped to is within 128 words of the JMP instruction location, the unconditional JMP is preferred over the unconditional branch since only one memory word (and one memory reference) is required for the JMP while two memory words and two memory cycles are required for the B instruction. Thus, the JMP instruction can be implemented faster and with less memory cost than can the B instruction.

Execute-X
Operation: The instruction located at the source address specified by bits 10-15 is executed.
Status Bits Affected: Depends on the instruction executed.
Application: X is useful when the instruction to be executed is dependent on a variable factor.

Branch Indirect-BIND
Operation: The contents of the location addressed by the address in the register R of the workspace specified in bits 10-15 is placed in the program counter PC on the CPU chip, causing the next instruction to be obtained from the location addressed by such contents.
Affect on Status: None
Application: Similar to Branch.

Branch & Push Link-BLSK
Operation: This is Branch Immediate and Push Line to Stack, and requires two instruction words to execute. The register R defined by bits 12-15 is decremented by 2 and returned to the register R. The content of the program counter have 4 added to it and the result stored in the workspace register R. Then the 16-bit word immediately following the BLSK instruction is loaded into the program counter PC.
Status bits affected: None
Application: Similar to BL except the link is saved in a stack defined in memory by R.

Branch and Load Workspaace Pointer-BLWP
Operation: The word specified by the source address bits 10-15 is loaded into the workspace pointer (WP) and the next word in memory (source address+2) is loaded into the program counter (PC) to cause the branch. The old workspace pointer is stored in the new workspace register-13, the old PC value is stored in the new workspace register-14, and the status register is stored in new workspace register-15.
Affect on Status: None
Application: This is a context switch subrountine jump with the transfer vector location specified by the source address. It uses a new workspace to save the old values of WP, PC, and ST (in the last three registers). The advantage of this subrountine jump over the BL jump is that the subroutine gets its own workspace and the main program workspace contents are not disturbed by subroutine operations.

Extended Operation-XOP
Operation: Bits 6-9 specify which extended operation transfer vector is to be used in the context switch branch from XOP to the corresponding subprogram. The effective source address, bits 10-15, is placed in R11 of the subprogram workspace in order to pass an argument or data location to the subprogram.
Affect on Status: Extended Operation (X) bit is set.
Application: This can be used to define a subprogram that can be called by a single instruction. As a result, the programmer can define special purpose instructions to augment the standard instruction set for the processor.

Return with Workspace Pointer-RTWP
Operation: This is a return from a context switch subroutine. It occurs by restoring the WP, PC, and ST register contents by transferring the contents of subroutine workspace registers R13, R14 and R15, into the WP, PC and ST registers, respectively.
Status Bits Affected: All (ST receives the contents of R15).
Application: This is used to return from subprogram that were reached by a transfer vector operation such as an interrupt, extended operation, or BLWP instruction.

Conditional Jump Instructions—JH, JL, JHE, JLE, JGT, JLT, JEQ, JNE, JOC, JNC, JNO, JOP These instructions perform a branching operation to a location defined by bits 8-15 only if certain status bits meet the conditions required by the jump. These instructions allow decision making to be incorporated into the program. The conditional jump instruction mnemonics are summarized below along with the status bit conditions that are tested by these instruction.
Operation: If the condition indicated by the branch mneomonic (specified by bits 4-7) is true, the jump 11 will occur using relative addressing as was used in the unconditional JMP instruction. That is, the bits 8-15 define a displacement that is added to the current value of the program counter to determine the location of the next instruction, which must be within 128 words of the jump instruction.
Effect on Status Bits: None

| Mnemonic | L> | A> | EQ | C | OV | OP | Jump if: | CODE* |
|---|---|---|---|---|---|---|---|---|
| JH | X | — | X | — | — | — | L> · $\overline{EQ}$ = 1 | B |
| JL | X | — | X | — | — | — | L> + EQ = 0 | A |
| JHE | X | — | X | — | — | — | L> + EQ = 1 | 4 |
| JLE | X | — | X | — | — | — | $\overline{L>}$ + EQ = 1 | 2 |
| JGT | — | X | — | — | — | — | A> = 1 | 5 |
| JLT | — | X | X | — | — | — | A> + EQ = 0 | 1 |
| JEQ | — | — | X | — | — | — | EQ = 1 | 3 |
| JNE | — | — | X | — | — | — | EQ = 0 | 6 |
| JOC | — | — | — | X | — | — | C = 1 | 8 |
| JNC | — | — | — | X | — | — | C = 0 | 7 |
| JNO | — | — | — | — | X | — | OV = 0 | 9 |
| JOP | — | — | — | — | — | X | OP = 1 | C |

Status Bits Tested by Instructions

Note:
In the Jump if column, a logical equation is shown in which means the AND operation, + means the OR operation, and a line over a term means negation or inversion.
*CODE is entered in the CODE field (bits 4-7) of the OPCODE to generate the machine code for the instruction.

Application: Most algorithms and programs with loop counters require these instructions to decide which sequence of instructions to do next.

CRU Instructions

The communications register unit (CRU) performs single and multiple bit programmed input/output for the microprocessor. All input consists of reading CRU line logic levels into memory, and all output consists of setting CRU output lines to bit values from a word or byte of memory. The CRU provides a maximum of 4096 input and 4096 output lines that may be individually selected by a 12-bit address which is located in bits 3–14 of workspace register R12. This address is the hardware base address for all CRU communications.

Set Bit to Logic One-SBO
  Operation: The CRU bit at the signed displacement defined by bits 8–15 plus the hardware base address is set to one. The hardware base address is bits 3–14 of workspace register R12.
  Affect on Status: None
  Application: Output a one on a single bit CRU line.

Set Bit to Logic Zero-SBZ
  Operation: The CRU bit at the signed displacement (bits 8–15) plus the base address is reset to zero. The hardware base address is bits 3–14 of workspace register R12.
  Status Bit Affected: EQ
  Application: Input the CRU bit selected.

Test Bit-TB
  Operation: The CRU bit at the signed displacement (bits 8–15) plus the base address is read by setting the value of the equal (EQ) status bit to the value of the bit on the CRU line. The hardware base address is bits 3–14 of workspace register R12.
  Status Bits Affected: EQ
  Application: Input the CRU bit selected Load CRU-LDCR
  Operation: Cnt at bits 6–9 specifies the number of bits to be transferred from the data located at the source address specified by bits 10–15, with the first bit transferred from the least significant bit of this data, the next bit from the next least significant bit and so on. If Cnt=0, the number of bits transferred is 16. If the number of bits to be transferred is one to eight, the source address is a byte address. If the number of bits to be transferred is 9 to 16, the source address is a word address. The source data is compared to zero before the transfer. The destination of the first bit is the CRU line specified by the hardware base address, the second bit is transferred to the CRU line specified by the hardware base address +1, and so on. Status Bits Affected: LGT, AGT, EQ and OP (odd parity) with transfer of 8 or less bits.
  Application: The LDCR provides a number of bits (from 1 to 16) to be transferred from a memory word or byte to successive CRU lines, starting at the hardware base address line; the transfer begins with the least significant bit of the source field and continues to successively more significant bits.

Store CRU-STCR
  Operation: Cnt (bits 6–9) specifies the number of bits to be transferred from successive CRU lines (starting at the hardware base address) to the location specified by the source address (bits 10–15), beginning with the least significant bit position and transferring successive bits to successively more significant bits. If the number of bits transferred is 8 or less, the source address is a byte address. Otherwise, it is a word address. If Cnt=0, 16 bits are transferred. The bits transferred are compared to zero. If the transfer does not fill the entire memory word, the unfilled bits are reset to zero.
  Status Bits Affected: LGT, AGT, EQ and OP for the transfers of 8 bits or less.

TABLE E
BUS STATUS CODES

| MEM- | BST 1 2 3 | NAME | DESCRIPTION OF BUS ACTIVITY |
|---|---|---|---|
| 0 | 0 0 0 | SOPL | Source Operand Transfer: MPILCK active |
| 0 | 0 0 1 | SOP | Source Operand Transfer: MPILCK inactive |
| 0 | 0 1 0 | IOP | Immediate data or second word of two word instruction, or symbolic address |

TABLE E-continued
BUS STATUS CODES

| MEM- | BST 1 2 3 | NAME | DESCRIPTION OF BUS ACTIVITY |
|---|---|---|---|
| 0 | 0 1 1 | *IAQ | Instruction Acquisition |
| 0 | 1 0 0 | DOP | Destination Operand Transfer |
| 0 | 1 0 1 | IACK | Interrupt Acknowledge Active during the WP and PC fetch for an interrupt or XOP |
| 0 | 1 1 0 | WS | Workspace Transfer |
| 0 | 1 1 1 | GM | General Memory Transfer |
| 1 | 0 0 0 | NOPL | Internal: MPILCK active |
| 1 | 0 0 1 | NOP | Internal: MPILCK inactive |
| 1 | 0 1 0 | RESET | Reset: The RESET- signal is true |
| 1 | 0 1 1 | CRU | CRU transfer |
| 1 | 1 0 0 | WP | Workspace pointer, update: BLWP, RTWP, LWPI, LWP, Interrupt, XOP, (workspace pointer on data bus) |
| 1 | 1 0 1 | SWP | Status and workspace pointer update: LST, RTWP, XIPP return. (Status on address bus, workspace pointer on data bus) |
| 1 | 1 1 0 | MID | Macro Instruction Detected: XIPP- is sampled when READY is true |
| 1 | 1 1 1 | HOLDA | Hold acknowledge |

*The state following an IAQ is the last state of the instruction, unless a HOLD request is acknowledged.

TABLE F
Entry Vectors

| ROM 25A table location | MID opcodes |
|---|---|
| 0800* | 0000-001B, 001E-0028, 002B-007F 00A0-00AF, 00C0-00FF |
| 0802* | 0100-013F |
| 0804* | 0210-021F, 0230-023F, 0250-025F, 0270-027F, 0290-029F, 02B0-02BF, 02D0-02DF, 02E1-02FF |
| 0806* | 0301-031F, 0341-035F, 0361-037F, 0381-039F, 03A1-03BF, 03C1-03DF, 03E1-03FF |
| 0808* | 0C00-0C08 0C0C-0CFF |
| 080A* | 0D00-0DFF |
| 080C* | 0E00-0EFF |
| 080E* | 0F00-0FFF |
| 0810 | AM, SM, SRAM, SLAM, TMB, TCMB, TSMB (if the second word is illegal) |
| 0812 | XOP (if status bit-11 is on) |

*Bits 5, 6 and 7 of the MID opcode select one of eight entry-table locations.

TABLE G
RAM 25B Register Usage

| REGISTER | EXTERNAL ACCESS | BUS STATUS CODE | MODIFIED BY EVAD | MODIFIED BY MACRO ENTRY | USAGE | |
|---|---|---|---|---|---|---|
| 0 | NO | NOP | | | Shift counts | |
| 1 | NO | NOP | | | | |
| 2 | YES | IAQ | | | | |
| 3 | NO | NOP | | YES | Second word of two-word opcode | |
| 4 | NO | NOP | | | | |
| 5 | NO | NOP | | YES | One word opcode or first word of two-word opcode | |
| 6 | YES | IACK DOP | | | TD not 0 | EVAD Destination |
| 7 | YES | WS | YES | | TD = 0 | Address |
| | | SOP | | | TS not 0 | EVAD Source |
| 8 | YES | WS | YES | | TS = 0 | Address |
| 9 | YES | WS | YES | | EVAD address of external dest. register if *R+ | |
| A | YES | WS | YES | | EVAD address of external source register if *R+ | |
| B | NO | NOP | | | BL AND XOP | |
| C | NO | NOP | | | CRU | |
| D | YES | WS | | YES | OLD WP | |
| E | YES | IOP | | YES | OLD PC | |
| F | NO | NOP | | YES | OLD STATUS | |

TABLE H
ALU FUNCTIONS

| CONTROL LINES TO ALU | | | | ALU FUNCTION | |
|---|---|---|---|---|---|
| ALU 1 | ALU 2 | ALU 3 | ALU 4 | H3 Logic = 1 | H3 Logic = 0 |
| 0 | 0 | 0 | 0 | 1 | |
| 0 | 0 | 0 | 1 | A + B | |
| 0 | 0 | 1 | 0 | A + $\overline{B}$ | |
| 0 | 0 | 1 | 1 | A | |
| 0 | 1 | 0 | 0 | $\overline{A}$ + B | |
| 0 | 1 | 0 | 1 | B | |
| 0 | 1 | 1 | 0 | $\overline{A \oplus B}$ | ADD |
| 0 | 1 | 1 | 1 | A · B | |
| 1 | 0 | 0 | 0 | $\overline{A}$ + $\overline{B}$ | |
| 1 | 0 | 0 | 1 | A $\oplus$ B | A sub B |
| 1 | 0 | 1 | 0 | $\overline{B}$ | |
| 1 | 0 | 1 | 1 | A · $\overline{B}$ | |
| 1 | 1 | 0 | 0 | $\overline{A}$ | |
| 1 | 1 | 0 | 1 | $\overline{A}$ · B | |

TABLE H-continued

| ALU FUNCTIONS | | | | | |
|---|---|---|---|---|---|
| CONTROL LINES TO ALU | | | | | |
| ALU | | | | ALU FUNCTION | |
| 1 | ALU 2 | ALU 3 | ALU 4 | H3 Logic = 1 | H3 Logic = 0 |
| 1 | 1 | 1 | 0 | $\overline{A+B}$ | |
| 1 | 1 | 1 | 1 | 0 | |

What is claimed is:

1. A decoder comprising a plurality of cell groups; each cell group including:
    an array of potential cells with M rows and N columns,
    first selector means for activating one of said M rows as defined by an address of B bits,
    second selector means for selecting one of said N columns as defined by an address of C bits,
    where M equals $2^B$, and
    wherein logically unneeded columns of potential cells are physically omitted from the array, whereby N is an integer substantially less than $2^C$;
    and the cell groups contain differing numbers N of columns.

2. A decoder according to claim 1 wherein the potential cells are field effect transistors.

3. A decoder according to claim 2 wherein the second selector means for each cell group is an array of $2^C$ rows and N columns.

4. A decoder according to claim 3 wherein each said array is populated with potential cells using false logic.

5. A logic array for generating a plurality of control signals for microprocessor device comprising:
    a plurality of row lines and means for selecting one of said row lines for activation in response to an address,
    a plurality of separate groups of column lines intercepting said row lines to provide an array, the column lines of each group generating a separate one of said control signals, and means for selecting no more than one column line in each group for activation in response to an address, the number of column lines per group differing among the groups, the total number of column lines in the groups being substantially greater than the number of said row lines.

6. A logic array according to claim 5 wherein a potential cell is provided at the intersection of each row line and each column line.

7. A logic array according to claim 6 wherein the potential cells are insulated gate field effect transistors.

8. A logic array according to claim 6 wherein there is at least one cell on each column line in each group.

9. A logic array according to claim 8 wherein the means for selecting column lines activates a column line in some but not all of said groups for a given address.

10. A logic array according to claim 9 wherein the maximum number of column lines in a group does not exceed N and said given address contains C bits, where $N = 2^C$.

11. A method of making a logic array of rows and columns of potential cells for generating a plurality of control signals for a microprocessor device, comprising the steps of:
    defining a plurality of groups of equal numbers of said columns, one group for each control signal, the columns in each group intercepting said rows at said potential cells,
    providing row select means for activating one row in response to a first part of an address,
    providing column select means for activating no more than one column in each group in response to a second part of an address,
    physically eliminating from the array columns which contain no cells for a given sequence of control signals to be generated for the microprocessor device whereby each column in every group contains at least one of said cells.

12. A method according to claim 11 including the step of eliminating parts of said column select means for the columns containing no cells.

13. A method according to claim 12 wherein some of the groups contain unequal numbers of columns after eliminating the columns which contain no cells.

14. A method according to claim 13 including the step of forming an insulated gate field effect transistor at the location of each one of the potential cells for which a control signal is to be generated for a given first and second address.

15. A method according to claim 14 wherein said addresses are selected to maximize the number of columns containing no cells.

16. A method of making a logic array of rows and columns of potential cells for generating a plurality of control signals for a microprocessor device comprising the steps of:
    defining a plurality of equal groups of said columns, one group for each control signal, the columns intercepting said rows at said potential cells,
    providing row select means for activating one row in response to a first address,
    providing column select means for activating no more than one column in each group in response to a second address,
    eliminating columns which contain no cells for a given sequence of control signals to be generated for the microprocessor device,
    including the step of populating the array with cells using false logic to thereby increase the number of columns containing no cells.

17. A method of making a logic array of rows and columns of potential cells for generating a plurality of control signals for a microprocessor device comprising the steps of:
    defining a plurality of equal groups of said columns, one group for each control signal, the columns intercepting said rows at said potential cells,
    providing row select means for activating one row in response to a first address,
    providing column select means for activating no more than one column in each group in response to a second address,
    eliminating columns which contain no cells for a given sequence of control signals to be generated for the microprocessor device,
    including the step of inverting said control signals to thereby increase the number of columns containing no cells.

18. A microprocessor system comprising:
    a memory containing a large number of locations defined by addresses and containing program instructions and data, input/output means for receiving and transmitting information, a central processing unit coupled to said memory and said input/output means by conductor means to transfer addresses, program instructions, data and information between the memory, input/output means and central processing unit, logic array means in said central processing unit for receiving representations of said program instructions for decoding and generating control signals to define operation of the system, the logic array means including a plurality of rows and columns of potential cells, the columns arranged in a plurality of groups of columns, each group corresponding to one of the control signals, selector means to select rows and columns in response to one of said program instructions, the number of columns in a group differing among the groups and all columns having at least one cell whereby no columns are unused, the total number of columns greatly exceeding the number of rows.

19. A system according to claim 18 wherein the cells are insulated gate field effect transistors.

20. A system according to claim 19 wherein the central processing unit is formed in a single semiconductor integrated circuit.

* * * * *